(12) United States Patent
Yoneda et al.

(10) Patent No.: US 12,225,314 B2
(45) Date of Patent: Feb. 11, 2025

(54) IMAGING DEVICE AND ELECTRONIC DEVICE

(71) Applicant: SEMICONDUCTOR ENERGY LABORATORY CO., LTD., Atsugi (JP)

(72) Inventors: Seiichi Yoneda, Kanagawa (JP); Yusuke Negoro, Osaka (JP); Takeya Hirose, Kanagawa (JP); Shunsuke Sato, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 116 days.

(21) Appl. No.: 17/995,803

(22) PCT Filed: Apr. 9, 2021

(86) PCT No.: PCT/IB2021/052939
§ 371 (c)(1),
(2) Date: Oct. 7, 2022

(87) PCT Pub. No.: WO2021/209868
PCT Pub. Date: Oct. 21, 2021

(65) Prior Publication Data
US 2023/0156376 A1 May 18, 2023

(30) Foreign Application Priority Data
Apr. 17, 2020 (JP) ................... 2020-073767

(51) Int. Cl.
H04N 25/78 (2023.01)
H04N 25/771 (2023.01)
(Continued)

(52) U.S. Cl.
CPC ........... *H04N 25/78* (2023.01); *H04N 25/771* (2023.01); *H04N 25/79* (2023.01); *H10K 39/32* (2023.02)

(58) Field of Classification Search
CPC ...... H04N 25/78; H04N 25/771; H04N 25/79; H04N 25/766; H10K 39/32;
(Continued)

(56) References Cited

U.S. PATENT DOCUMENTS 5,303,027 A    4/1994  Kuderer et al.
6,552,746 B1   4/2003  Yang et al.
(Continued)

FOREIGN PATENT DOCUMENTS

CN    102598269 A    7/2012
CN    110741630 A    1/2020
(Continued)

OTHER PUBLICATIONS

International Search Report (Application No. PCT/IB2021/052939) Dated Jul. 27, 2021.
(Continued)

*Primary Examiner* — Nhan T Tran
(74) *Attorney, Agent, or Firm* — Fish & Richardson P.C.

(57) ABSTRACT

An imaging device that has an image processing function and is capable of a high-speed operation is provided. The imaging device has an additional function such as image processing, and can retain analog data obtained by an image capturing operation in pixels and extract data obtained by multiplying the analog data by a given weight coefficient. In the imaging device, the data is stored in a memory cell and pooling processing of data stored in a plurality of memory cells can be performed. The pixels are provided so as to have a region overlapping with at least one of the memory cells, a pooling processing circuit, and a reading circuit of the
(Continued)

pixels; thus, an increase in the area of the imaging device can be inhibited even with an additional function.

15 Claims, 33 Drawing Sheets

(51) Int. Cl.
*H04N 25/79* (2023.01)
*H10K 39/32* (2023.01)

(58) Field of Classification Search
CPC .............. H01L 21/8258; H01L 27/0629; H01L 27/1225; H01L 27/0688; H01L 27/088; H01L 27/14634; H01L 29/7869; H01L 27/14609

See application file for complete search history.

(56) References Cited

U.S. PATENT DOCUMENTS

| | | |
|---|---|---|
| 7,791,662 B2 | 9/2010 | Yoshimura |
| 8,378,391 B2 | 2/2013 | Koyama et al. |
| 8,390,715 B2 | 3/2013 | Matsunaga et al. |
| 8,786,728 B2 | 7/2014 | Ichikawa |
| 8,916,869 B2 | 12/2014 | Koyama et al. |
| 8,970,728 B2 | 3/2015 | Horikawa et al. |
| 9,252,181 B2 | 2/2016 | Lee et al. |
| 9,331,112 B2 | 5/2016 | Koyama et al. |
| 9,356,585 B2 | 5/2016 | Sakurai et al. |
| 9,773,814 B2 | 9/2017 | Koyama et al. |
| 9,773,832 B2 | 9/2017 | Kurokawa |
| 10,074,687 B2 | 9/2018 | Kurokawa |
| 10,218,922 B2 | 2/2019 | Kondo et al. |
| 10,600,839 B2 | 3/2020 | Kurokawa |
| 10,904,471 B2 | 1/2021 | Matsumoto et al. |
| 10,964,743 B2 | 3/2021 | Kurokawa |
| 11,101,302 B2 | 8/2021 | Ikeda et al. |
| 11,388,360 B2 | 7/2022 | Yamamoto |
| 11,475,269 B2 | 10/2022 | Nestler et al. |
| 12,068,339 B2 | 8/2024 | Kurokawa et al. |
| 2005/0185835 A1 | 8/2005 | Matsugu et al. |
| 2007/0152137 A1 | 7/2007 | Barna et al. |
| 2009/0014652 A1 | 1/2009 | Chammings et al. |
| 2009/0207462 A1 | 8/2009 | Arimoto et al. |
| 2011/0108836 A1 | 5/2011 | Koyama et al. |
| 2011/0194001 A1 | 8/2011 | Eki et al. |
| 2013/0112753 A1* | 5/2013 | Wang ..................... H04N 25/42 235/472.01 |
| 2013/0126703 A1 | 5/2013 | Caulfield |
| 2013/0153749 A1 | 6/2013 | Sakurai |
| 2016/0092735 A1 | 3/2016 | Govil et al. |
| 2016/0172410 A1 | 6/2016 | Kurokawa |
| 2017/0142325 A1 | 5/2017 | Shimokawa et al. |
| 2017/0208263 A1 | 7/2017 | Mcgarry |
| 2017/0345170 A1 | 11/2017 | Carmel et al. |
| 2018/0288350 A1* | 10/2018 | Dupont ................... H04N 25/46 |
| 2019/0067360 A1* | 2/2019 | Kurokawa ........ H01L 27/14612 |
| 2019/0180499 A1 | 6/2019 | Caulfield et al. |
| 2020/0169683 A1* | 5/2020 | Yamamoto ............. G06N 3/065 |
| 2021/0233952 A1 | 7/2021 | Kurokawa |
| 2022/0385840 A1 | 12/2022 | Yamamoto |

FOREIGN PATENT DOCUMENTS

| | | |
|---|---|---|
| EP | 3051588 A | 8/2016 |
| JP | 2011-119711 A | 6/2011 |
| JP | 2016-123087 A | 7/2016 |
| KR | 2012-0091294 A | 8/2012 |
| KR | 2020-0019181 A | 2/2020 |
| WO | WO-2011/055626 | 5/2011 |
| WO | WO-2017/106464 | 6/2017 |
| WO | WO-2018/203169 | 11/2018 |
| WO | WO-2018/229594 | 12/2018 |
| WO | WO-2018229594 A1 * | 12/2018 ............. G06N 3/065 |

OTHER PUBLICATIONS

Written Opinion (Application No. PCT/IB2021/052939) Dated Jul. 27, 2021.

* cited by examiner

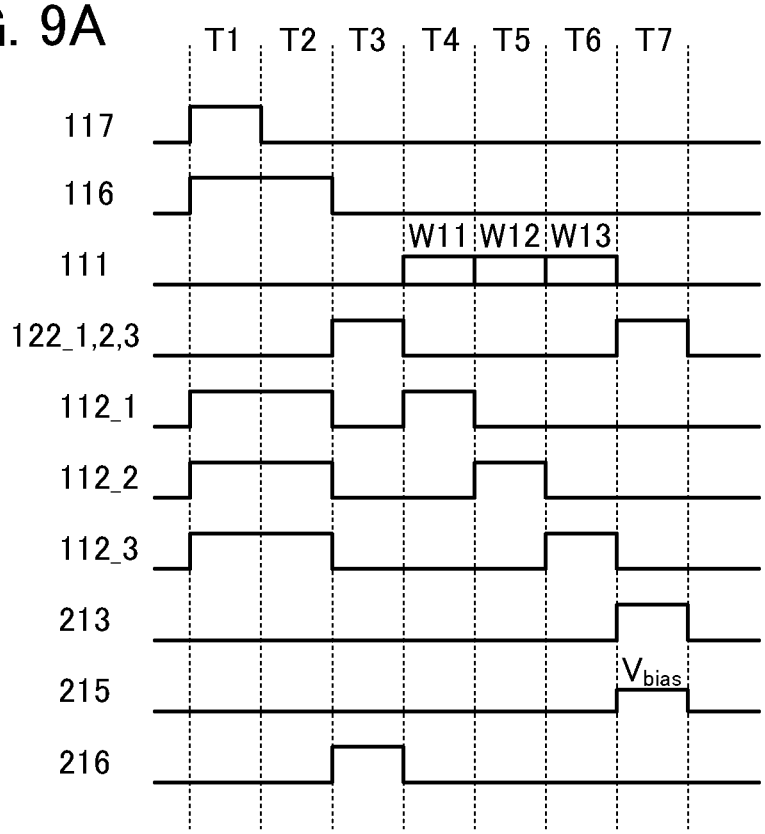
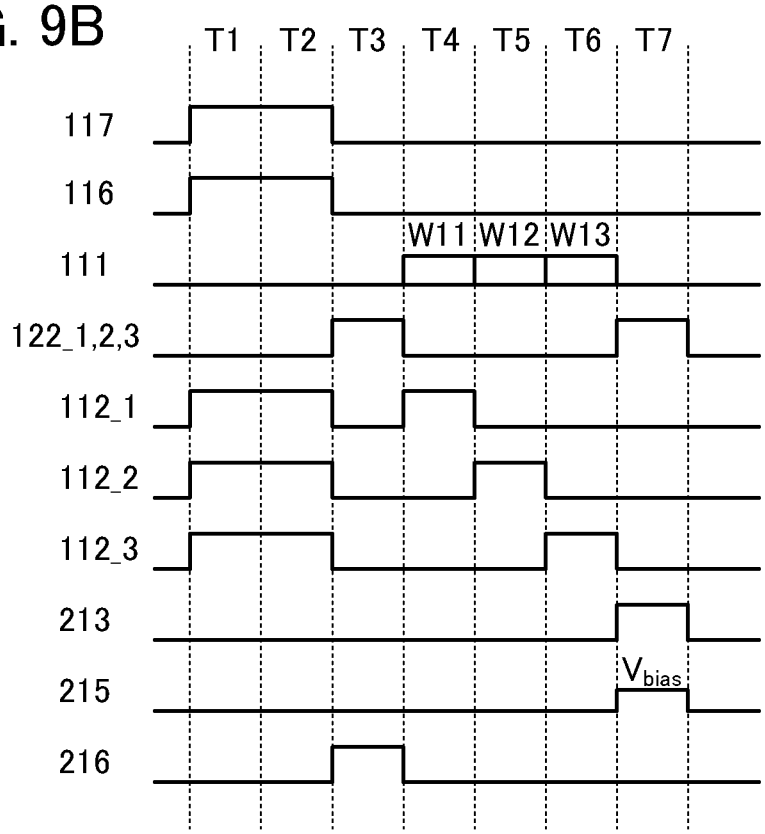

$a = x_1 w_1 + x_2 w_2 + b$

FIG. 31A1
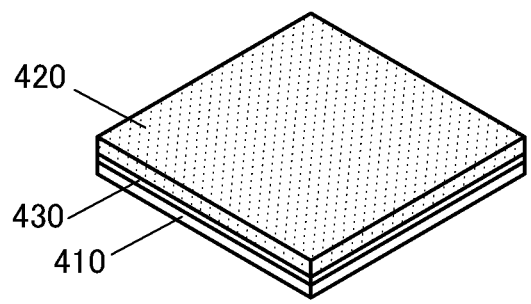
FIG. 31B1
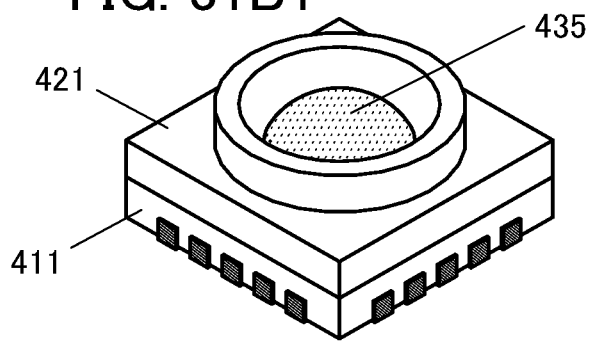
FIG. 31A2
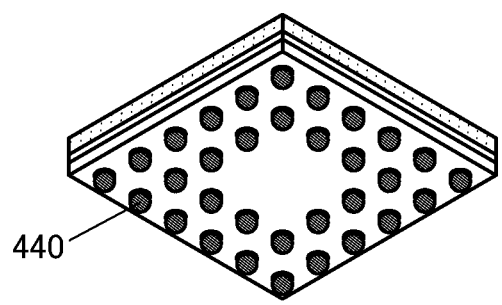
FIG. 31B2
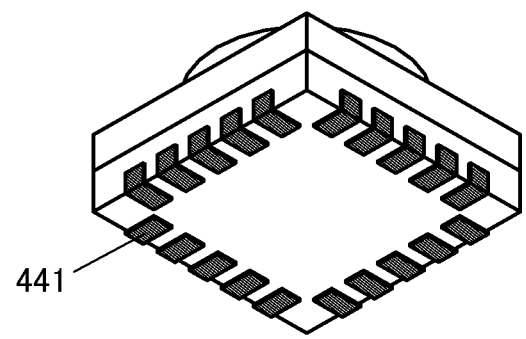
FIG. 31A3
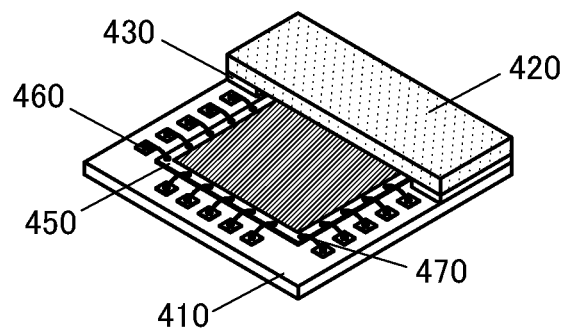
FIG. 31B3
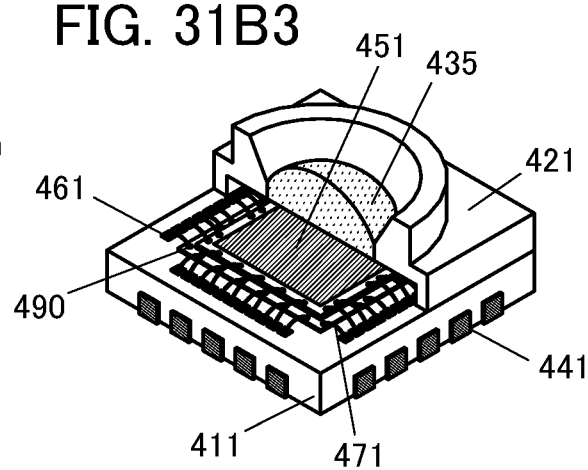

IMAGING DEVICE AND ELECTRONIC DEVICE

CROSS REFERENCE TO RELATED APPLICATIONS

This application is a U.S. National Phase Application under 35 U.S.C. § 371 of International Application PCT/IB2021/052939, filed on Apr. 9, 2021, which is incorporated by reference and claims the benefit of a foreign priority application filed in Japan on Apr. 17, 2020, as Application No. 2020-073767.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique which adds an arithmetic function to an imaging device is disclosed in Patent Document 2.

REFERENCE

Patent Document

[Patent Document 1] Japanese Published Patent Application No. 2011-119711
[Patent Document 2] Japanese Published Patent Application No. 2016-123087

SUMMARY OF THE INVENTION

Problems to be Solved by the Invention

An imaging device included in a portable device or the like generally has a function of capturing a high-resolution image. In the next generation, an imaging device is required to be equipped with more intelligent functions.

Image data (analog data) obtained by an imaging device is converted into digital data and taken out to the outside, and then image processing is performed as necessary. If the processing can be carried out in the imaging device, higher-speed communication with an external device is possible, improving user's convenience. Furthermore, load and power consumption of a peripheral device or the like can be reduced. Moreover, if complicated data processing is performed in an analog data state, time required for data conversion can be shortened.

The number of components such as circuits increases when functions are added to the imaging device; the components preferably have a stacked-layer structure. For example, when a plurality of circuits are provided to overlap with a pixel circuit, an increase in area can be inhibited and a small imaging device with a high function can be formed.

Thus, an object of one embodiment of the present invention is to provide an imaging device capable of image processing. Another object is to provide a small imaging device with a high function. Another object is to provide an imaging device capable of a high-speed operation. Another object is to provide an imaging device with low power consumption. Another object is to provide a highly reliable imaging device. Another object is to provide a novel imaging device or the like. Another object is to provide a method for driving the above-described imaging device. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to an imaging device that has an image processing function and is capable of a high-speed operation.

One embodiment of the present invention is an imaging device including a plurality of pixel blocks and a first circuit. The plurality of pixel blocks each include a plurality of pixels and a memory cell. Analog data calculated from data generated by the plurality of pixels is stored in the memory cell. The first circuit has a function of reading out the maximum value of the analog data stored in the memory cell included in each of the plurality of pixel blocks.

The memory cell preferably includes a region overlapping with at least one of the pixels and the first circuit.

Another embodiment of the present invention is an imaging device including a plurality of pixel blocks, a first circuit, a second circuit, and a third circuit. The plurality of pixel blocks each include a plurality of pixels and a memory cell. The plurality of pixels each have a function of retaining first data corresponding to a reset operation. The plurality of pixels each have a function of retaining second data corresponding to a photoelectric conversion operation. The plurality of pixels each have a function of adding a weight coefficient and the first data to generate third data. The plurality of pixels each have a function of adding the weight coefficient and the second data to generate fourth data. The first circuit has a function of generating fifth data corresponding a difference between the sum of the first data retained in the plurality of pixels and the sum of the third data generated in the plurality of pixels. The first circuit has a function of generating sixth data corresponding a difference between the sum of the second data retained in the plurality of pixels and the sum of the fourth data generated in the plurality of pixels. The second circuit has a function of generating seventh data corresponding a difference between the fifth data and the sixth data. The seventh data is stored in the memory cell. The third circuit has a function of reading out the maximum value of the seventh data stored in the memory cell included in each of the plurality of pixel blocks.

Each of the pixels can include a photoelectric conversion device, a first transistor, a second transistor, a third transistor, a fourth transistor, a fifth transistor, and a first capacitor. One electrode of the photoelectric conversion device can be electrically connected to one of a source and a drain of the first transistor. The other of the source and the drain of the first transistor can be electrically connected to one of a source and a drain of the second transistor, one electrode of the first capacitor, and a gate of the third transistor. One of a source and a drain of the third transistor can be electrically connected to one of a source and a drain of the fourth transistor. The other electrode of the first capacitor can be electrically connected to one of a source and a drain of the fifth transistor.

The memory cell can include a sixth transistor, a seventh transistor, and a second capacitor. One of a source and a drain of the sixth transistor, one electrode of the second capacitor, and a gate of the seventh transistor can be electrically connected to each other.

It is preferable that the sixth transistor and the seventh transistor each include a metal oxide in a channel formation region, and the metal oxide include In, Zn, and M (M is one or more of Al, Ti, Ga, Ge, Sn, Y, Zr, La, Ce, Nd, and Hf).

A correlated double sampling circuit can be used as each of the first circuit and the second circuit.

The third circuit can include a plurality of current mirror circuits.

It is preferable that the first circuit to the third circuit each include a transistor including silicon in a channel formation region.

The pixels preferably include a region overlapping with at least one of the first circuit to the third circuit. The memory cell may include a region overlapping with at least one of the first circuit to the third circuit and the pixels.

Effect of the Invention

With one embodiment of the present invention, an imaging device capable of image processing can be provided. A small imaging device with a high function can be provided. An imaging device capable of a high-speed operation can be provided. An imaging device with low power consumption can be provided. A highly reliable imaging device can be provided. A novel imaging device or the like can be provided. A method for driving the above-described imaging device can be provided. A novel semiconductor device or the like can be provided.

BRIEF DESCRIPTION OF THE DRAWINGS

FIG. 9A and FIG. 9B are timing charts showing the operation of an imaging device.
FIG. 14A is a diagram illustrating a circuit 230a.
FIG. 31A1 to FIG. 31A3 and FIG. 31B1 to FIG. 31B3 are perspective views of a package in which an imaging device is placed and a module in which an imaging device is placed.

MODE FOR CARRYING OUT THE INVENTION

Figure 1:
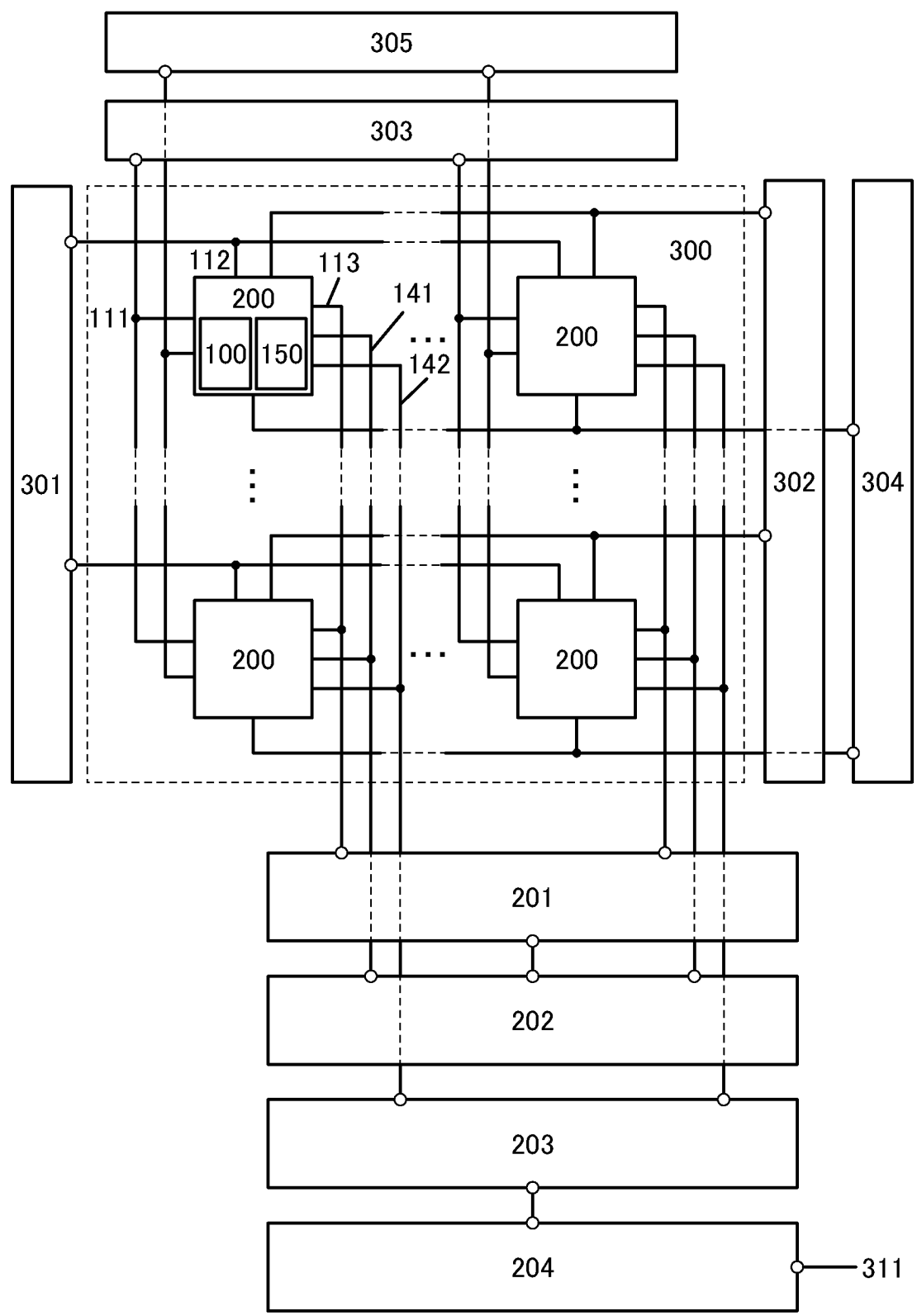
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of the embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a structure is included in direct connection.

Embodiment 1

In this embodiment, an imaging device of one embodiment of the present invention is described with reference to drawings.

One embodiment of the present invention is an imaging device having an additional function such as image processing. The imaging device can retain analog data (image data) obtained by an image capturing operation in pixels and extract analog data obtained by multiplying the retained analog data by a given weight coefficient.

The analog data is stored in a memory cell. It is possible to perform pooling processing, by which the maximum value of analog data stored in a plurality of memory cells can be read out. The pixels are provided so as to have a region overlapping with at least one of the memory cell, a circuit for performing the pooling processing, and a reading circuit of the pixels; thus, an increase in the area of the imaging device can be inhibited even with an additional function.

When data after the pooling processing is taken in a neural network or the like, processing such as image recognition can be performed. Since an enormous amount of image data can be retained in pixels in the state of analog data, processing can be performed efficiently.

<Imaging Device>

FIG. 1 is a block diagram illustrating the imaging device of one embodiment of the present invention. The imaging device includes a pixel array 300, a circuit 201, a circuit 202, a circuit 203, a circuit 204, a circuit 301, a circuit 302, a circuit 303, a circuit 304, and a circuit 305. Note that each of the structures of the circuit 201 to the circuit 204 and the circuit 301 to the circuit 305 is not limited to a single circuit and consists of a combination of a plurality of circuits in some cases. Furthermore, any two or more of the circuits described above may be combined. Moreover, a circuit other than the above circuits may be connected.

The pixel array 300 has an image capturing function and an arithmetic function. The circuit 201 to the circuit 204 each have an arithmetic function or a data conversion function. The circuit 301 to the circuit 304 each have a selection function. The circuit 305 has a function of supplying a potential for a product-sum operation to a pixel. As a circuit having a selection function, a shift register, a decoder, or the like can be used. Note that the circuit 204 may be provided outside the imaging device.

Figure 2:
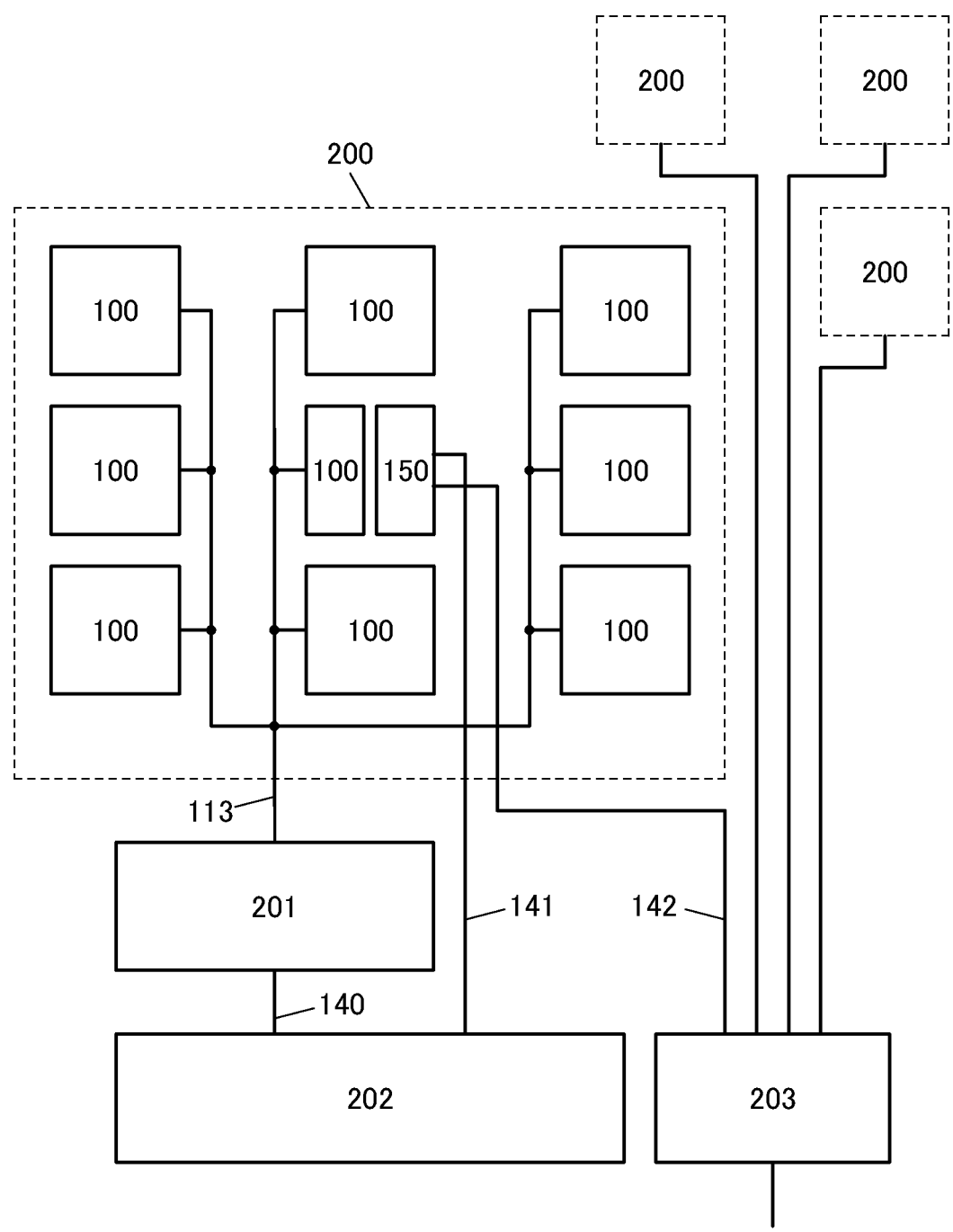
FIG. 2 is a block diagram illustrating an imaging device.

The pixel array 300 includes a plurality of pixel blocks 200. As illustrated in FIG. 2, the pixel block 200 includes a plurality of pixels 100 arranged in a matrix, and each of the pixels 100 is electrically connected to the circuit 201 through a wiring 113. Note that the circuit 201 can also be provided in the pixel block 200.

The pixel block 200 includes at least one memory cell 150. The memory cell 150 may be provided in a region overlapping with the pixel 100. The memory cell 150 is electrically connected to the circuit 202 through a wiring 141. The memory cell 150 is also electrically connected to the circuit 203 through a wiring 142.

The circuit 301 and the circuit 302 have a selection function for operating the pixels 100. The circuit 304 and the circuit 305 have a selection function for operating the memory cell 150. Although not illustrated, a selection circuit or sequence circuit for controlling input and output of data may be provided as appropriate between the pixel block 200 and the circuit 201, the pixel block 200 and the circuit 203, the circuit 201 and the circuit 202, the circuit 203 and the circuit 204, or the like.

The pixels 100 can obtain image data and generate data obtained by adding the image data and a weight coefficient. Note that the number of pixels 100 included in the pixel block 200 is 3×3 in an example illustrated in FIG. 2 but is not limited to this. For example, the number of pixels can be 2×2, 4×4, or the like. Alternatively, the number of pixels 100 in the horizontal direction and the number of pixels 100 in the vertical direction may differ from each other. Furthermore, some pixels 100 may be shared by adjacent pixel blocks.

Figure 3:
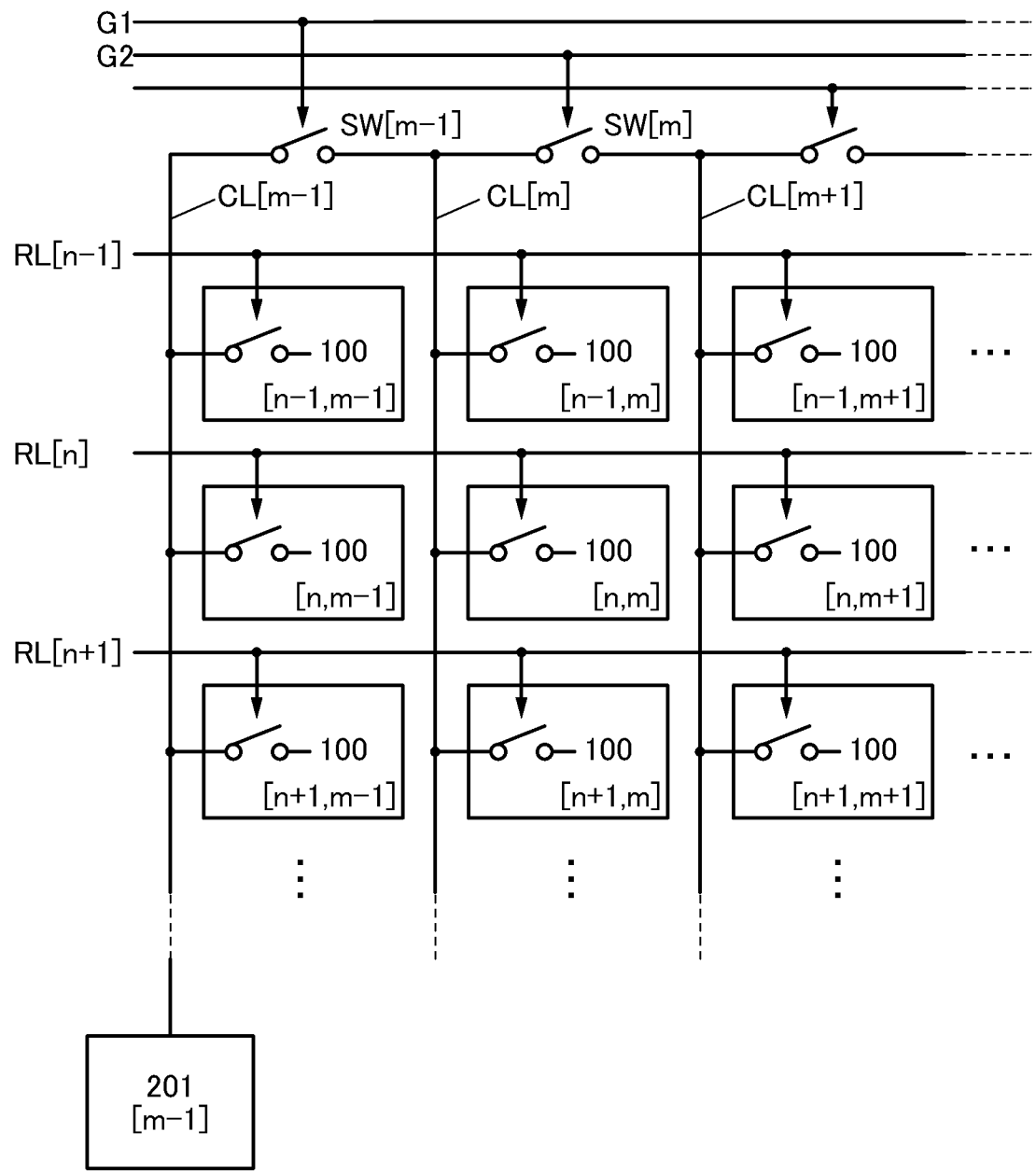
FIG. 3 is a diagram illustrating a selection operation of pixels.

For example, with a structure illustrated in FIG. 3, the number of pixels 100 included in the pixel block 200 can be variable. FIG. 3 illustrates the plurality of pixels 100 arranged in a [n−1]-th row to a [n+1] row and a [m−1]-th column to a [m+1]-th column (n and m are each an integer greater than or equal to 2). A selection switch is provided in each pixel 100, and "ON" or "OFF" of the selection switch is controlled by a selection signal supplied to each of row wirings RL[n−1] to RL[n+1]. The selection switch is electrically connected to any of column wirings CL[m−1] to CL[m+1]. At least one of the column wirings is electrically connected to a circuit 201[$m$−1].

A conduction switch SW[m−1] is provided between the column wirings CL[m−1] and CL[m], and a conduction switch SW[m] is provided between the column wirings CL[m] and CL[m+1]. By selection signals supplied to a signal line G1 and a signal line G2, "ON" or "OFF" of the conduction switches is controlled. When the selection switch is turned "ON", electrical continuity can be established between adjacent column wirings.

Figure 4:
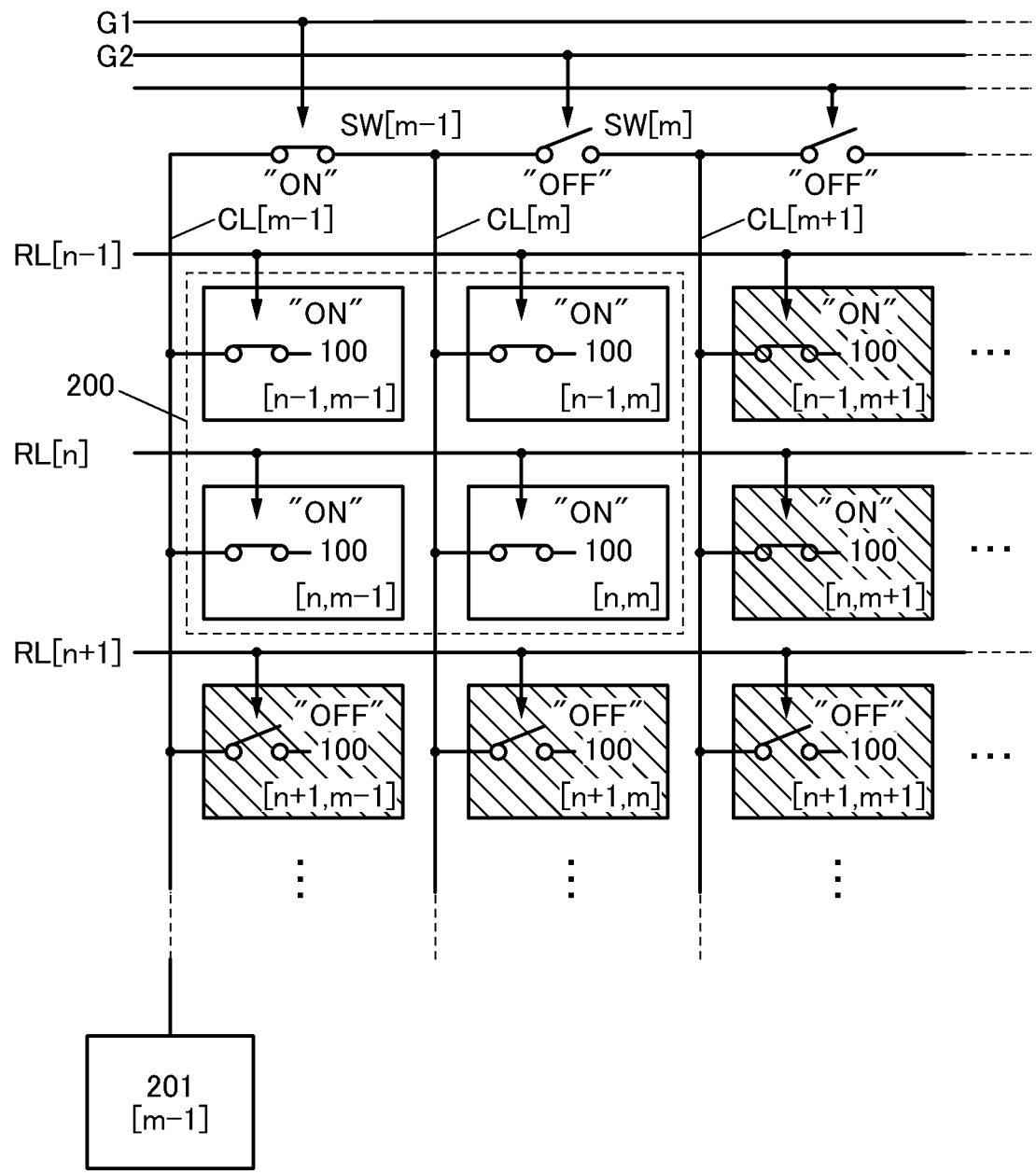
FIG. 4 is a diagram illustrating a selection operation of pixels.

For example, when signals for turning "ON" the selection switches are supplied to the row wirings RL[n−1] and RL[n] and a signal for turning "ON" the conduction switch SW[m−1] is supplied to the signal line G1 as illustrated in FIG. 4, 2×2 pixels 100 (a pixel 100[$n$−1, m−1], a pixel 100[$n$−1, m], a pixel 100[$n$, m−1], and a pixel 100[$n$, m]) are selected. In addition, electrical continuity is established between the column wiring CL[m−1] and the column wiring CL[m]. Thus, the above 2×2 pixels 100 are electrically connected to the circuit 201[$m$−1].

Furthermore, when a signal for turning "ON" the selection switch is supplied to the row wiring RL[n+1] and a signal for turning "ON" the conduction switch SW[m] is supplied to the signal line G2, 3×3 pixels 100 are electrically connected to the circuit 201 as in the structure illustrated in FIG. 2.

This structure allows any row and any column to be selected, so that an arithmetic operation can be performed with the number of strides being changed.

Figure 5:
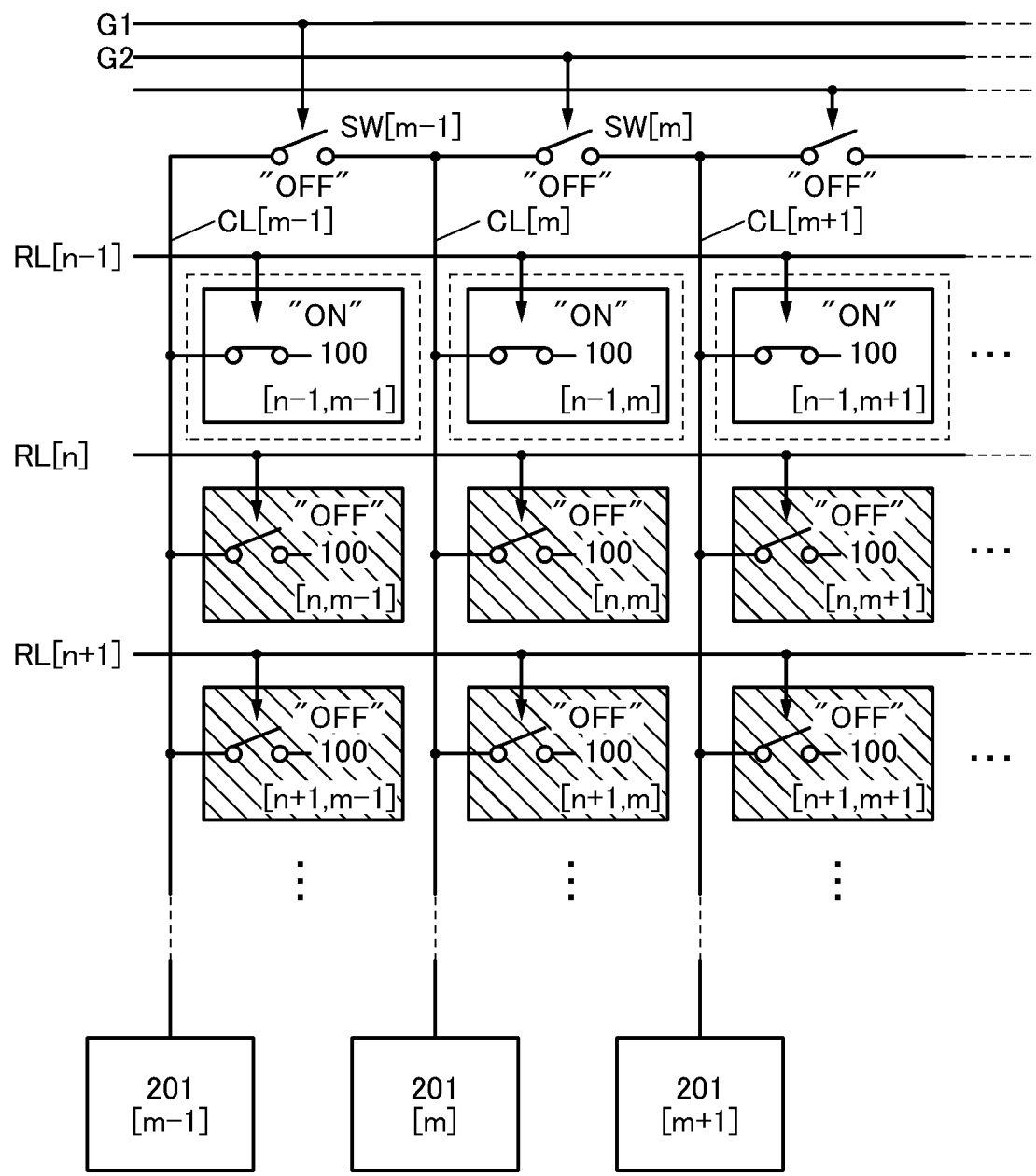
FIG. 5 is a diagram illustrating a selection operation of pixels.

When all the conduction switches are turned "OFF" while only the pixels 100 in any one row are able to be selected as illustrated in FIG. 5, electrical continuity between one column wiring and one pixel 100 can be established. Here, when each column wiring is electrically connected to the corresponding circuit 201 as illustrated in FIG. 5, data can be read out from each pixel 100. That is, high-resolution image data or the like can be read out. Note that it is also possible to employ a structure in which the number of circuits 201 is smaller than that of column wirings and any wiring is selected to read out data from the circuit 201.

The pixel block 200, the circuit 201, and the circuit 202 can operate as a product-sum operation circuit. The pixel block 200 is electrically connected to the circuit 201 through the wiring 113, and the circuit 201 is electrically connected to the circuit 202 through a wiring 140.

Product-sum operation data (analog data) is stored in the memory cell 150 through the wiring 141. The analog data stored in the memory cell 150 is read out to the circuit 203 through the wiring 142. The circuit 203 can compare analog data stored in a plurality of memory cells 150 to output the maximum value. In other words, the circuit 203 can function as a pooling circuit.

At least one of the circuit 201, the circuit 202, and the circuit 203 is preferably provided so as to have a region overlapping with the pixel 100. Alternatively, at least one of the circuit 201, the circuit 202, the circuit 203, and the pixel is preferably provided so as to have a region overlapping with the memory cell 150. This structure can reduce the overall area of the imaging device, achieving a small imaging device with a high function. Furthermore, the stacked-layer structure can shorten the length of wirings electrically connecting the pixel 100, the memory cell 150, the circuit 201, the circuit 202, and the circuit 203, enabling a high-speed operation with low power consumption.

<Pixel Circuit>

Figure 6A:
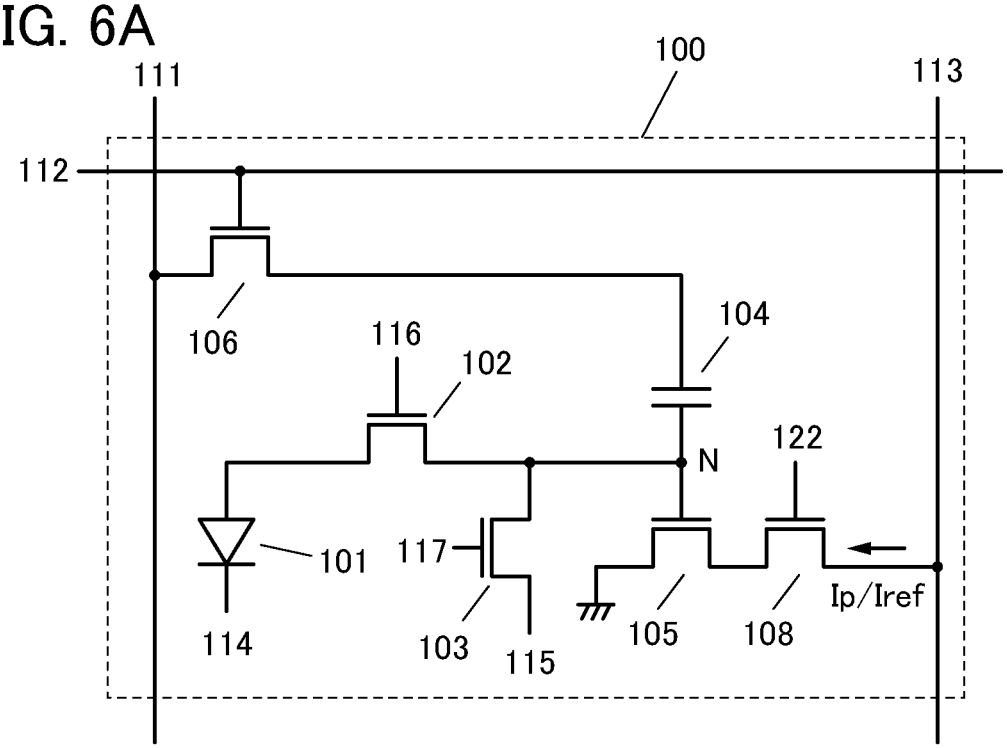
FIG. 6A and FIG. 6B are diagrams each illustrating a pixel.

As illustrated in FIG. 6A, the pixel 100 can include a photoelectric conversion device 101, a transistor 102, a transistor 103, a capacitor 104, a transistor 105, a transistor 106, and a transistor 108.

One electrode of the photoelectric conversion device 101 is electrically connected to one of a source and a drain of the transistor 102. The other of the source and the drain of the transistor 102 is electrically connected to one of a source and a drain of the transistor 103, one electrode of the capacitor 104, and a gate of the transistor 105. One of a source and a drain of the transistor 105 is electrically connected to one of a source and a drain of the transistor 108. The other electrode of the capacitor 104 is electrically connected to one of a source and a drain of the transistor 106.

The other electrode of the photoelectric conversion device 101 is electrically connected to a wiring 114. A gate of the transistor 102 is electrically connected to a wiring 116. The other of the source and the drain of the transistor 103 is electrically connected to a wiring 115. A gate of the transistor 103 is electrically connected to a wiring 117. The other of the source and the drain of the transistor 105 is electrically connected to a GND wiring or the like. The other of the source and the drain of the transistor 108 is electrically connected to the wiring 113. The other of the source and the drain of the transistor 106 is electrically connected to a wiring 111. A gate of the transistor 106 is electrically connected to a wiring 112. A gate of the transistor 108 is electrically connected to a wiring 122.

Here, a point (wiring) where the other of the source and the drain of the transistor 102, the one of the source and the drain of the transistor 103, the one electrode of the capacitor 104, and the gate of the transistor 105 are electrically connected is referred to as a node N.

The wirings 114 and 115 can each have a function of a power supply line. For example, the wiring 114 can function as a high-potential power supply line, and the wiring 115 can function as a low-potential power supply line. The wirings 112, 116, 117, and 122 can function as signal lines that control the conduction of the respective transistors. The wiring 111 can function as a wiring for supplying a potential corresponding to a weight coefficient to the pixel 100. The wiring 113 can function as a wiring that electrically connects the pixel 100 and the circuit 201.

Note that an amplifier circuit or a gain control circuit may be electrically connected to the wiring 113.

As the photoelectric conversion device 101, a photodiode can be used. In order to increase the light detection sensitivity at low illuminance, an avalanche photodiode is preferably used.

The transistor 102 can have a function of controlling the potential of the node N. The transistor 103 can have a function of initializing the potential of the node N. The transistor 105 can have a function of controlling a current fed by the circuit 201 in accordance with the potential of the node N. The transistor 108 can have a function of selecting a pixel. The transistor 106 can have a function of supplying the potential corresponding to the weight coefficient to the node N.

Figure 6B:
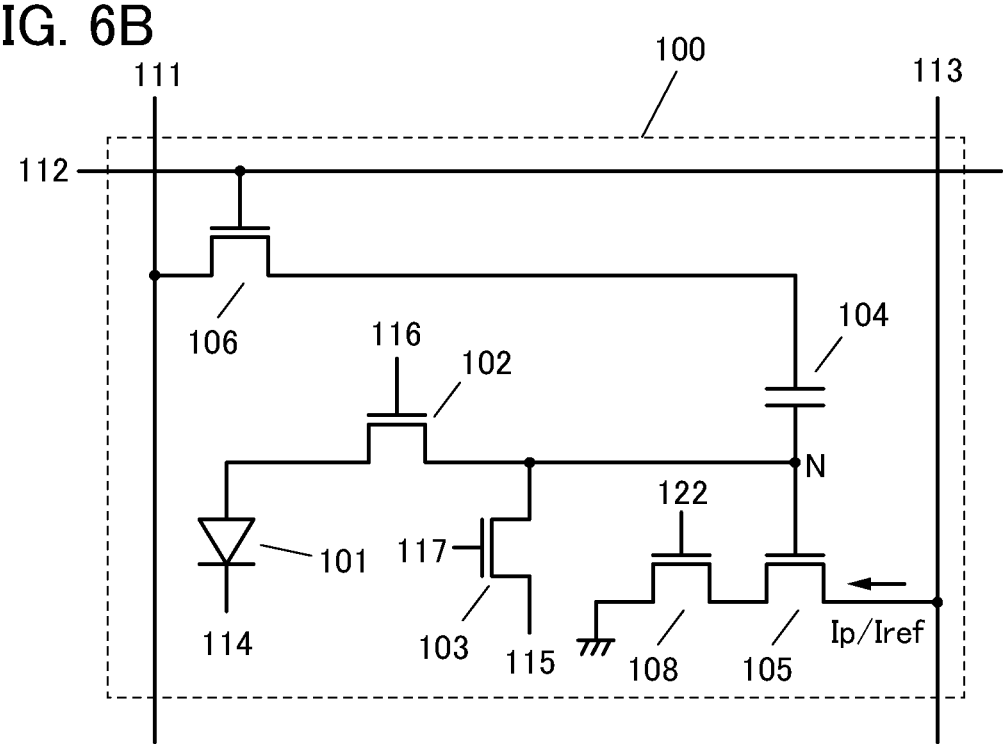

Note that as illustrated in FIG. 6B, the one of the source and the drain of the transistor 105 may be electrically connected to the one of the source and the drain of the transistor 108, the other of the source and the drain of the transistor 105 may be connected to the wiring 113, and the other of the source and the drain of the transistor 108 may be electrically connected to the GND wiring or the like.

In FIG. 6A and FIG. 6B, the connection direction of the pair of electrodes included in the photoelectric conversion device 101 may be reversed. In that case, the wiring 114 functions as a low-potential power supply line and the wiring 115 functions as a high-potential power supply line.

A transistor including a metal oxide in a channel formation region (an OS transistor) is preferably used as each of the transistors 102 and 103. The OS transistor has a feature of an extremely low off-state current. When OS transistors are used as the transistors 102 and 103, the charge retention period of the node N can be lengthened greatly. Furthermore, a global shutter mode in which a charge accumulation operation is performed in all the pixels at the same time can be used without complicating the circuit structure and operation method. In addition, while image data is retained at the node N, an arithmetic operation using the image data can be performed a plurality of times.

Meanwhile, it is sometimes desired that the transistor 105 have excellent amplifying characteristics. A transistor having a high mobility capable of a high-speed operation is sometimes preferably used as each of the transistors 106 and 108. Accordingly, a transistor including silicon in a channel formation region (a Si transistor) may be used as each of the transistors 105, 106, and 108.

Note that without limitation to the above, an OS transistor and a Si transistor may be used in appropriate combination. All the transistors may be OS transistors. Alternatively, all the transistors may be Si transistors. Examples of the Si transistor include a transistor including amorphous silicon and a transistor including crystalline silicon (microcrystalline silicon, low temperature polysilicon, or single crystal silicon).

The potential of the node N in the pixel 100 is determined by the potential obtained by adding a reset potential supplied from the wiring 115 and a potential (image data) generated by photoelectric conversion by the photoelectric conversion device 101. Moreover, the potential of the node N in the pixel 100 is determined by capacitive coupling of the potential corresponding to a weight coefficient supplied from the wiring 111. Thus, a current corresponding to data in which a given weight coefficient is added to the image data can flow through the transistor 105.

Figure 7A:
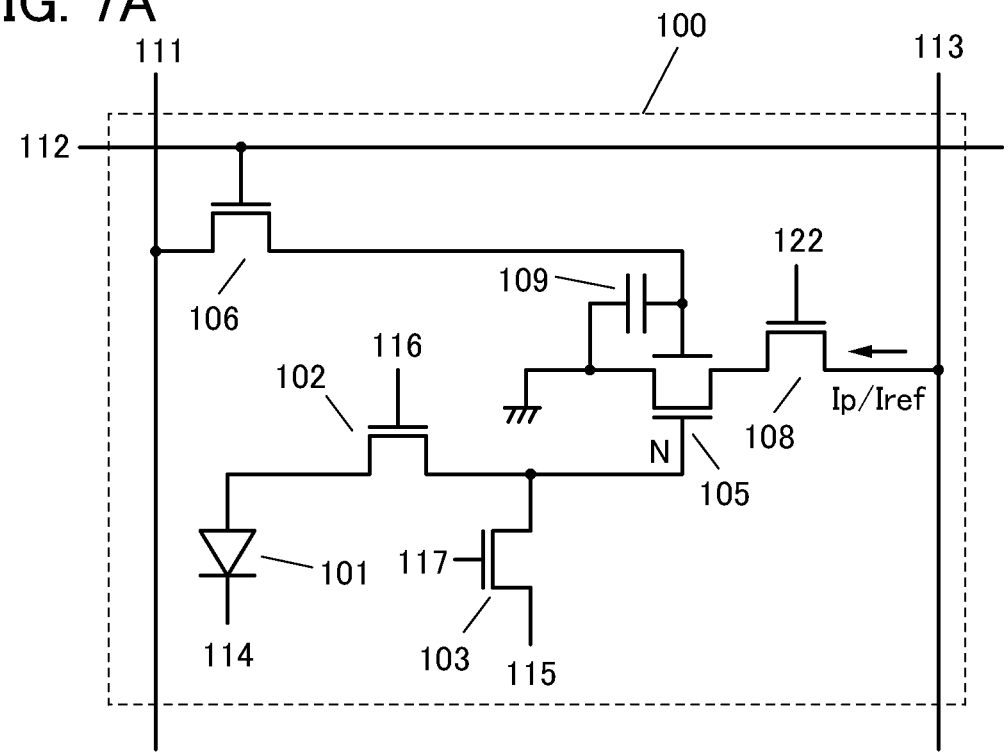
FIG. 7A and FIG. 7B are diagrams each illustrating a pixel.

As illustrated in FIG. 7A, the transistor 105 may include a back gate (a second gate), and the one of the source and the drain of the transistor 106 may be electrically connected to the back gate. Furthermore, a capacitor 109 whose one electrode is connected to the back gate may be provided. The capacitor 109 functions as a storage capacitor. Note that the capacitor 109 is not necessarily provided.

Figure 7B:
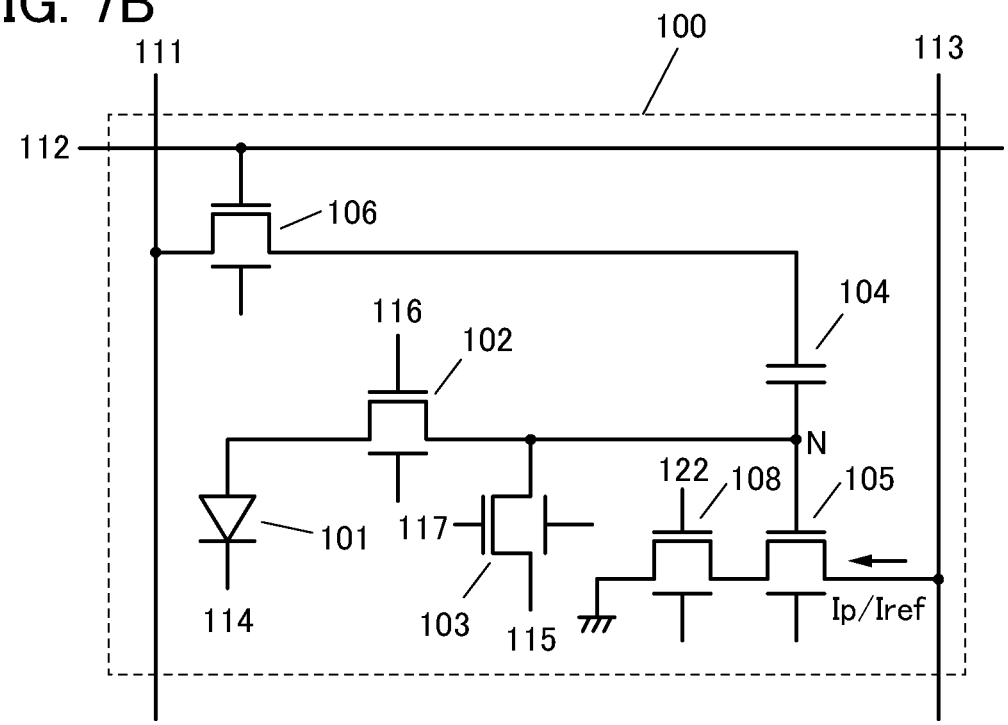

As illustrated in FIG. 7B, a structure in which each transistor includes a back gate (a second gate) may be employed. Electrical connection between the back gate and the front gate can increase the on-state current of the transistor. In addition, supplying an appropriate constant potential to the back gate can control the threshold voltage of the transistor. Note that the structure in which a transistor includes a back gate can be used for the other circuits in this specification. A circuit may include both a transistor with a back gate and a transistor without a back gate.

Note that the above is an example of the circuit structure of the pixel 100, and the photoelectric conversion operation can also be performed with other circuit structures.

<Circuit 201 and circuit 202>

As illustrated in FIG. 2, the pixels 100 in the pixel block 200 are electrically connected to each other through the wiring 113. The circuit 201 can perform an arithmetic operation using the sum of the currents flowing through the transistors 105 of the pixels 100.

Figure 8:
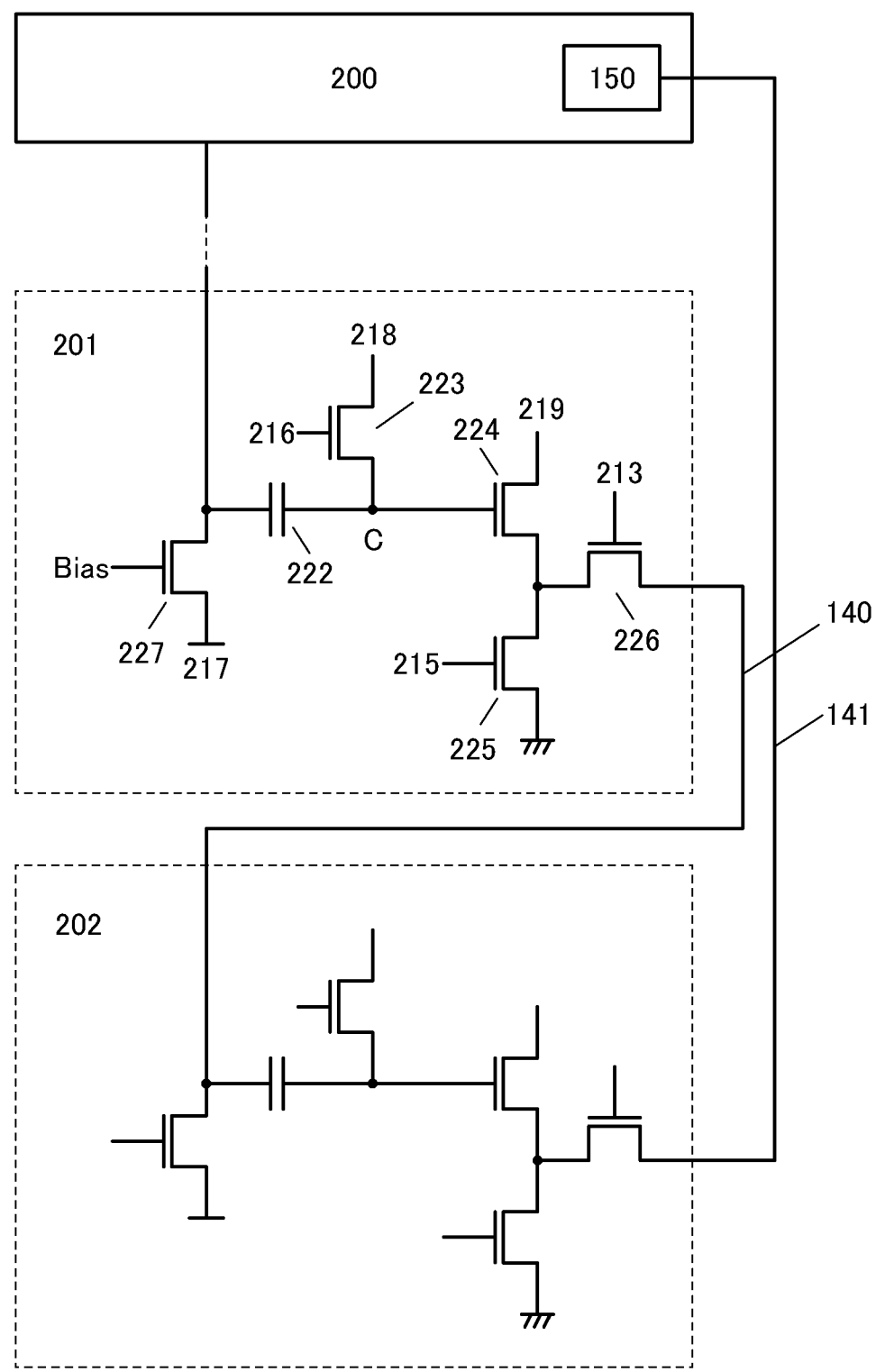
FIG. 8 is a diagram illustrating a circuit 201 and a circuit 202.

The circuit 201 can have a structure illustrated in FIG. 8. The circuit 201 includes a capacitor 222, a transistor 223, a transistor 224, a transistor 225, a transistor 226, and a transistor 227 functioning as a voltage converter circuit. An appropriate analog potential (Bias) is applied to a gate of the transistor 227.

One electrode of the capacitor 222 is electrically connected to one of a source and a drain of the transistor 223 and a gate of the transistor 224. One of a source and a drain of the transistor 224 is electrically connected to one of a source and a drain of the transistor 225 and one of a source and a drain of the transistor 226. The other electrode of the capacitor 222 is electrically connected to the wiring 113 and one of a source and a drain of the transistor 227.

Here, a point (wiring) where the one electrode of the capacitor 222, the one of the source and the drain of the transistor 223, and the gate of the transistor 224 are connected is referred to as a node C.

The other of the source and the drain of the transistor 223 is electrically connected to a wiring 218. The other of the source and the drain of the transistor 224 is electrically connected to a wiring 219. The other of the source and the drain of the transistor 225 is electrically connected to a reference power supply line such as a GND wiring. The other of the source and the drain of the transistor 226 is electrically connected to the wiring 140. The other of the source and the drain of the transistor 227 is electrically connected to a wiring 217. A gate of the transistor 223 is electrically connected to a wiring 216. A gate of the transistor 225 is electrically connected to a wiring 215. A gate of the transistor 226 is electrically connected to a wiring 213.

The wirings 217, 218, and 219 can each have a function of a power supply line. For example, the wiring 218 can have a function of a wiring for supplying a reset potential (Vr) for reading. The wirings 217 and 219 can each function as a high-potential power supply line. The wirings 213, 215, and 216 can each function as a signal line that controls the electrical conduction of each transistor.

The transistor 223 can have a function of resetting the potential of the node C to the potential of the wiring 218. The transistors 224 and 225 can each have a function of source follower circuit. The transistor 226 can have a function of controlling a reading operation. Note that the circuit 201 has a function of a correlated double sampling circuit (a CDS circuit), and can be replaced with a circuit with another structure that has the function.

In one embodiment of the present invention, offset components other than the product of image data (X) and a weight coefficient (W) are eliminated and an objective WX is extracted. WX can be calculated using data of a pixel obtained when light exposure (image capturing) is performed, data of the pixel obtained when light exposure (image capturing) is not performed, and data of the pixel obtained by adding weights to the respective data.

The total amount of currents ($I_p$) flowing through the pixels 100 when light exposure is performed is $k\Sigma(X-V_{th})^2$, and the total amount of currents ($I_p$) flowing through the pixels 100 when weights are added is $k\Sigma(W+X-V_{th})^2$. The total amount of currents ($I_{ref}$) flowing through the pixels 100 when light exposure is not performed is $k\Sigma(0-V_{th})^2$, and the total amount of currents ($I_{ref}$) flowing through the pixels 100 when weights are added is $k\Sigma(W-V_{th})^2$. Here, k is a constant and $V_{th}$ is the threshold voltage of the transistor 105.

First, a difference (data A) between the data obtained when light exposure is performed and the data obtained by adding a weight to the data is calculated. The difference is $k\Sigma((X-V_{th})^2-(W+X-V_{th})^2)=k\Sigma(-W^2-2W \cdot X+2W \cdot V_{th})$.

Next, a difference (data B) between the data obtained when light exposure is not performed and the data obtained by adding a weight to the data is calculated. The difference is $k\Sigma((0-V_{th})^2-(W-V_{th})^2)=k\Sigma(-W^2+2W \cdot V_{th})$.

Then, a difference between the data A and the data B is calculated. The difference is $k\Sigma(-W^2-2W \cdot X+2W \cdot V_{th}-(-W^2+2W \cdot V_{th}))=k\Sigma(-2W \cdot X)$. That is, offset components other than the product of the image data (X) and the weight coefficient (W) can be eliminated.

The circuit 201 can generate the data A and the data B. Note that the calculation of the difference between the data A and the data B can be performed by the circuit 202. As illustrated in FIG. 8, the circuit 202 can have a structure similar to that of the circuit 201. Note that the circuit 202 may have another structure, and the operation of the circuit 202 can be replaced with processing by software.

<Image Capturing Operation>

FIG. 9A is a timing chart illustrating an operation of calculating the difference (data A) between the data obtained when light exposure is performed and the data obtained by adding the weight to the data in the pixel block 200 and the circuit 201. For convenience, the timings of changing signals are matched in the chart; however, in reality, the timings are preferably shifted in consideration of the delay inside the circuit. In the following description, a high potential is represented by "H" and a low potential is represented by "L".

First, in a period T1, the potential of the wiring 117 is set to "H" and the potential of the wiring 116 is set to "H", so that the node N in the pixel 100 has a reset potential. Furthermore, the potential of the wiring 111 is set to "L" and the potentials of wirings 112_1 to 112_3 (the wirings 112 in the first row to the third row) are set to "H", so that a weight coefficient of 0 is written.

In a period T2, the potential of the wiring 116 is kept at "H" and the potential of the wiring 117 is set to "L", so that a potential X (image data) is written to the node N by photoelectric conversion in the photoelectric conversion device 101.

In a period T3, the potentials of wirings 122_1, 122_2, and 122_3 are set to "H", so that all of the pixels 100 in the pixel block are selected. At this time, a current corresponding to the potential X flows to the transistor 105 in each of the pixels 100. The potential of the wiring 216 is set to "H", so that a potential Vr of the wiring 218 is written to the node C. The operation in the periods T1 to T3 corresponds to obtainment of the data obtained when light exposure is performed, and the data is initialized to the potential Vr of the node C.

In a period T4, the potential of the wiring 111 is set to a potential corresponding to a weight coefficient W11 (a weight added to the pixels in the first row), and the potential of the wiring 112_1 is set to "H", so that the weight coefficient W11 is added to the nodes N of the pixels 100 in the first row by capacitive coupling of the capacitors 104.

In a period T5, the potential of the wiring 111 is set to a potential corresponding to a weight coefficient W12 (a weight added to the pixels in the second row), and the potential of the wiring 112_2 is set to "H", so that the weight coefficient W12 is added to the nodes N of the pixels 100 in the second row by capacitive coupling of the capacitors 104.

In a period T6, the potential of the wiring 111 is set to a potential corresponding to a weight coefficient W13 (a weight added to the pixels in the third row), and the potential of the wiring 112_3 is set to "H", so that the weight coefficient W13 is added to the nodes N of the pixels 100 in the third row by capacitive coupling of the capacitors 104. The operation in the period T4 to the period T6 corresponds to generation of the data in which weights are added to the data obtained when image capturing is performed.

In a period T7, the potentials of the wirings 122_1, 122_2, and 122_3 are set to "H", so that all of the pixels 100 in the pixel block are selected. At this time, a current corresponding to a potential W11+X flows to the transistors 105 in the pixels 100 in the first row. A current corresponding to a potential W12+X flows to the transistors 105 in the pixels 100 in the second row. A current corresponding to a potential W13+X flows to the transistors 105 in the pixels 100 in the third row.

Here, the potential of the other electrode of the capacitor 222 changes in accordance with the current flowing through the wiring 113, and an amount Y of change is added to the potential Vr of the node C by capacitive coupling. Accordingly, the potential of the node C becomes "Vr+Y". Here, given that Vr=0, Y is the difference itself, which means that the data A is calculated.

The potential of the wiring 213 is set to "H" and the potential of the wiring 215 is set to an appropriate analog potential such as "$V_{bias}$", so that the circuit 201 can output a signal potential in accordance with the data A of the pixel blocks 200 in the first row by a source follower operation.

FIG. 9B is a timing chart showing an operation of calculating the difference (data B) between the data obtained when light exposure is not performed and the data obtained by adding a weight to the data in the pixel block 200 and the circuit 201. Note that the data B is obtained as needed. For example, the obtained data B may be stored in a memory, and if the input weight is not changed, the data B may be read out from the memory. Note that a plurality of pieces of data B corresponding to a plurality of weights may be stored in the memory. Either the data A or the data B may be obtained first.

First, in the periods T1 and T2, the potential of the wiring 117 is set to "H" and the potential of the wiring 116 is set to "H", so that the potential of the node N in the pixel 100 has a reset potential (0). At the end of the period T2, the potential of the wiring 117 is set to "L" and the potential of the wiring 116 is set to "L". That is, in these periods, the potential of the node N is the reset potential regardless of the operation of the photoelectric conversion device 101.

In the period T1, the potential of the wiring 111 is set to "L" and the potentials of the wirings 112_1, 112_2, and 112_3 are set to "H", so that a weight coefficient of 0 is written. This operation is performed during a period in which the potential of the node N is the reset potential.

In the period T3, the potentials of wirings 122_1, 122_2, and 122_3 are set to "H", so that all of the pixels 100 in the pixel block are selected. At this time, a current corresponding to the reset potential flows to the transistor 105 in each of the pixels 100. The potential of the wiring 216 is set to "H", so that the potential Vr of the wiring 218 is written to the node C. The operation in the periods T1 to T3 corresponds to obtainment of the data obtained when light exposure is not performed, and the data is initialized to the potential Vr of the node C.

In the period T4, the potential of the wiring 111 is set to a potential corresponding to the weight coefficient W11 (the weight added to the pixels in the first row), and the potential of the wiring 112_1 is set to "H", so that the weight coefficient W11 is added to the nodes N of the pixels 100 in the first row by capacitive coupling of the capacitors 104.

In the period T5, the potential of the wiring 111 is set to a potential corresponding to the weight coefficient W12 (the weight added to the pixels in the second row), and the potential of the wiring 112_2 is set to "H", so that the weight coefficient W12 is added to the nodes N of the pixels 100 in the second row by capacitive coupling of the capacitors 104.

In the period T6, the potential of the wiring 111 is set to a potential corresponding to a weight coefficient W13 (a weight added to the pixels in the third row), and the potential of the wiring 112_3 is set to "H", so that the weight coefficient W13 is added to the nodes N of the pixels 100 in the third row by capacitive coupling of the capacitors 104. The operation in the period T4 to the period T6 corresponds to generation of the data in which weights are added to the data obtained when image capturing is not performed.

In the period T7, the potentials of the wirings 122_1, 122_2, and 122_3 are set to "H", so that all of the pixels 100 in the pixel block are selected. At this time, a current corresponding to a potential W11+0 flows to the transistors 105 in the pixels 100 in the first row. A current corresponding to a potential W12+0 flows to the transistors 105 in the pixels 100 in the second row. A current corresponding to a potential W13+0 flows to the transistors 105 in the pixels 100 in the third row.

Here, the potential of the other electrode of the capacitor 222 changes in accordance with the current flowing through the wiring 113, and the amount Y of change is added to the potential Vr of the node C. Accordingly, the potential of the node C becomes "Vr+Z". Here, given that Vr=0, Z is the difference itself, which means that the data B is calculated.

The potential of the wiring 213 is set to "H" and the potential of the wiring 215 is set to an appropriate analog potential ($V_{bias}$) or the like, so that the circuit 201 can output a signal potential in accordance with the data B of the pixel blocks 200 in the first row by a source follower operation.

The data A and the data B output from the circuit 201 through the above operation are sequentially input to the circuit 202. Calculation of the difference between the data A and the data B is performed in the circuit 202 as in the circuit 201, so that unnecessary offset components other than the product of the image data (potential X) and the weight coefficient (potential W) can be eliminated.

Note that in the above operations, the potential of the node C of the circuit 201 is initialized to the potential "Vr" both in the operation of obtaining the data A and the operation of obtaining the data B. Then, "(Vr+Y)−(Vr+Z)"="Y−Z" in the following difference calculation, so that the component of the potential "Vr" is eliminated. As described above, the other unnecessary offset components are also eliminated, so that the product of the image data (potential X) and the weight coefficient (potential W) can be extracted.

This operation corresponds to the initial operation of a neural network performing inference or the like. Thus, at least one arithmetic operation can be performed in the imaging device before an enormous amount of image data is taken out to the outside, so that a load reduction, higher-speed processing, and reduction in power consumption in an arithmetic operation in the outside, input and output of data, or the like are achieved.

As an operation other than the operation described above, the potential of the node C of the circuit 201 may be initialized to different potentials in the operation of obtaining the data A and in the operation of obtaining the data B. For example, the potential is initialized to a potential "Vr1" in the operation of obtaining the data A and to a potential "Vr2" in the operation of obtaining the data B. In this case, "(Vr1+Y)−(Vr2+Z)"="(Vr1−Vr2)+(Y—Z)" in the following difference calculation. "Y−Z" is extracted as the product of the image data (potential X) and the weight coefficient (potential W) as in the above operation, and "Vr1−Vr2" is added thereto. Here, "Vr1−Vr2" corresponds to a bias used for threshold value adjustment in the arithmetic operation in a middle layer of the neural network.

The weight has a function of a filter of a convolutional neural network (CNN), for example, and may additionally have a function of amplifying or attenuating data. For example, when the weight coefficient (W) in the operation of obtaining the data A is set to the product of data obtained by the filter processing and an amplified amount, filter processing data corrected to a brighter image can be extracted. The data B is data obtained when image capturing is not performed and thus can also be referred to as black level data. Thus, the operation of calculating the difference between the data A and the data B can be an operation of promoting visualization of an image taken in a dark place. That is, luminance correction using a neural network can be performed.

As described above, a bias can be generated by the operation in the imaging device in one embodiment of the present invention. Furthermore, a functional weight can be added in the imaging device. Thus, a load in an arithmetic operation performed in the outside or the like can be reduced and the imaging device can be employed for a variety of usages. For example, part of processing in inference of a subject, correction of the resolution of image data, correction of luminance, generation of a color image from a monochrome image, generation of a three-dimensional image from a two-dimensional image, restoration of defected information, generation of a moving image from a still image, correction of an out-of-focus image, generation of a blurred image, or the like can be performed in the imaging device.

<Memory Cell>

As illustrated in FIG. 2, at least one memory cell 150 is provided in the pixel block 200. The memory cell 150 stores the product-sum operation result of data obtained by a plurality of pixels 100 in the pixel block 200.

As described above, the pixels 100 included in the pixel block 200 can be selected as appropriate without being fixed. Thus, at least one memory cell 150 is configured to be provided in the pixel block 200 at any time regardless of the number of strides.

Figure 10A:
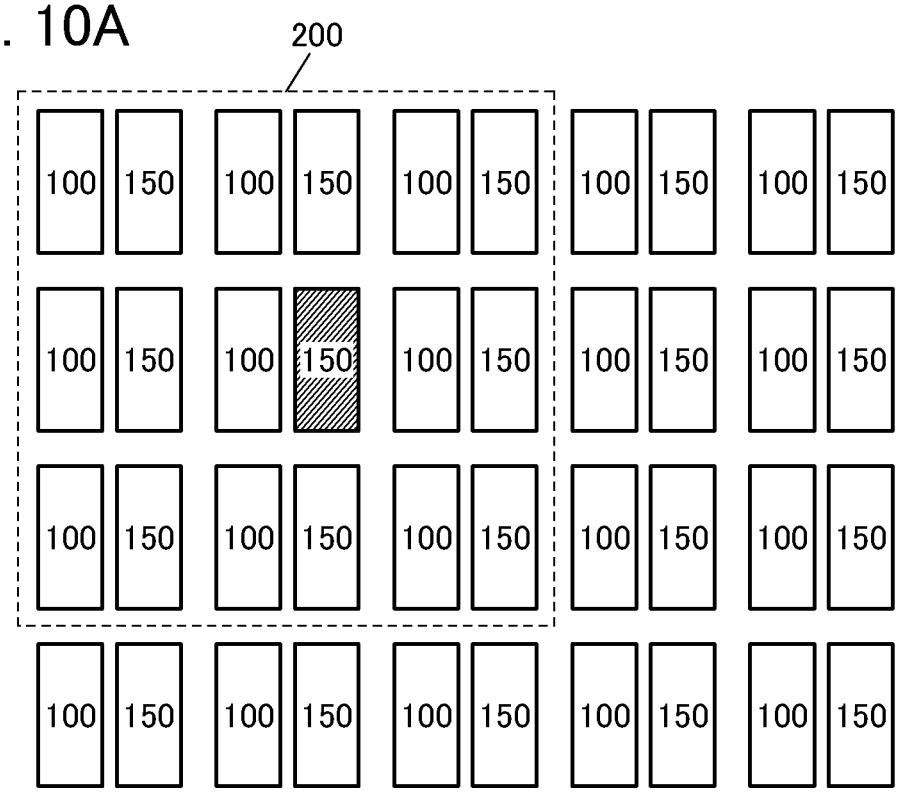
FIG. 10A and FIG. 10B are diagrams each illustrating the arrangement of pixels and memory cells.

For example, in the case where the pixel block 200 includes 3×3 pixels 100, the pixels 100 and the memory cells 150 are preferably arranged in the structure illustrated in FIG. 10A in order to accommodate a stride of 1. In the structure illustrated in FIG. 10A, the number of pixels 100 is almost equal to that of memory cells 150.

Note that FIG. 10A is a schematic diagram and does not illustrate the absolute positional relation between the pixels 100 and the memory cells 150. In a combination of one pixel 100 and one memory cell 150, for example, the memory cell 150 may be positioned in any position of the pixel 100, up, down, left, right, or diagonal, when seen from above. Alternatively, the pixel 100 and the memory cell 150 may be provided in different layers so as to have a region where they overlap with each other.

Figure 10B:
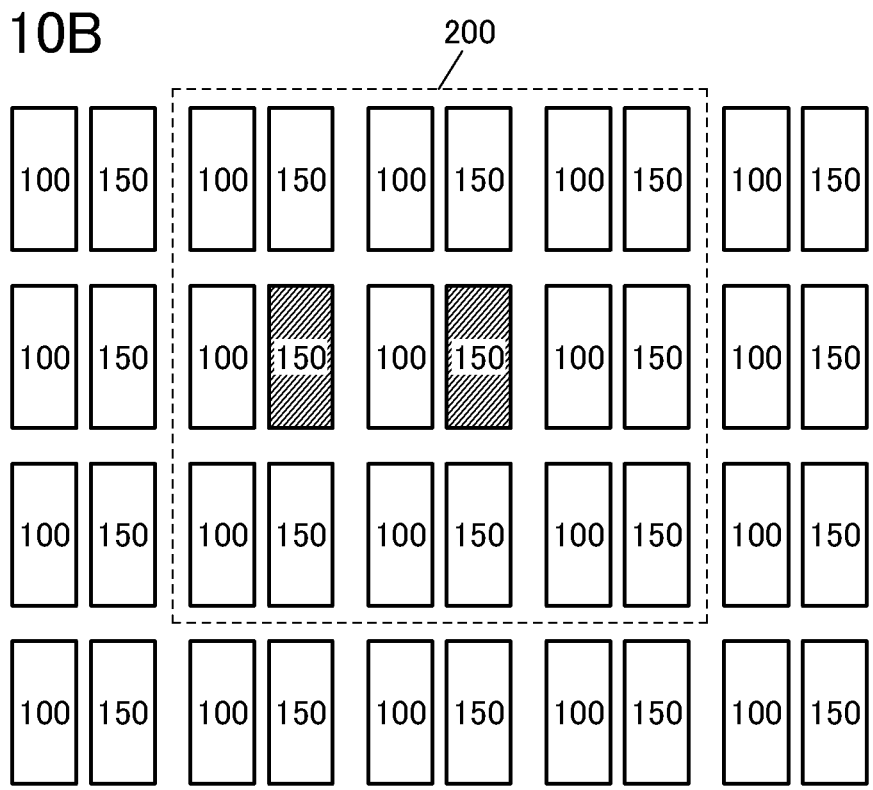

FIG. 10A shows a state in which the product-sum operation result of 3×3 pixels 100 in the pixel block 200 surrounded by a dashed line is written to the memory cell 150 at the center. FIG. 10B shows a subsequent operation with a stride of 1: the product-sum operation result of 3×3 pixels 100 in the pixel block 200 shifted in the row direction by one pixel from that in FIG. 10A is written to the memory cell 150 at the center. Note that the memory cell 150 to which the product-sum operation result is written is not limited to the memory cell 150 at the center but may be the memory cell 150 at any other position.

In the case where the number of pixels 100 is equal to that of memory cells 150 and the pixel block 200 is selected with a stride of 1, the number of memory cells 150 is larger than the total number of pixel blocks 200, so that no data is written to some memory cells 150. Accordingly, the number of memory cells 150 may be reduced as appropriate.

Figure 11A:
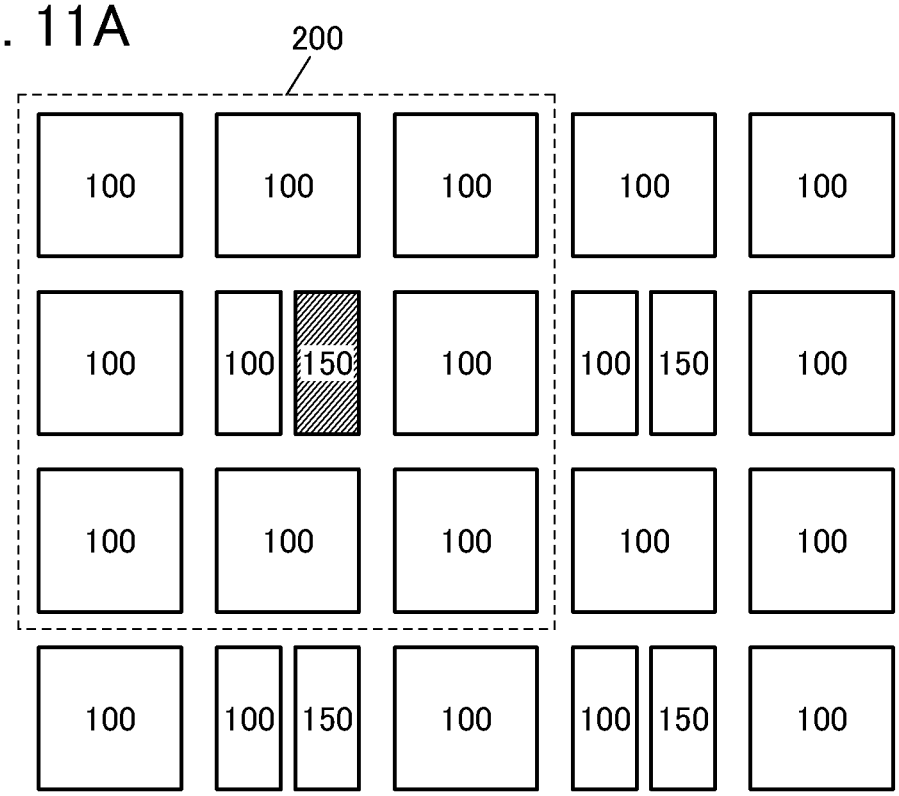
FIG. 11A and FIG. 11B are diagrams each illustrating the arrangement of pixels and memory cells.

In the case where the pixel block 200 includes 3×3 pixels 100 and a stride of 2 is to be accommodated, the structure illustrated in FIG. 11A is preferably employed. In the structure illustrated in FIG. 11A, with the pixels 100 arranged in a matrix used as a reference, the number of memory cells 150 is almost equal to that of pixels 100 arranged in every other row and every other column.

Figure 11B:
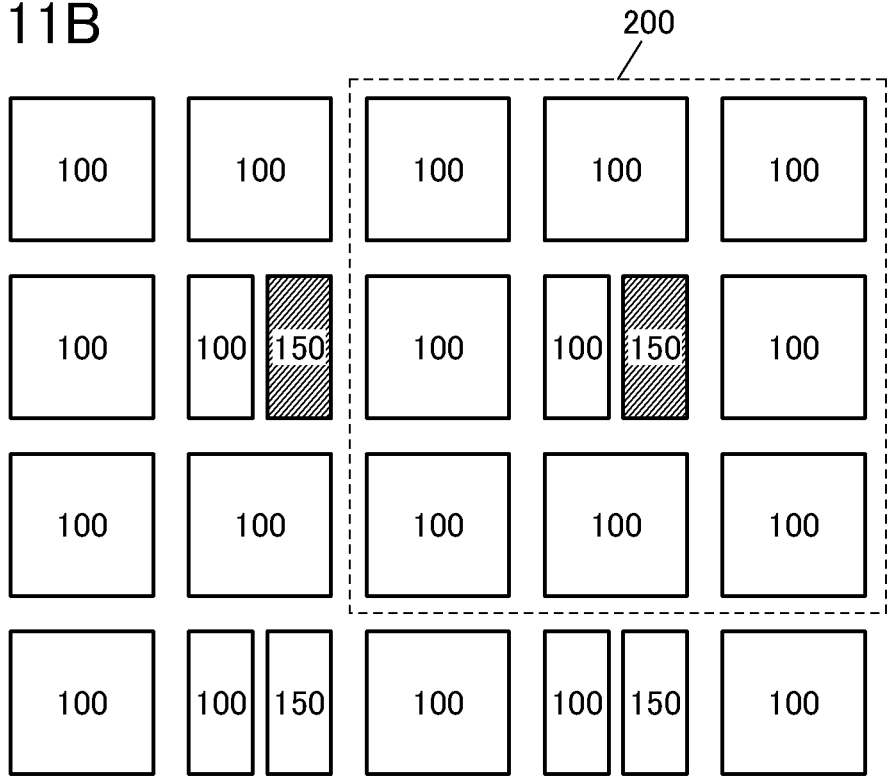

FIG. 11A shows a state in which the product-sum operation result of 3×3 pixels 100 in the pixel block 200 surrounded by a dashed line is written to the memory cell 150. FIG. 11B shows a subsequent operation with a stride of 2: the product-sum operation result of 3×3 pixels 100 in the pixel block 200 shifted in the row direction by two pixels from that in FIG. 11A is written to the memory cell 150.

When the number of strides is thus fixed to 2 or more, the number of memory cells 150 can be smaller than that of pixels 100. Note that any number of strides can be accommodated in the case where the number of memory cells 150 is almost equal to that of pixels 100 as illustrated in FIG. 10A and FIG. 10B.

Figure 12A:
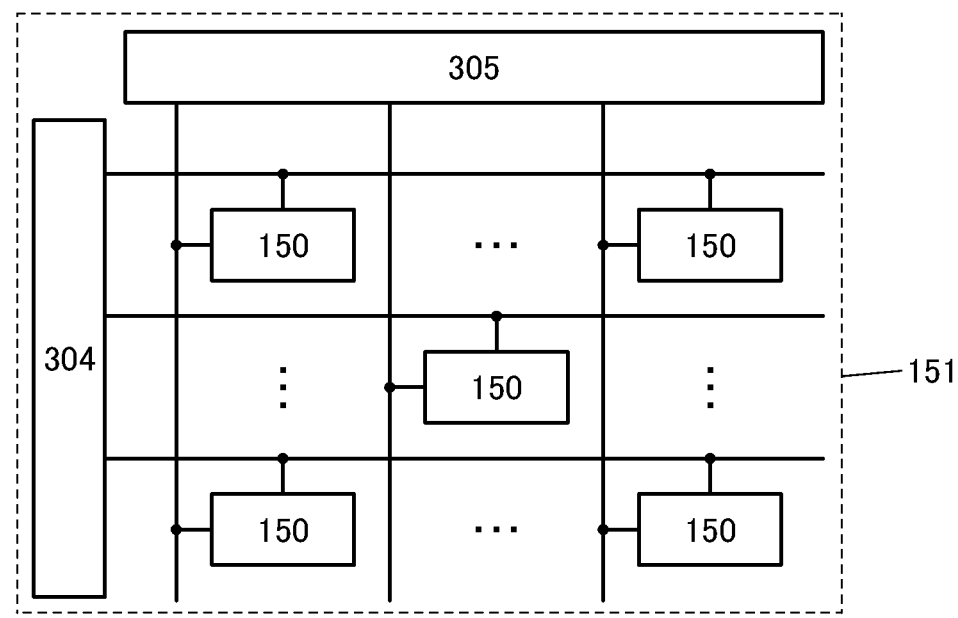
FIG. 12A is a diagram illustrating a memory circuit.

FIG. 12A is a diagram illustrating a connection relation between the memory cells 150, the circuit 304, and the circuit 305. An OS transistor is preferably used as a transistor included in the memory cell 150. Here, a structure including the memory cells 150, the circuit 304, and the circuit 305 is referred to as a memory circuit 151.

The memory circuit 151 includes m memory cells 150 (m is an integer greater than or equal to 1) in a column and n memory cells 150 (n is an integer greater than or equal to 1) in a row, i.e., m×n memory cells 150 in total, which are arranged in a matrix.

Figure 12B:
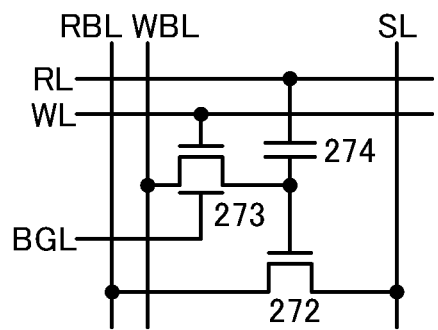
FIG. 12B and FIG. 12C are diagrams each illustrating a memory cell.
Figure 12C:
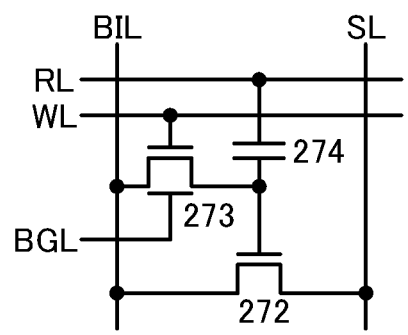

FIG. 12B and FIG. 12C are diagrams illustrating a memory cell 150a and a memory cell 150b that can be used as the memory cells 150. Note that in the following description, a bit line and the like can be connected to the circuit 305 (column driver). A word line and the like can be connected to the circuit 304 (row driver). Although not illustrated here, the bit line and the like are also electrically connected to the circuit 202 and the circuit 203.

For the circuit 304 (row driver) and the circuit 305 (column driver), a decoder or a shift register can be used, for example. Note that a plurality of circuits 304 (row drivers) and a plurality of circuits 305 (column drivers) may be provided.

FIG. 12B illustrates a circuit structure example of the memory cell 150a that is of a gain cell type including two transistors and one capacitor (also referred to as "2Tr1C-type"). The memory cell 150a includes a transistor 273, a transistor 272, and a capacitor 274.

One of a source and a drain of the transistor 273 is connected to one electrode of the capacitor 274. The other of the source and the drain of the transistor 273 is connected to a wiring WBL. A gate of the transistor 273 is connected to a wiring WL. A back gate of the transistor 273 is connected to a wiring BGL. The other electrode of the capacitor 274 is connected to a wiring RL. One of the source and the drain of the transistor 273 is connected a wiring RBL. The other of the source and the drain of the transistor 273 is connected to a wiring SL. A gate of the transistor 272 is connected to the one electrode of the capacitor 274.

The wiring WBL functions as a write bit line. The wiring RBL functions as a read bit line. The wiring WL functions as a word line. The wiring RL functions as a wiring for applying a predetermined potential to the other electrode of the capacitor 274. A reference potential is preferably applied to the wiring RL at the time of data writing and during data retention.

The wiring BGL functions as a wiring for applying a potential to the back gate of the transistor 273. By applying a given potential to the wiring BGL, the threshold voltage of the transistor 273 can be increased or decreased.

Data writing is performed in such a manner that a high-level potential is applied to the wiring WL to turn on the transistor 273 so that the wiring WBL is electrically connected to the one electrode of the capacitor 274. Specifically, when the transistor 273 is in an on state, a potential corresponding to information to be recorded is applied to the wiring WBL, whereby the potential is written to the one electrode of the capacitor 274 and the gate of the transistor 272. After that, a low-level potential is applied to the wiring WL to turn off the transistor 273, whereby the potential of the one electrode of the capacitor 274 and the potential of the gate of the transistor 272 are retained.

Data reading is performed by applying a predetermined potential to the wiring RL and the wiring SL. Current flowing between a source and a drain of the transistor 272 and the potential of the one of the source and the drain of the transistor 273 are determined by the potential of the gate of the transistor 272 and the potential of the other of the source and the drain of the transistor 273; thus, by reading out the potential of the wiring RBL connected to the one of the source and the drain of the transistor 273, the potential retained at the one electrode of the capacitor 274 (or the gate of the transistor 272) can be read out. In other words, information written to this memory cell can be read out from the potential retained at the one electrode of the capacitor 274 (or the gate of the transistor 272). Alternatively, existence or absence of information written to this memory cell can be found.

Alternatively, as illustrated in FIG. 12C, the wiring WBL and the wiring RBL may be combined into one wiring BIL. In the memory cell 150b illustrated in FIG. 12C, one wiring BIL corresponds to the wiring WBL and the wiring RBL in the memory cell 150a, and the other of the source and the drain of the transistor 273 and the one of the source and the drain of the transistor 273 are connected to the wiring BIL. In other words, in the memory cell 150b, one wiring BIL operates as a write bit line and a read bit line.

Note that also in each of the memory cell 150a and the memory cell 150b, an OS transistor is preferably used as the transistor 273. A memory device using a 2Tr1C-type memory cell using an OS transistor as the transistor 273, such as the memory cell 150a or the memory cell 150b, is referred to as a NOSRAM (Non-volatile Oxide Semiconductor Random Access Memory). Note that the circuit structure of the memory cell can be changed as appropriate.

<Circuit 203>

The circuit 203 functions as a pooling circuit. The circuit 203 is electrically connected to the plurality of memory cells 150 to which analog data to be pooled have been written. The circuit 203 can read out the maximum value of the analog data.

Figure 13:
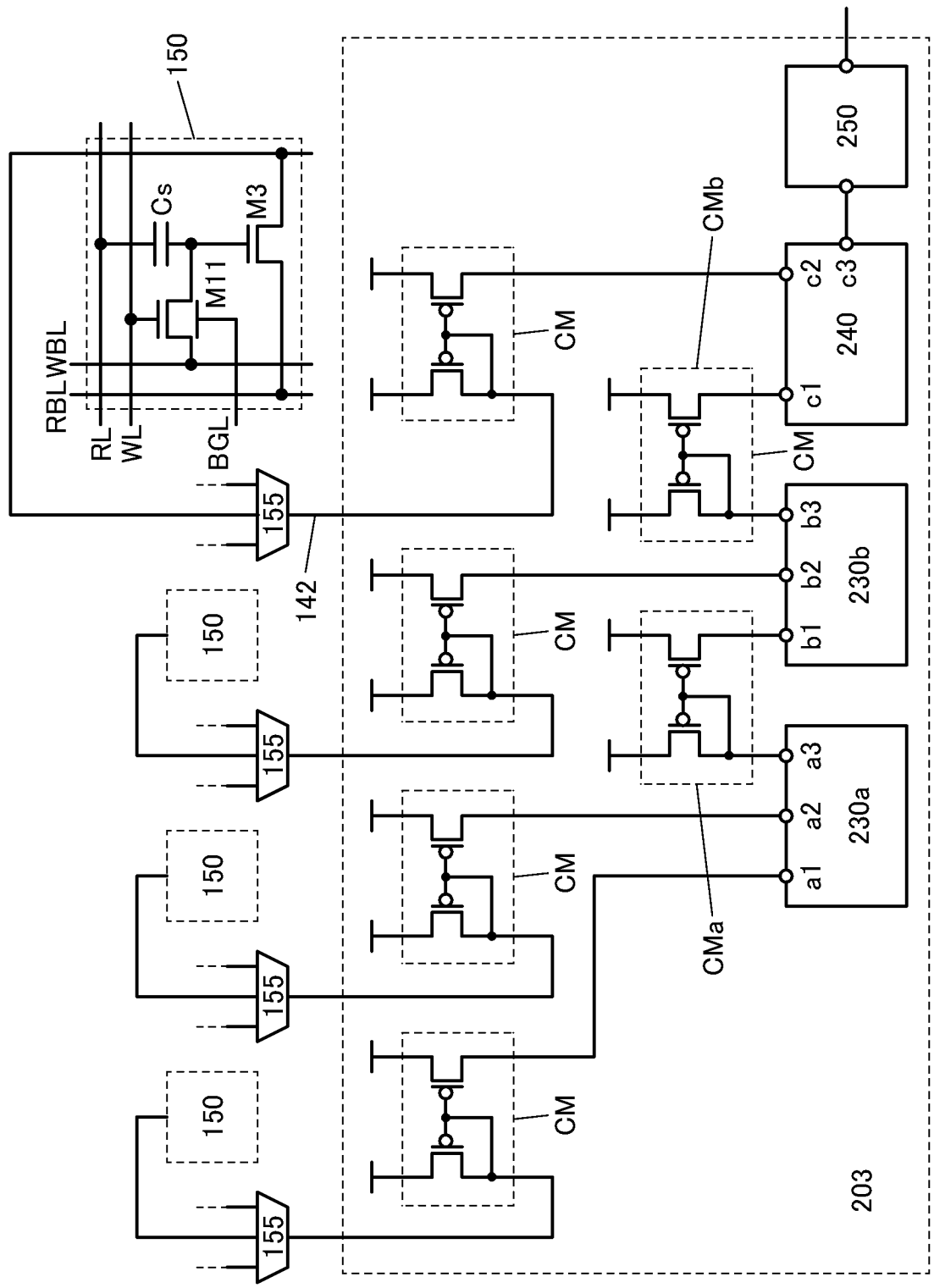
FIG. 13 is a diagram illustrating a circuit 203.

The circuit 203 can have a structure illustrated in FIG. 13, for example. The circuit 203 includes a circuit 230a, a circuit 230b, a circuit 240, a circuit 250, and a plurality of current mirror circuits. With such a structure, two pieces of analog data input to the circuit 230a are compared. Then, the larger one is considered significant and compared with analog data input to the circuit 230b. In a subsequent operation, the larger one is considered significant and compared with analog data input to the circuit 240, and the larger one is considered significant. Then, the output of the circuit 240 is converted into voltage by the circuit 250 and output to the outside (e.g., the circuit 204). That is, the maximum value of the analog data written to four memory cells 150 can be read out. Note that the number of objective memory cells 150 can be changed by changing the circuit structure as appropriate.

Here, the current mirror circuits each include two p-channel transistors, and one of a source and a drain of each of the transistors is electrically connected to a power supply line (a high-potential power supply line). In addition, gates of the two transistors are electrically connected to each other, and the other of the source and the drain of one transistor is electrically connected to the gates. Here, one of the transistors is referred to as an input transistor and the other transistor is referred to as an output transistor.

The circuit 230a includes terminals a1, a2, and a3. The circuit 230b includes terminals b1, b2, and b3. The circuit 240 includes terminals c1, c2, and c3.

The terminal a1 of the circuit 230a is electrically connected to the other of the source and the drain of the output transistor of a current mirror circuit CM. The other of the source and the drain of the input transistor of the current mirror circuit CM is electrically connected to the other of the source and the drain of the transistor 272 included in the memory cell 150 through a selection circuit 155. Thus, the terminal a1 is supplied with a current having the same value as the current flowing through the transistor 272 in the memory cell 150.

The plurality of memory cells 150 are electrically connected to the selection circuit 155, and any one selected memory cell 150 can be electrically connected to the current mirror circuit CM. Note that the selection circuit 155 is not provided in some cases. The selection circuit 155 may be a component of the circuit 203.

The terminal a2 of the circuit 230*a*, the terminal b2 of the circuit 230*b*, and the terminal c2 of the circuit 240 are electrically connected to the respective memory cells 150 through the selection circuit 155 and the current mirror circuit CM.

The terminal a3 of the circuit 230*a* is electrically connected to the other of the source and the drain of the input transistor of a current mirror circuit CMa, and the terminal b1 of the circuit 230*b* is electrically connected to the other of the source and the drain of the output transistor of the current mirror circuit CMa. In this structure, a current flowing to the terminal a3 of the circuit 230*a* has the same value as the larger one of currents input to the terminal a1 and the terminal a2, and a current flowing to the terminal b1 of the circuit 230*b* has the same value as the current flowing to the terminal a3.

The terminal b3 of the circuit 230*b* is electrically connected to the other of the source and the drain of the input transistor of a current mirror circuit CMb, and the terminal c1 of the circuit 240 is electrically connected to the other of the source and the drain of the output transistor of the current mirror circuit CMb. In this structure, a current flowing to the terminal b3 of the circuit 230*b* has the same value as the larger one of currents input to the terminal b1 and the terminal b2, and a current flowing to the terminal c1 of the circuit 240 has the same value as the current flowing to the terminal b3.

In this structure, a current flowing to the terminal c3 of the circuit 240 has the same value as the larger one of currents input to the terminal c1 and the terminal c2. Thus, the terminal c3 of the circuit 240 is a reading terminal of the maximum value of analog data stored in the respective memory cells 150 and input to the terminal a1, the terminal a2, the terminal b2, and the terminal c2.

Figure 14A:
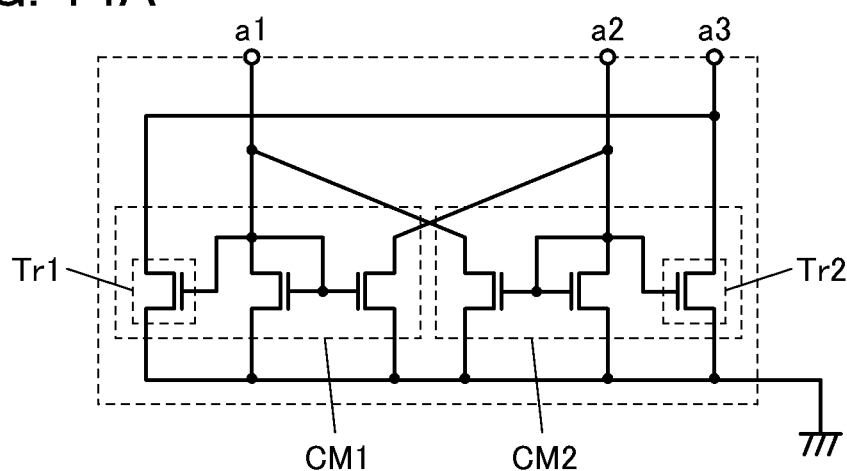

FIG. 14A illustrates a structure example of the circuit 230*a*. Note that the circuit 230*b* can have the same structure when the terminal a1, the terminal a2, and the terminal a3 are replaced with the terminal b1, the terminal b2, and the terminal b3, respectively.

The circuit 230*a* includes a current mirror circuit CM1 and a current mirror circuit CM2. The current mirror circuits CM1 and CM2 each include three n-channel transistors; one of a source and a drain of each transistor is electrically connected to a power supply line (a reference potential line such as GND or a low-potential power supply line). In addition, gates of the three transistors are electrically connected to one another, and the other of the source and the drain of one transistor is electrically connected to the gates. Here, the one transistor is referred to as an input transistor and the other two transistors are referred to as output transistors.

The terminal a1 is electrically connected to the other of the source and the drain of the input transistor in the current mirror circuit CM1, the gates of the three transistors in the current mirror circuit CM1, and the other of the source and the drain of one of the output transistors in the current mirror circuit CM2.

The terminal a2 is electrically connected to the other of the source and the drain of the input transistor in the current mirror circuit CM2, the gates of the three output transistors in the current mirror circuit CM2, and the other of the source and the drain of one of the output transistors in the current mirror circuit CM1.

The terminal a3 is electrically connected to the one of the source and the drain of the other output transistor (transistor Tr') in the current mirror circuit CM1, and the one of the source and the drain of the other output transistor (transistor Tr2) in the current mirror circuit CM2. The other of the source and the drain of the transistor Tr1 and the other of the source and the drain of the transistor Tr2 are electrically connected to the power supply line (the reference potential line such as GND or the low-potential power supply line).

In the above structure, for example, when a current ($I_{a1}$) flowing to the terminal a1 is larger than a current ($I_{a2}$) flowing to the terminal a2 in the initial circuit operation, the resistance of the one output transistor in the current mirror circuit CM1 is lower than the resistance of the input transistor in the current mirror circuit CM2.

Here, the current input to the terminal a2 flows to the one output transistor in the current mirror circuit CM1, leading to the operation in which the potentials of the gates of the transistors in the current mirror circuit CM2 are reduced. Thus, when the current ($I_{a1}$) is sufficiently larger than the current ($I_{a2}$), a current flows to the terminal a3 through the transistor Tr1. That is, a current with the same value as the current ($I_{a1}$) flows to the terminal a3. In contrast, when the current ($I_{a2}$) flowing to the terminal a2 is larger than the current ($I_{a1}$) flowing to the terminal a1, a current with the same value as the current ($I_{a2}$) flows to the terminal a3 through the transistor Tr2.

Figure 14B:
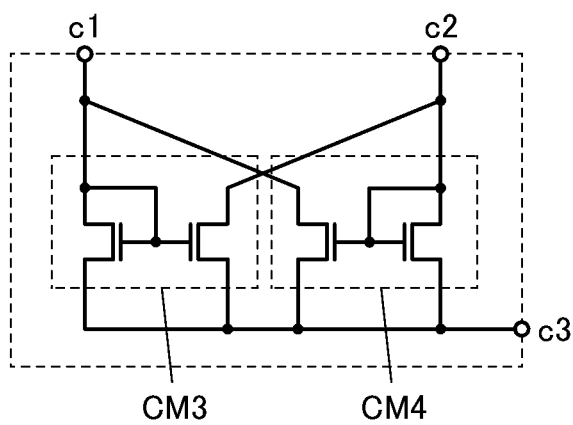
FIG. 14B is a diagram illustrating a circuit 240.

FIG. 14B illustrates a structure example of the circuit 240. The circuit 240 includes a current mirror circuit CM3 and a current mirror circuit CM4. The current mirror circuits CM3 and CM4 each include two n-channel transistors; one of a source and a drain of each transistor is electrically connected to the terminal c3. In addition, gates of the two transistors are electrically connected to each other, and the other of the source and the drain of one transistor is electrically connected to the gates. Here, the one transistor is referred to as an input transistor and the other transistor is referred to as an output transistor.

The terminal c1 is electrically connected to the other of the source and the drain of the input transistor in the current mirror circuit CM3, the gates of the two transistors in the current mirror circuit CM3, and the other of the source and the drain of the output transistor in the current mirror circuit CM4.

The terminal c2 is electrically connected to the other of the source and the drain of the input transistor in the current mirror circuit CM4, the gates of the two transistors in the current mirror circuit CM4, and the other of the source and the drain of the output transistor in the current mirror circuit CM3.

In the above structure, for example, when a current ($I_{c1}$) flowing to the terminal c1 is larger than a current ($I_{c2}$) flowing to the terminal c2 in the initial circuit operation, the resistance of the output transistor in the current mirror circuit CM3 is lower than the resistance of the input transistor in the current mirror circuit CM2.

Here, the current input to the terminal c2 flows to the output transistor in the current mirror circuit CM3, leading to the operation in which the potentials of the gates of the transistors in the current mirror circuit CM4 are reduced. Thus, when the current ($I_{c1}$) is sufficiently larger than the current ($I_{c2}$), the current ($I_{c1}$) flows to the terminal c3 through the input transistor in the current mirror circuit CM3. In contrast, when the current ($I_{c2}$) flowing to the terminal c2 is larger than the current ($I_{c1}$) flowing to the terminal c1, the current ($I_{c2}$) flows to the terminal c3 through the input transistor in the current mirror circuit CM4.

Note that the circuit 240 can also have a structure in which the terminal a1, the terminal a2, and the terminal a3 of the circuit in FIG. 14A are replaced with the terminal c1, the terminal c2, and the terminal c3, respectively.

The current output from the circuit 240 to the circuit 250 can be output to the outside (e.g., the circuit 204) after being subjected to voltage conversion and binary processing or the like as necessary. The circuit 250 may include a circuit for performing an arithmetic operation of an activation function. A comparator circuit can be used as the circuit, for example. The comparator circuit compares input data and a set threshold value and outputs the result as binary data. In other words, the pixel blocks 200 and the circuit 201 to the circuit 203 can operate as some elements in a neural network.

<Circuit 204>

Figure 15A:
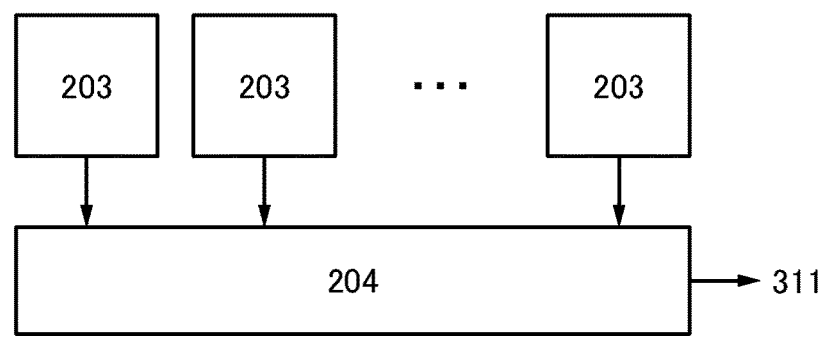
FIG. 15A and FIG. 15B are diagrams each illustrating the circuit 204.

FIG. 15A is a diagram illustrating the circuit 204. Data output from the circuits 203 are sequentially input to the circuit 204. The circuit 204 can have a structure including a latch circuit, a shift register, and the like, for example. With this structure, parallel-serial conversion can be performed and data input in parallel can be output to a wiring 311 as serial data. The connection destination of the wiring 311 is not limited. For example, it can be connected to a neural network, a memory device, a communication device, or the like.

Figure 15B:
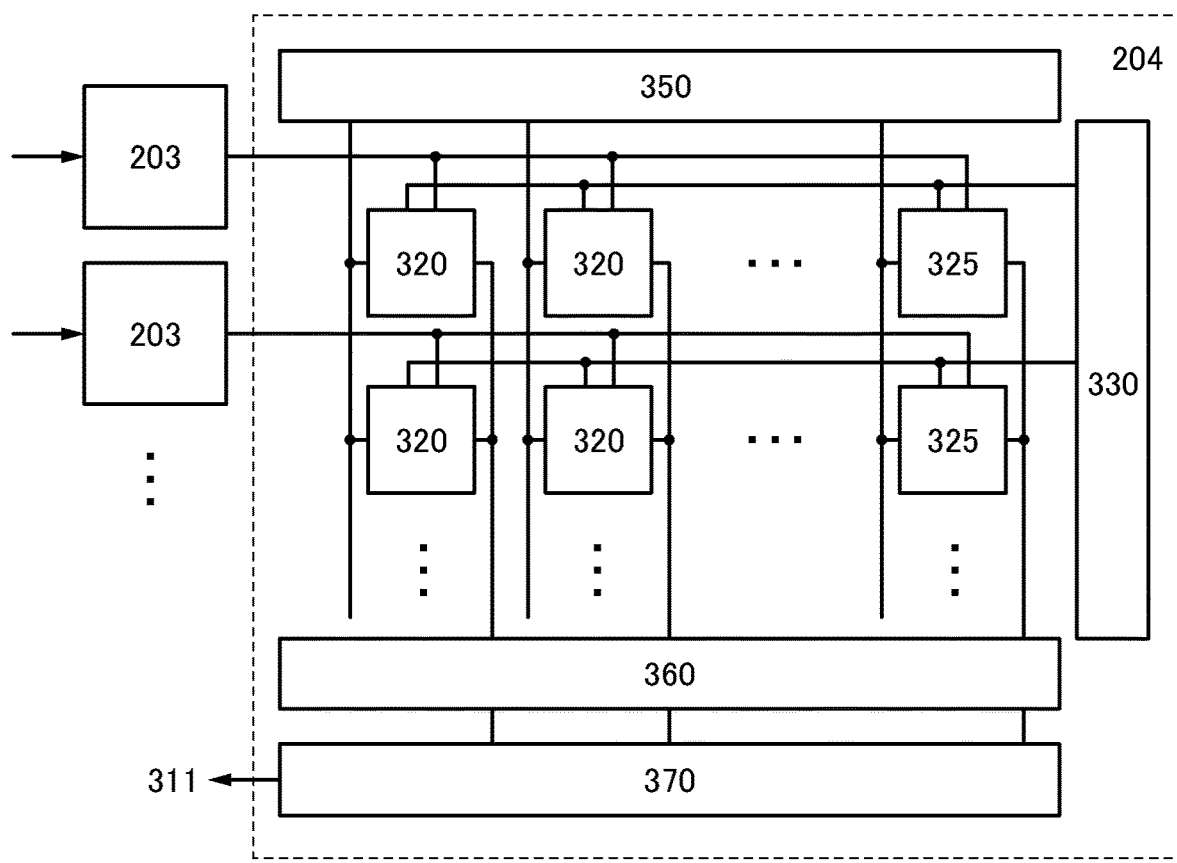

Moreover, as illustrated in FIG. 15B, the circuit 204 may include a neural network. The neural network includes memory cells arranged in a matrix, and each memory cell retains a weight coefficient. Data output from the circuits 203 are input to corresponding memory cells 320, and a product-sum operation can be performed. Note that the number of memory cells illustrated in FIG. 15B is an example, and the number is not limited.

The neural network illustrated in FIG. 15B includes the memory cells 320 and reference memory cells 325 which are arranged in a matrix, a circuit 330, a circuit 350, a circuit 360, and a circuit 370.

Figure 16:
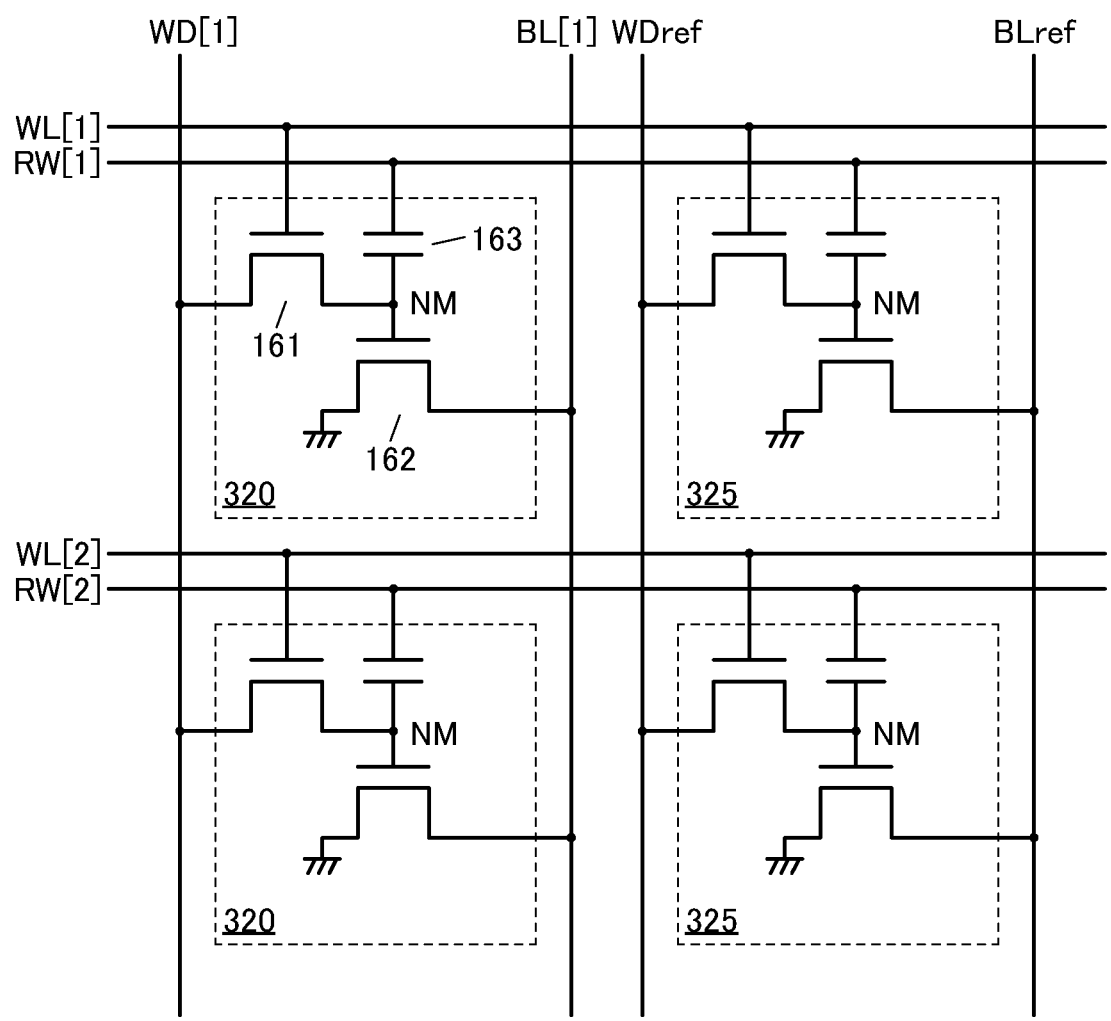
FIG. 16 is a diagram illustrating a memory cell.

FIG. 16 illustrates an example of the memory cells 320 and the reference memory cells 325. The reference memory cells 325 are provided in an arbitrary one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point where the one of the source and the drain of the transistor 161, the gate of the transistor 162, and the one electrode of the capacitor 163 are connected is referred to as a node NM.

A gate of the transistor 161 is electrically connected to the wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to the circuit 330. As the circuit 330, a decoder, a shift register, or the like can be used.

The wiring RW is electrically connected to the circuit 301. Binary data output from the circuit 301 is written to each memory cell. Note that a sequential circuit such as a shift register may be included between the circuit 301 and each memory cell.

The wiring WD and the wiring WDref are electrically connected to the circuit 350. As the circuit 350, a decoder, a shift register, or the like can be used. The circuit 350 may include a D/A converter or an SRAM. The circuit 350 can output a weight coefficient to be written to the node NM.

The wiring BL and the wiring BLref are electrically connected to the circuit 360. The circuit 360 can have a structure equivalent to that of the circuit 201. By the circuit 360, a signal of a product-sum operation result from which offset components are eliminated can be obtained.

The circuit 360 is electrically connected to the circuit 370. The circuit 370 can also be referred to as an activation function circuit. The activation function circuit has a function of performing an arithmetic operation for converting the signal input from the circuit 360 in accordance with a predefined activation function. As the activation function, for example, a sigmoid function, a tanh function, a softmax function, a ReLU function, a threshold function, or the like can be used. The signal converted by the activation function circuit is output to the outside as output data.

Figure 17A:
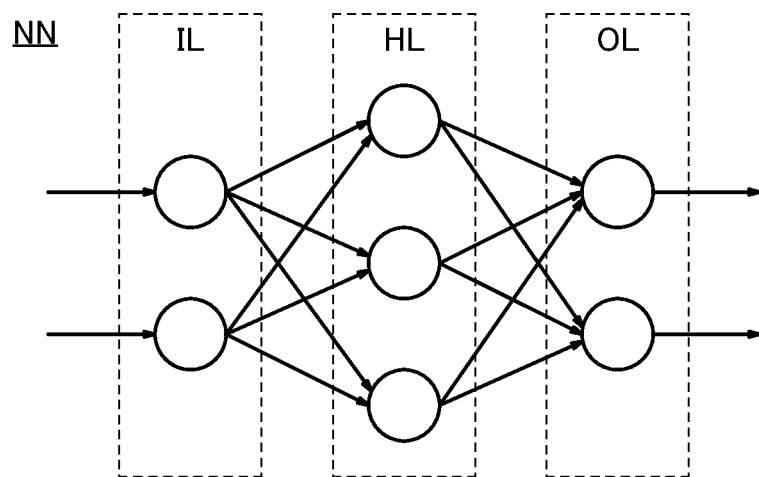
FIG. 17A and FIG. 17B are diagrams each illustrating a structure example of a neural network.

As illustrated in FIG. 17A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. A signal output from a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 17B:
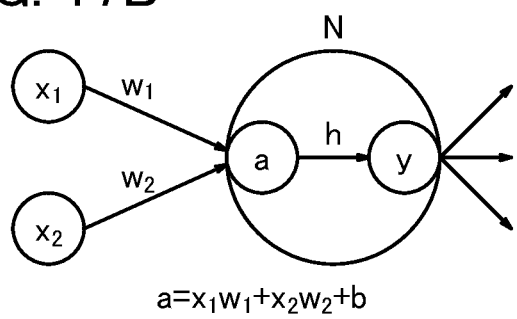

FIG. 17B illustrates an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

This embodiment can be combined with the other embodiments as appropriate.

Embodiment 2

In this embodiment, structure examples and the like of the imaging device of one embodiment of the present invention will be described.

Structure Example

Figure 18A:
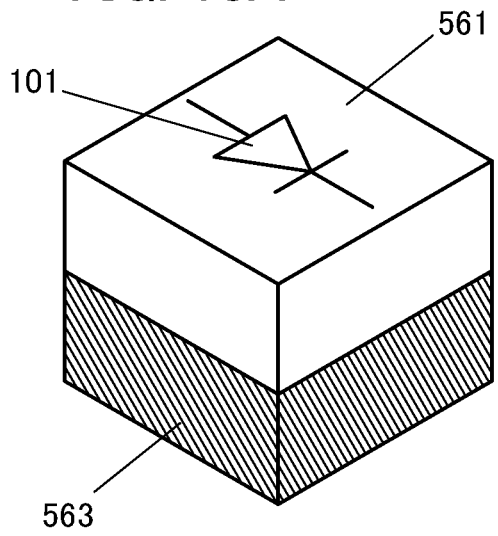
FIG. 18A to FIG. 18D are diagrams each illustrating a pixel structure of an imaging device.

FIG. 18A is a diagram illustrating a structure example of a pixel in an imaging device, and a stacked-layer structure of a layer 561 and a layer 563 can be employed.

Figure 19A:
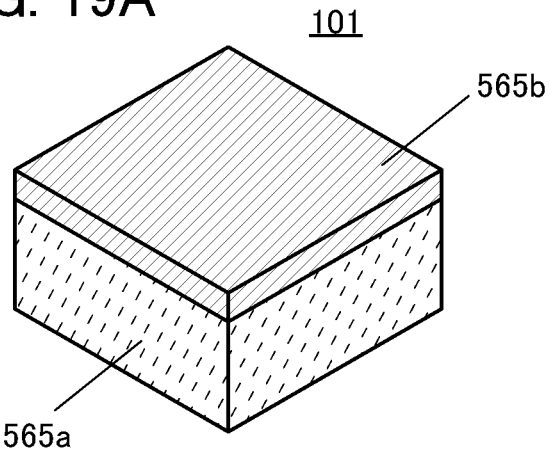
FIG. 19A to FIG. 19C are diagrams each illustrating a structure of a photoelectric conversion device.

The layer 561 includes the photoelectric conversion device 101. The photoelectric conversion device 101 can include a layer 565a and a layer 565b as illustrated in FIG. 19A. Note that a layer may be rephrased as a region, depending on the case.

The photoelectric conversion device 101 illustrated in FIG. 19A is a pn junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn junction photodiode can be formed typically using single crystal silicon. A photodiode in which single crystal silicon is used for a photoelectric conversion layer has relatively wide spectral sensitivity to light from ultraviolet light to near-infrared light and can detect light of various wavelengths by being combined with an optical conversion layer described later.

Alternatively, a compound semiconductor may be used for the photoelectric conversion layer of the pn junction photodiode. As the compound semiconductor, gallium arsenic phosphide (GaAsP), gallium phosphide (GaP), indium gallium arsenide (InGaAs), lead sulfide (PbS), lead selenide (PbSe), indium arsenide (InAs), indium antimonide (InSb), mercury cadmium telluride (HgCdTe), or the like can be used, for example.

The compound semiconductor is preferably a compound semiconductor including a Group 13 element (e.g., aluminum, gallium, or indium) and a Group 15 element (e.g., nitrogen, phosphorus, arsenic, or antimony) (such a compound semiconductor is also referred to as a Group III-V compound semiconductor) or a compound semiconductor including a Group 12 element (e.g., magnesium, zinc, cadmium, or mercury) and a Group 16 element (e.g., oxygen, sulfur, selenium, or tellurium) (such a compound semiconductor is also referred to as a Group II-VI compound semiconductor).

The use of the compound semiconductor, which can change the bandgap depending on the combination of constituent elements or the atomic ratio of the elements, enables formation of a photodiode having sensitivity to a wide wavelength range from ultraviolet light to infrared light.

Note that the wavelength of ultraviolet light can be generally defined as the vicinity of 0.01 μm to the vicinity of 0.38 μm, the wavelength of visible light can be generally defined as the vicinity of 0.38 μm to the vicinity of 0.75 μm, the wavelength of near-infrared light can be generally defined as the vicinity of 0.75 μm to the vicinity of 2.5 μm, the wavelength of mid-infrared light can be generally defined as the vicinity of 2.5 μm to the vicinity of 4 μm, and the wavelength of far-infrared light can be generally defined as the vicinity of 4 μm to the vicinity of 1000 μm.

For example, to form a photodiode having sensitivity to light from ultraviolet light to visible light, GaP or the like can be used for the photoelectric conversion layer. To form a photodiode having sensitivity to light from ultraviolet light to near-infrared light, silicon, GaAsP, or the like described above can be used for the photoelectric conversion layer. Furthermore, to form a photodiode having sensitivity to light from visible light to mid-infrared light, InGaAs or the like can be used for the photoelectric conversion layer. To form a photodiode having sensitivity to light from near-infrared light to mid-infrared light, PbS, InAs, or the like can be used for the photoelectric conversion layer. To form a photodiode having sensitivity to light from mid-infrared light to far-infrared light, PbSe, InSb, HgCdTe, or the like can be used for the photoelectric conversion layer.

Note that the photodiodes using the above-described compound semiconductors may be pin junction photodiodes as well as pn junction photodiodes. Furthermore, the pn junction and the pin junction may have a heterojunction structure without being limited to a homojunction structure.

For example, in the heterojunction, a first compound semiconductor can be used as one layer of the pn junction structure, and a second compound semiconductor that is different from the first compound semiconductor can be used as the other layer. Furthermore, a first compound semiconductor can be used as any one or two layers of the pin junction structure, and a second compound semiconductor that is different from the first compound semiconductor can be used as the other layer(s). Note that one of the first compound semiconductor and the second compound semiconductor may be a semiconductor of a single element such as silicon.

Note that different materials may be used for different pixels in forming photoelectric conversion layers of photodiodes. With this structure, an imaging device which includes any two kinds of pixels or three kinds of pixels among a pixel that detects ultraviolet light, a pixel that detects visible light, a pixel that detects infrared light, and the like can be formed.

Figure 19B:
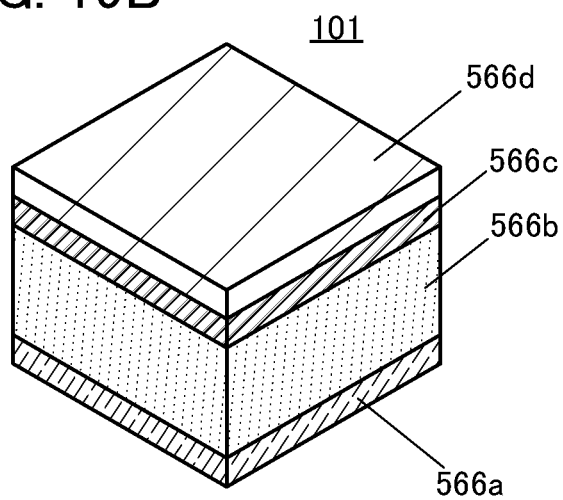

The photoelectric conversion device 101 included in the layer 561 may have a stacked-layer structure of a layer 566a, a layer 566b, a layer 566c, and a layer 566d as illustrated in FIG. 19B. The photoelectric conversion device 101 illustrated in FIG. 19B is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn junction photodiode containing a selenium-based material in a photoelectric conversion layer can be used for the layers 566*b* and 566*c* of the photoelectric conversion portion, for example. A selenium-based material, which is a p-type semiconductor, is preferably used for the layer 566*b*, and gallium oxide or the like, which is an n-type semiconductor, is preferably used for the layer 566*c*.

A photoelectric conversion device containing a selenium-based material has characteristics of high external quantum efficiency with respect to visible light. In the photoelectric conversion device, electrons are greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As the selenium-based material, crystalline selenium (single crystal selenium or polycrystalline selenium) or amorphous selenium can be used. These selenium-based materials have sensitivity to light from ultraviolet light to visible light. Furthermore, a compound of copper, indium, and selenium (CIS), a compound of copper, indium, gallium, and selenium (CIGS), or the like can be used. These compounds have sensitivity to light from ultraviolet light to near-infrared light.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 19C:
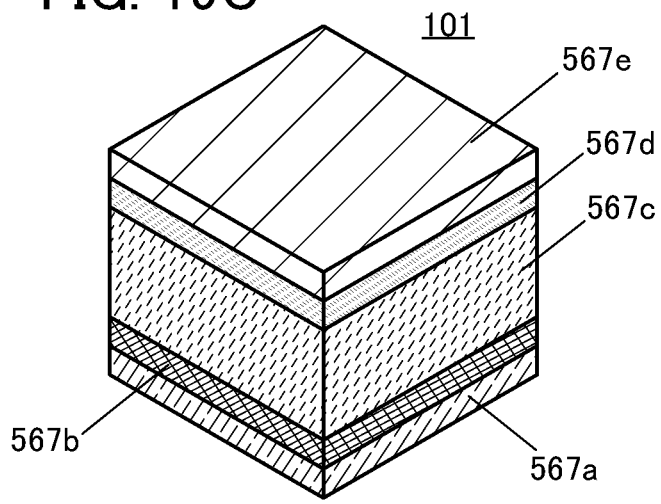

The photoelectric conversion device 101 included in the layer 561 may have a stacked-layer structure of a layer 567*a*, a layer 567*b*, a layer 567*c*, a layer 567*d*, and a layer 567*e* as illustrated in FIG. 19C. The photoelectric conversion device 101 illustrated in FIG. 19C is an example of an organic photoconductive film; the layer 567*a* is a lower electrode, the layer 567*e* is an upper electrode having a light-transmitting property, and the layers 567*b*, 567*c*, and 567*d* correspond to a photoelectric conversion portion.

One of the layers 567*b* and 567*d* in the photoelectric conversion portion can be a hole-transport layer and the other can be an electron-transport layer. The layer 567*c* can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used. There are various organic semiconductors, and a material having sensitivity to light with an intended wavelength is selected as a photoelectric conversion layer.

For the layer 563 illustrated in FIG. 18A, a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, a neural network, a communication circuit, or the like can be formed. Furthermore, a CPU (Central Processing Unit), an MCU (Micro Controller Unit), a memory circuit such as a DRAM (Dynamic Random Access Memory), or the like may be formed. Note that the above-described circuits except the pixel circuit are each referred to as a functional circuit in this embodiment.

For example, some or all of the transistors included in the pixel circuits (the pixels 100) and the functional circuits (the circuits 201, 202, 203, 204, 301, 302, 303, 304, 305, and the like) described in Embodiment 1 can be provided in the layer 563.

Figure 18B:
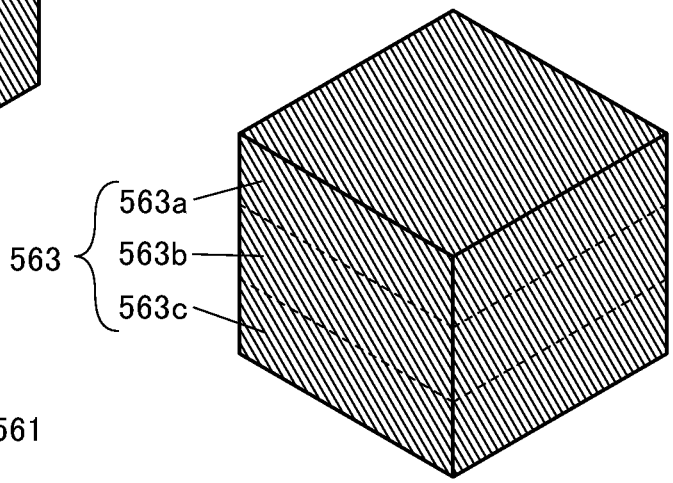

The layer 563 may be a stack of a plurality of layers as illustrated in FIG. 18B. Although FIG. 18B illustrates an example in which the layer 563 is composed of three layers 563*a*, 563*b*, and 563*c*, a two-layer structure may be employed as well. Alternatively, the layer 563 may be a stack of four or more layers. These layers can be stacked by a bonding process, for example. With this structure, the pixel circuits and the functional circuits can be dispersed in a plurality of layers; thus, the pixel circuits and the functional circuits can be provided to overlap with each other, which enables a small imaging device with a high function to be manufactured.

Figure 18C:
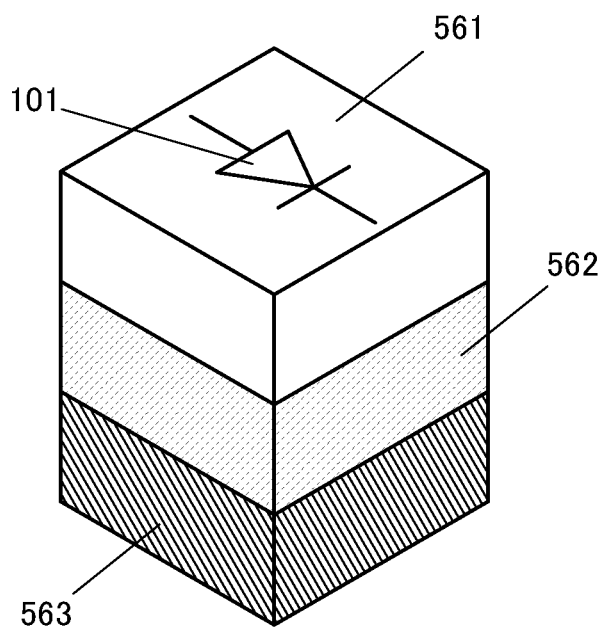

Furthermore, the pixel may have a stacked-layer structure of the layer 561, a layer 562, and the layer 563 as illustrated in FIG. 18C.

The layer 562 can include OS transistors. One or more of the functional circuits described above may be formed using OS transistors. Alternatively, one or more of the functional circuits may be formed using Si transistors included in the layer 563 and the OS transistors included in the layer 562. Alternatively, the layer 563 may be a support substrate such as a glass substrate, and the pixel circuits and the functional circuits may be formed using the OS transistors included in the layer 562.

A normally-off CPU (also referred to as "NoffCPU (registered trademark)") can be formed using an OS transistor and a Si transistor, for example. Note that the NoffCPU is an integrated circuit including a normally-off transistor, which is in a non-conduction state (also referred to as an off state) even when a gate voltage is 0 V.

In the NoffCPU, power supply to a circuit that does not need to operate can be stopped so that the circuit can be brought into a standby state. The circuit brought into the standby state because of the stop of power supply does not consume power. Thus, the power usage of the NoffCPU can be minimized. Moreover, the NoffCPU can retain data necessary for operation, such as setting conditions, for a long time even when power supply is stopped. The return from the standby state requires only restart of power supply to the circuit and does not require rewriting of setting conditions or the like. In other words, a high-speed return from the standby state is possible. As described here, the NoffCPU can have a reduced power consumption without a significant decrease in operation speed.

Figure 18D:
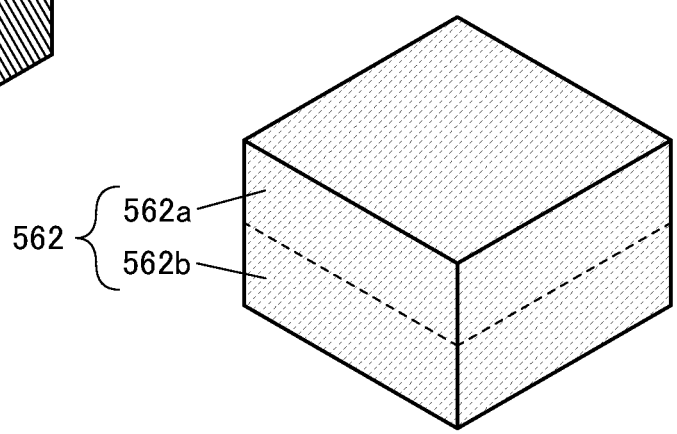

The layer 562 may be a stack of a plurality of layers as illustrated in FIG. 18D. Although FIG. 18D illustrates an example in which the layer 562 is composed of two layers 562*a* and 562*b*, a stack of three or more layers may be employed as well. These layers can be formed to be stacked over the layer 563, for example. Alternatively, the layers formed over the layer 563 and the layers formed over the layer 561 may be bonded to each other.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium; and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at a high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more selected from metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with a low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{16}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), and a mosaic pattern is formed. Then, $InO_{X1}$ or $In_{X2}Zn_{Y2}O_{Z2}$ forming the mosaic pattern is evenly distributed in the film (this composition is hereinafter also referred to as a cloud-like composition).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{x2}Zn_{y2}O_{Z2}$ or $InO_{X1}$ as a main component is a region whose conductivity is higher than that of a region including $GaO_{X3}$ or the like as a main component. In other words, when carriers flow through the regions including $In_{x2}Zn_{y2}O_{Z2}$ or $InO_{X1}$ as a main component, the conductivity of an oxide semiconductor is exhibited. Accordingly, when the regions including $In_{x2}Zn_{y2}O_{Z2}$ or $InO_{X1}$ as a main component are distributed in an oxide semiconductor like a cloud, high field-effect mobility ($\mu$) can be achieved.

By contrast, a region including $GaO_{X3}$ or the like as a main component is a region whose insulating property is higher than that of a region including $In_{x2}Zn_{y2}O_{Z2}$ or $InO_{X1}$ as a main component. In other words, when the regions including $GaO_{X3}$ or the like as a main component are distributed in an oxide semiconductor, a leakage current can be suppressed and favorable switching operation can be achieved.

Accordingly, when the CAC-OS is used for a semiconductor element, the insulating property derived from $GaO_{X3}$ or the like and the conductivity derived from $In_{x2}Zn_{y2}O_{Z2}$ or $InO_{X1}$ complement each other, whereby a high on-state current (Ion) and high field-effect mobility ($\mu$) can be achieved.

A semiconductor element using the CAC-OS has high reliability. Thus, the CAC-OS is suitably used as a constituent material of a variety of semiconductor devices.

<Stacked-Layer Structure 1>

Next, a stacked-layer structure of the imaging device will be described with reference to a cross-sectional view. Note that components such as insulating layers and conductive layers are described below as examples, and other components may be further included. Alternatively, some components described below may be omitted. A stacked-layer structure described below can be formed by a bonding process, a polishing process, or the like as needed.

Figure 20:
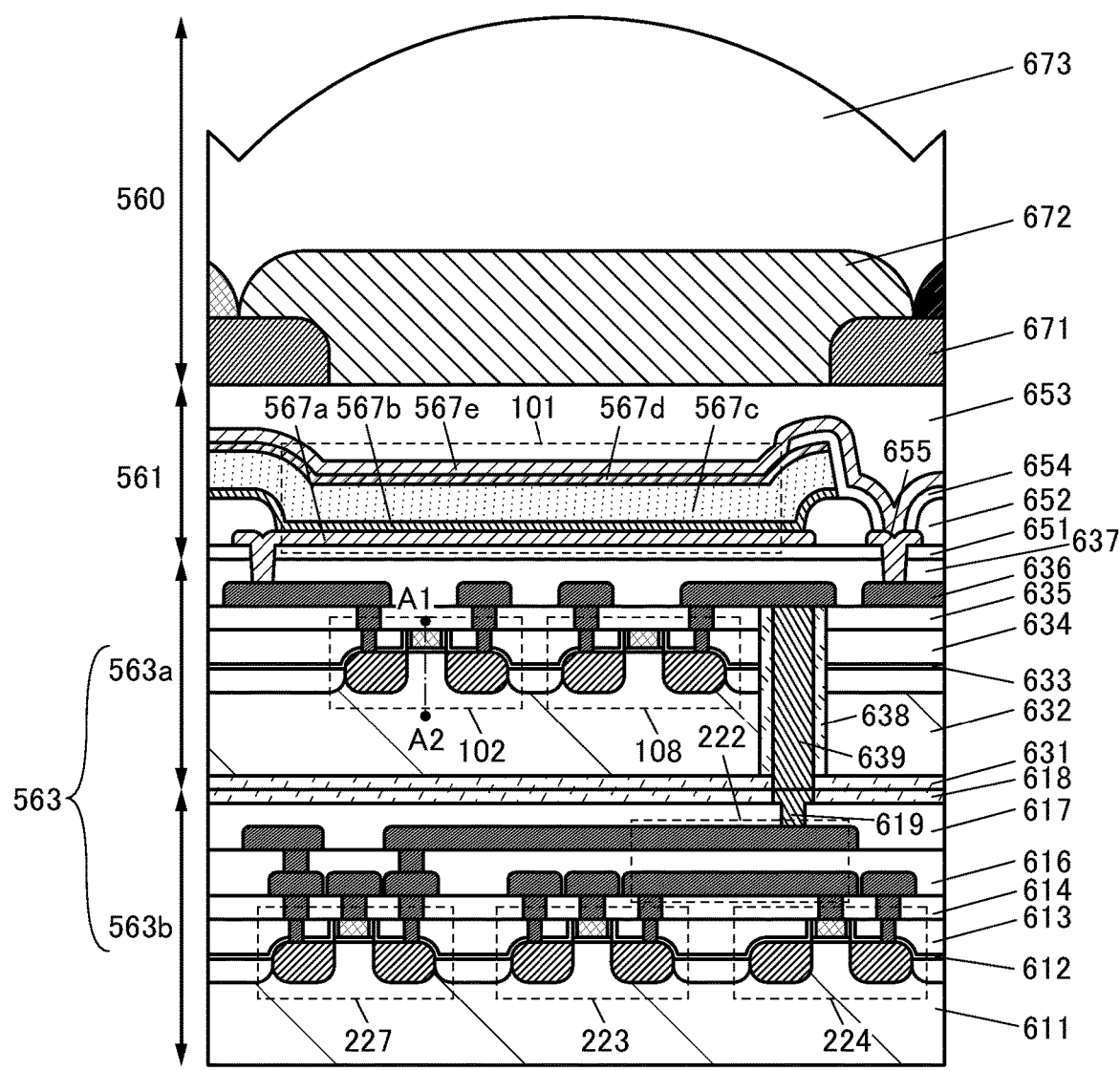
FIG. 20 is a cross-sectional view illustrating a pixel.

FIG. 20 is an example of a cross-sectional view of a stack including a layer 560, the layer 561, and the layer 563 and including a bonding surface between the layer 563a and the layer 563b of the layer 563.

<Layer 563b>

The layer 563b can include a functional circuit provided on a silicon substrate 611. Here, the transistor 227, the transistor 223, the transistor 224, and the capacitor 222, each of which is included in the circuit 201, are illustrated as part of the functional circuit.

The silicon substrate 611 and insulating layers 612, 613, 614, 616, 617, and 618 are provided in the layer 563b. The insulating layer 612 functions as a protective film. The insulating layers 613, 613, 616, and 617 function as interlayer insulating films and planarization films. The insulating layer 618 and a conductive layer 619 function as bonding layers. The conductive layer 619 is electrically connected to the gate of the transistor 105.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. The bonding layers will be described later.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 563a>

The layer 563a includes the components of the pixel 100. The layer 563a may further include the components of the functional circuit. Here, the transistor 102 and the transistor 108 are illustrated as some of the components of the pixel 100. In the cross-sectional view illustrated in FIG. 20, electrical connection between the transistors is not illustrated.

A silicon substrate 632 and insulating layers 631, 633, 634, 635, 637, and 638 are provided in the layer 563a. In addition, conductive layers 636 and 639 are provided.

The insulating layer 631 and the conductive layer 639 function as bonding layers. The insulating layers 634, 635, and 637 function as interlayer insulating films and planarization films. The insulating layer 633 functions as a protective film. The insulating layer 638 has a function of insulating the silicon substrate 632 from the conductive layer 639. The insulating layer 638 can be formed using a material similar to that for another insulating layer. The insulating layer 638 may be formed using the same material as that for the insulating layer 631.

The conductive layer 639 is electrically connected to the other of the source and the drain of the transistor 105 and the conductive layer 619. The conductive layer 636 is electrically connected to the wiring 114 (see FIG. 6).

Figure 21A:
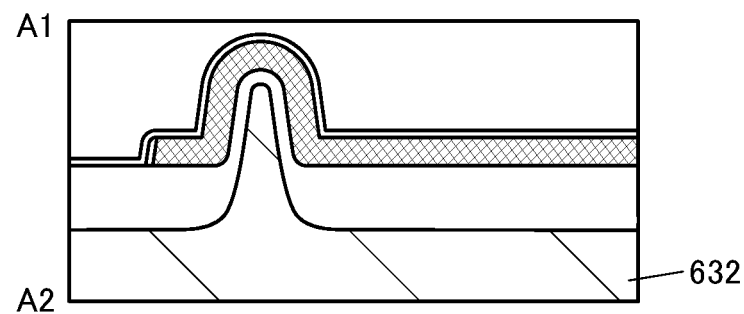
FIG. 21A to FIG. 21C are diagrams each illustrating a Si transistor.
Figure 21B:
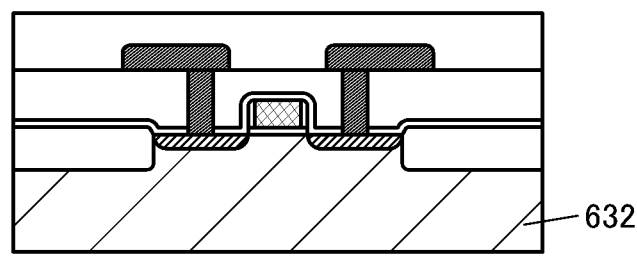

Si transistors illustrated in FIG. 20 are fin-type transistors including channel formation regions in the silicon substrates (the silicon substrates 611 and 632). FIG. 21A illustrates a cross section (a cross section along A1-A2 in the layer 563a in FIG. 20) in the channel width direction. Note that the Si transistors may each be a planar-type transistor as illustrated in FIG. 21B.

Figure 21C:
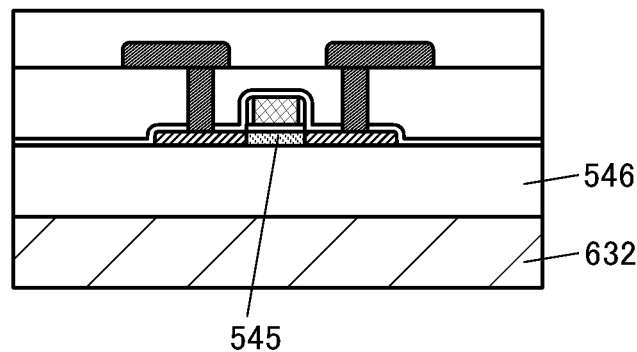

Alternatively, as illustrated in FIG. 21C, a transistor including a semiconductor layer 545 of a silicon thin film may be used. The semiconductor layer 545 can be single crystal silicon (SOI (Silicon on Insulator)) formed on an insulating layer 546 on the silicon substrate 611, for example.

<Layer 561>

The layer 561 includes the photoelectric conversion device 101. The photoelectric conversion device 101 can be formed over the layer 563a. FIG. 20 illustrates the photoelectric conversion device 101 having a structure in which the organic photoconductive film illustrated in FIG. 19C is used as the photoelectric conversion layer. Here, the layer 567a is a cathode, and the layer 567e is an anode.

Insulating layers 651, 652, 653, and 654 and a conductive layer 655 are provided in the layer 561.

The insulating layers 651, 653, and 654 function as interlayer insulating films and planarization films. The insulating layer 654 is provided to cover an end portion of the photoelectric conversion device 101, and has a function of preventing a short circuit between the layer 567e and the layer 567a. The insulating layer 652 functions as an element isolation layer. An organic insulating film or the like is preferably used as the element isolation layer.

The layer 567a corresponding to the cathode of the photoelectric conversion device 101 is electrically connected to one of the source and the drain of the transistor 102 included in the layer 563*a*. The layer 567*e* corresponding to the anode of the photoelectric conversion device 101 is electrically connected to the conductive layer 636 included in the layer 563*a* through the conductive layer 655.

<Layer 560>

The layer 560 is formed over the layer 561. The layer 560 includes a light-blocking layer 671, an optical conversion layer 672, and a microlens array 673.

The light-blocking layer 671 can suppress entry of light into an adjacent pixel. As the light-blocking layer 671, a metal layer of aluminum, tungsten, or the like can be used. The metal layer and a dielectric film functioning as an anti-reflection film may be stacked.

Figure 30A:
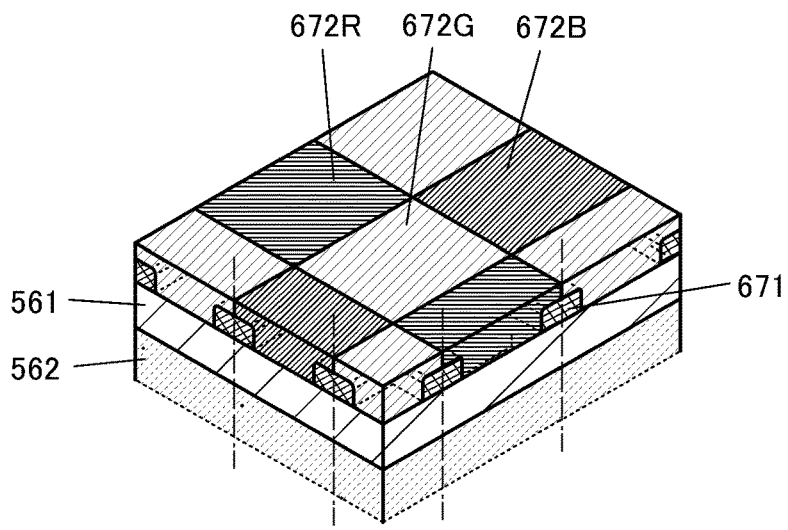
FIG. 30A to FIG. 30C are perspective views (cross-sectional views) each illustrating pixels.

When the photoelectric conversion device 101 has sensitivity to visible light, a color filter can be used as the optical conversion layer 672. When colors of R (red), G (green), B (blue), Y (yellow), C (cyan), M (magenta), and the like are assigned to the color filters of different pixels, a color image can be obtained. For example, as illustrated in a perspective view (including a cross section) of FIG. 30A, a color filter 672R (red), a color filter 672G (green), and a color filter 672B (blue) can be assigned to different pixels.

When a wavelength cut filter is used as the optical conversion layer 672 in the appropriate combination of the photoelectric conversion device 101 and the optical conversion layer 672, the imaging device can capture images in various wavelength regions.

For example, when an infrared filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When an ultraviolet filter that blocks light having a wavelength longer than or equal to that of visible light is used as the optical conversion layer 672, an ultraviolet imaging device can be obtained.

Figure 30B:
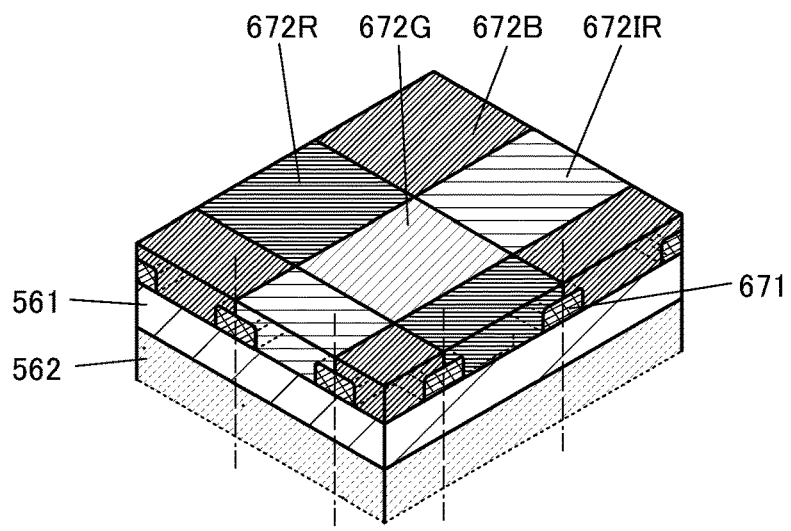

Note that different optical conversion layers may be provided in one imaging device. For example, as illustrated in FIG. 30B, the color filter 672R (red), the color filter 672G (green), the color filter 672B (blue), and an infrared filter 672IR can be assigned to different pixels. With this structure, a visible light image and an infrared light image can be obtained simultaneously.

Figure 30C:
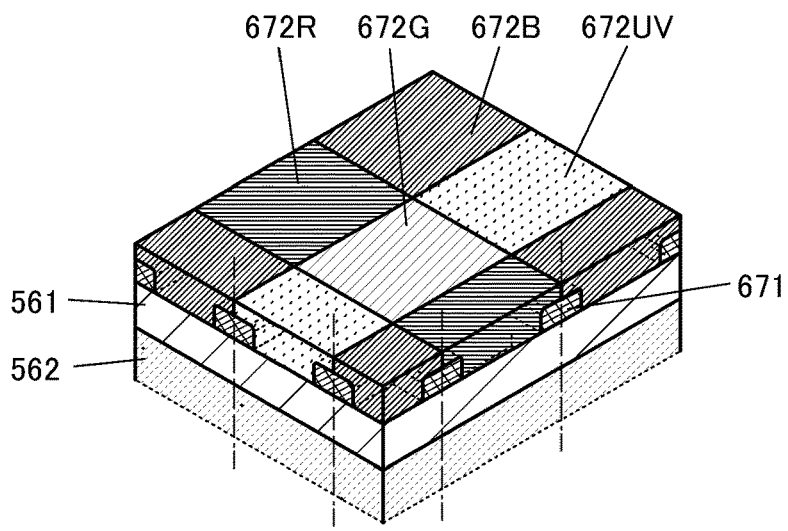

Alternatively, as illustrated in FIG. 30C, the color filter 672R (red), the color filter 672G (green), the color filter 672B (blue), and an ultraviolet filter 672UV can be assigned to different pixels. With this structure, a visible light image and an ultraviolet light image can be obtained simultaneously.

Furthermore, when a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, $ZnO$, or the like is dispersed can be used.

Image capturing with the use of infrared light or ultraviolet light can provide the imaging device with an inspection function, a security function, a sensor function, or the like. For example, by image capturing with the use of infrared light, non-destructive inspection of products, sorting of agricultural products (e.g., sugar content meter function), vein authentication, medical inspection, or the like can be performed. Furthermore, by image capturing with the use of ultraviolet light, detection of ultraviolet light released from a light source or a frame can be performed, whereby a light source, a heat source, a production device, or the like can be controlled, for example.

The microlens array 673 is provided over the optical conversion layer 672. Light passing through an individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like having a high light transmitting property with respect to light with an intended wavelength.

<Bonding>

Next, bonding of the layer 563*b* and the layer 563*a* will be described.

The insulating layer 618 and the conductive layer 619 are provided in the layer 563*b*. The conductive layer 619 includes a region embedded in the insulating layer 618. Furthermore, the surfaces of the insulating layer 618 and the conductive layer 619 are planarized to be level with each other.

The insulating layer 631 and the conductive layer 639 are provided in the layer 563*a*. The conductive layer 639 includes a region embedded in the insulating layer 631. Furthermore, the surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layers 619 and 639, Cu, Al, Sn, Zn, W, Ag, Pt, or Au can be used, for example. Preferably, Cu, Al, W, or Au is used for easy bonding. In addition, for the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding can be performed at the boundary between the layer 563*b* and the layer 563*a*.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

Through the above bonding, the electrical connection between the conductive layer 619 and the conductive layer 639 can be obtained. Moreover, the connection between the insulating layer 618 and the insulating layer 631 with mechanical strength can be obtained.

For bonding metal layers to each other, a surface activated bonding method in which an oxide film, a layer adsorbing impurities, and the like on the surface are removed by sputtering treatment or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 563*b* and the layer 563*a* are bonded to each other, the insulating layers and the metal layers coexist on their bonding surfaces; therefore, the surface activated bonding method and the hydrophilic bonding method are performed in combination, for example.

For example, it is possible to use a method in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the circuit included in the layer 563*b* to be electrically connected to the components of the pixel 100 included in the layer 563*a*.

Modification Example of Stacked-Layer Structure 1

Figure 22:
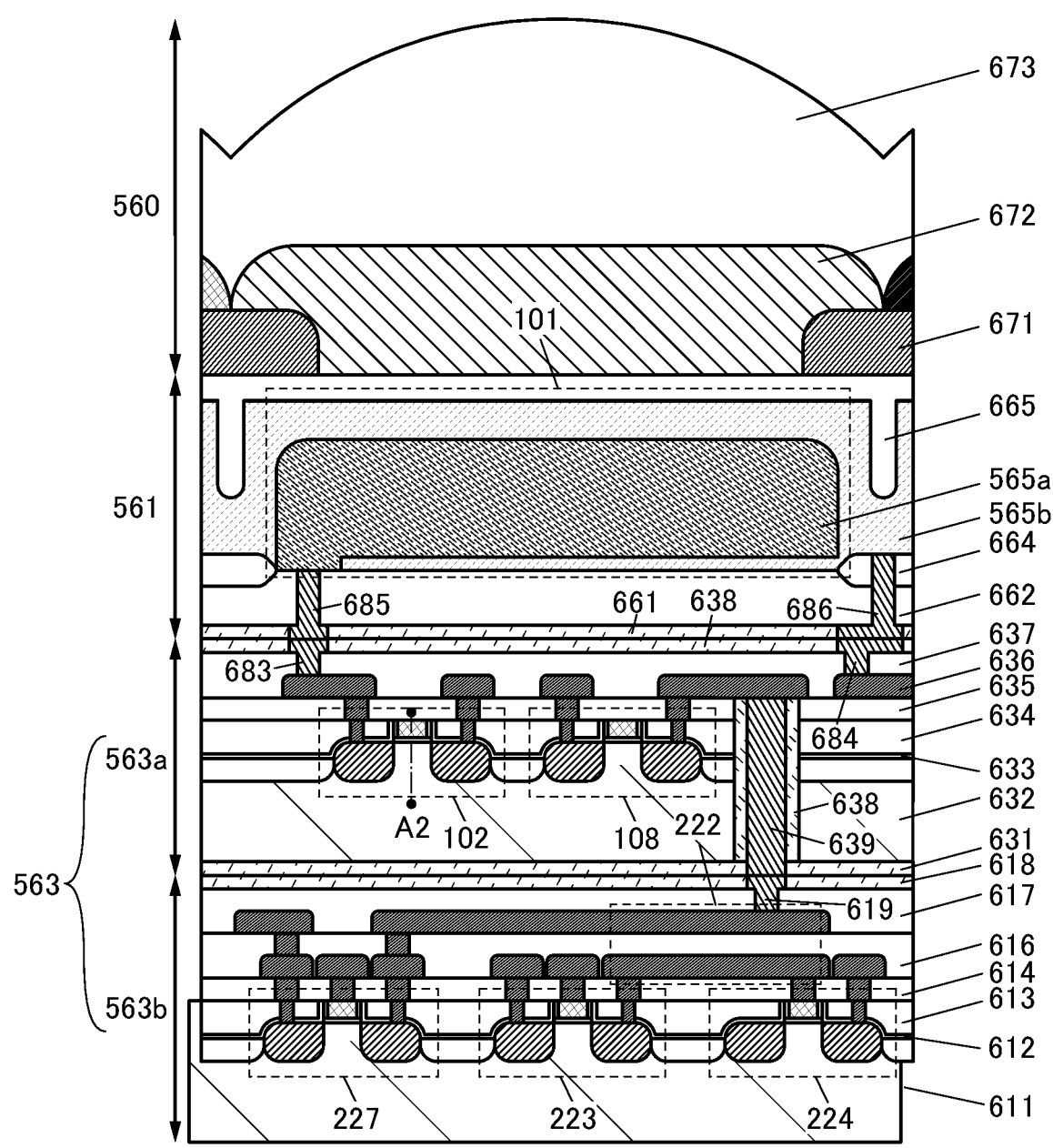
FIG. 22 is a cross-sectional view illustrating a pixel.

FIG. 22 is a modification example of the stacked-layer structure illustrated in FIG. 20 and differs from FIG. 20 in the structure of the photoelectric conversion device 101 included in the layer 561 and part of the structure of the layer 563*a*; a bonding surface is also included between the layer 561 and the layer 563*a*.

The layer 561 includes the photoelectric conversion device 101, insulating layers 661, 662, 664, and 665, and conductive layers 685 and 686.

The photoelectric conversion device 101 is a pn junction photodiode and includes the layer 565*b* corresponding to a p-type region and the layer 565*a* corresponding to an n-type region. Note that an example where a pn junction photodiode is formed over a silicon substrate is described here. The photoelectric conversion device 101 is a pinned photodiode, which can suppress a dark current and reduce noise with the thin p-type region (part of the layer 565*b*) provided on the surface side (current extraction side) of the layer 565*a*.

The insulating layer 661 and the conductive layers 685 and 686 function as bonding layers. The insulating layer 662 functions as an interlayer insulating film and a planarization film. The insulating layer 664 functions as an element isolation layer.

The silicon substrate is provided with a groove that separates pixels, and the insulating layer 665 is provided on the top surface of the silicon substrate and in the groove. The insulating layer 665 can suppress leakage of carriers generated in the photoelectric conversion device 101 to an adjacent pixel. The insulating layer 665 also has a function of suppressing entry of stray light. Therefore, color mixture can be suppressed with the insulating layer 665. Note that an anti-reflection film may be provided between the top surface of the silicon substrate and the insulating layer 665.

The insulating layer 664 can be formed by a LOCOS (LOCal Oxidation of Silicon) method. Alternatively, an STI (Shallow Trench Isolation) method or the like may be used to form the insulating layer 664. As the insulating layer 665, for example, an inorganic insulating film of silicon oxide, silicon nitride, or the like or an organic insulating film of polyimide, acrylic, or the like can be used. The insulating layer 665 may have a multilayer structure. A space may be provided in part of the insulating layer 665. The space may contain a gas such as the air or an inert gas. Moreover, the space may be in a reduced pressure state.

The layer 565*a* (corresponding to the n-type region and the cathode) of the photoelectric conversion device 101 is electrically connected to the conductive layer 685. The layer 565*b* (corresponding to the p-type region and the anode) is electrically connected to the conductive layer 686. The conductive layers 685 and 686 each include a region embedded in the insulating layer 661. Furthermore, the surfaces of the insulating layer 661 and the conductive layers 685 and 686 are planarized to be level with each other.

In the layer 563*a*, the insulating layer 638 is formed over the insulating layer 637. In addition, a conductive layer 683 electrically connected to one of the source and the drain of the transistor 102 and a conductive layer 684 electrically connected to the conductive layer 636 are formed.

The insulating layer 638 and the conductive layers 683 and 684 function as bonding layers. The conductive layers 683 and 684 each include a region embedded in the insulating layer 638. Furthermore, the surfaces of the insulating layer 638 and the conductive layers 683 and 684 are planarized to be level with each other.

Here, the conductive layers 683, 684, 685, and 686 are the same bonding layers as the above-described conductive layers 619 and 639. The insulating layers 638 and 661 are the same bonding layers as the above-described insulating layers 618 and 631.

Thus, when the conductive layer 683 and the conductive layer 685 are bonded to each other, the layer 565*a* (corresponding to the n-type region and the cathode) of the photoelectric conversion device 101 can be electrically connected to the one of the source and the drain of the transistor 102. In addition, when the conductive layer 684 and the conductive layer 686 are bonded to each other, the layer 565*b* (corresponding to the p-type region and the anode) of the photoelectric conversion device 101 can be electrically connected to the wiring 114 (see FIG. 6). When the insulating layer 638 and the insulating layer 661 are bonded to each other, electrical bonding and mechanical bonding of the layer 561 and the layer 563*a* can be performed.

Figure 23:
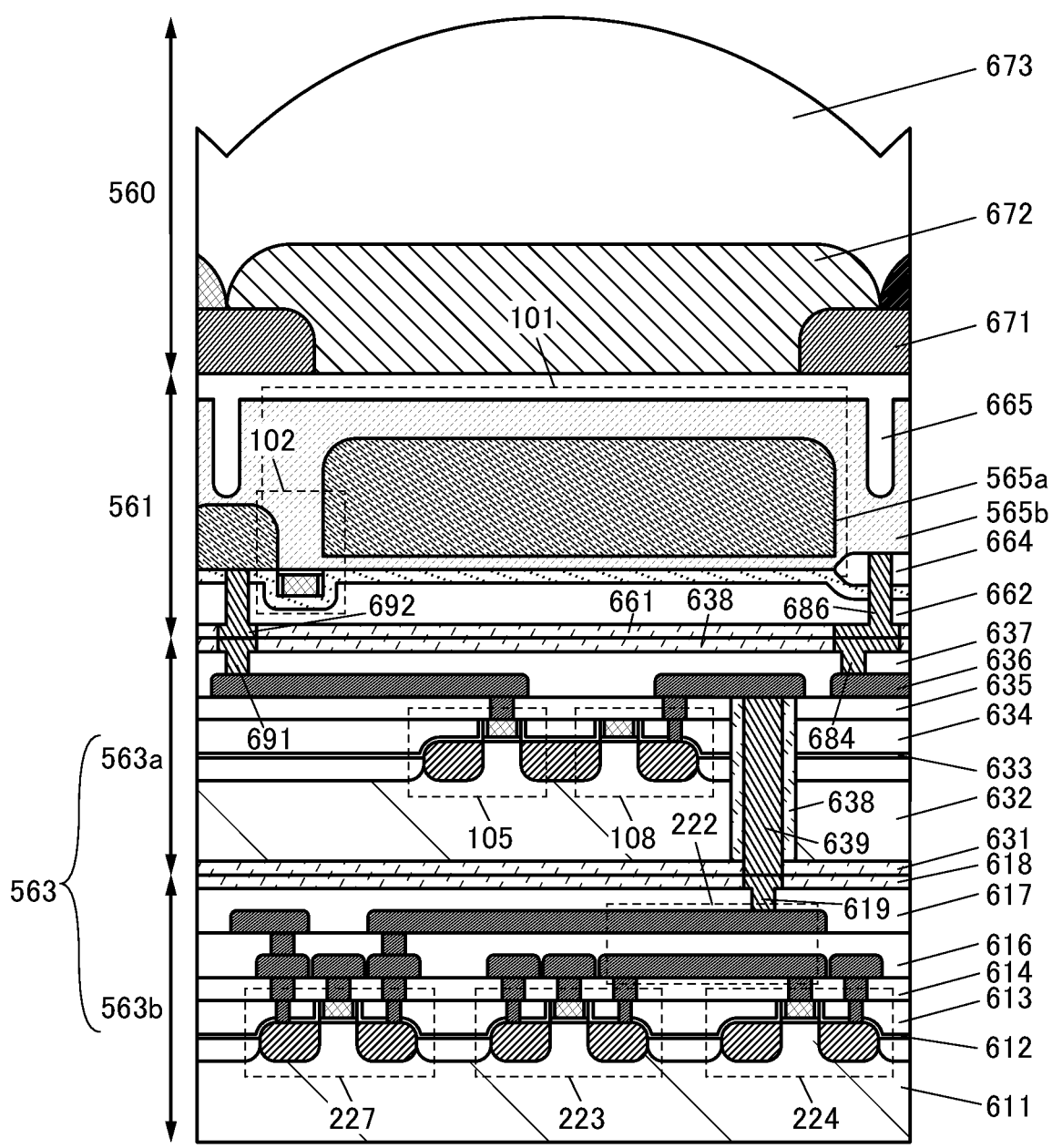
FIG. 23 is a cross-sectional view illustrating a pixel.

FIG. 23 illustrates a modification example different from the above, and is a structure in which the transistor 102 is provided in the layer 561. In this structure, the one of the source and the drain of the transistor 102 is directly connected to the photoelectric conversion device 101 and the other of the source and the drain functions as the node N. With this structure, electric charge accumulated in the photoelectric conversion device 101 can be completely transferred, so that an imaging device with little noise can be achieved.

Here, the other of the source and the drain of the transistor 102 included in the layer 561 is electrically connected to a conductive layer 692. The gate of the transistor 105 included in the layer 563 is electrically connected to a conductive layer 691. The conductive layers 691 and 692 are the same bonding layers as the above-described conductive layers 619 and 639.

<Stacked-Layer Structure 2>

Figure 24:
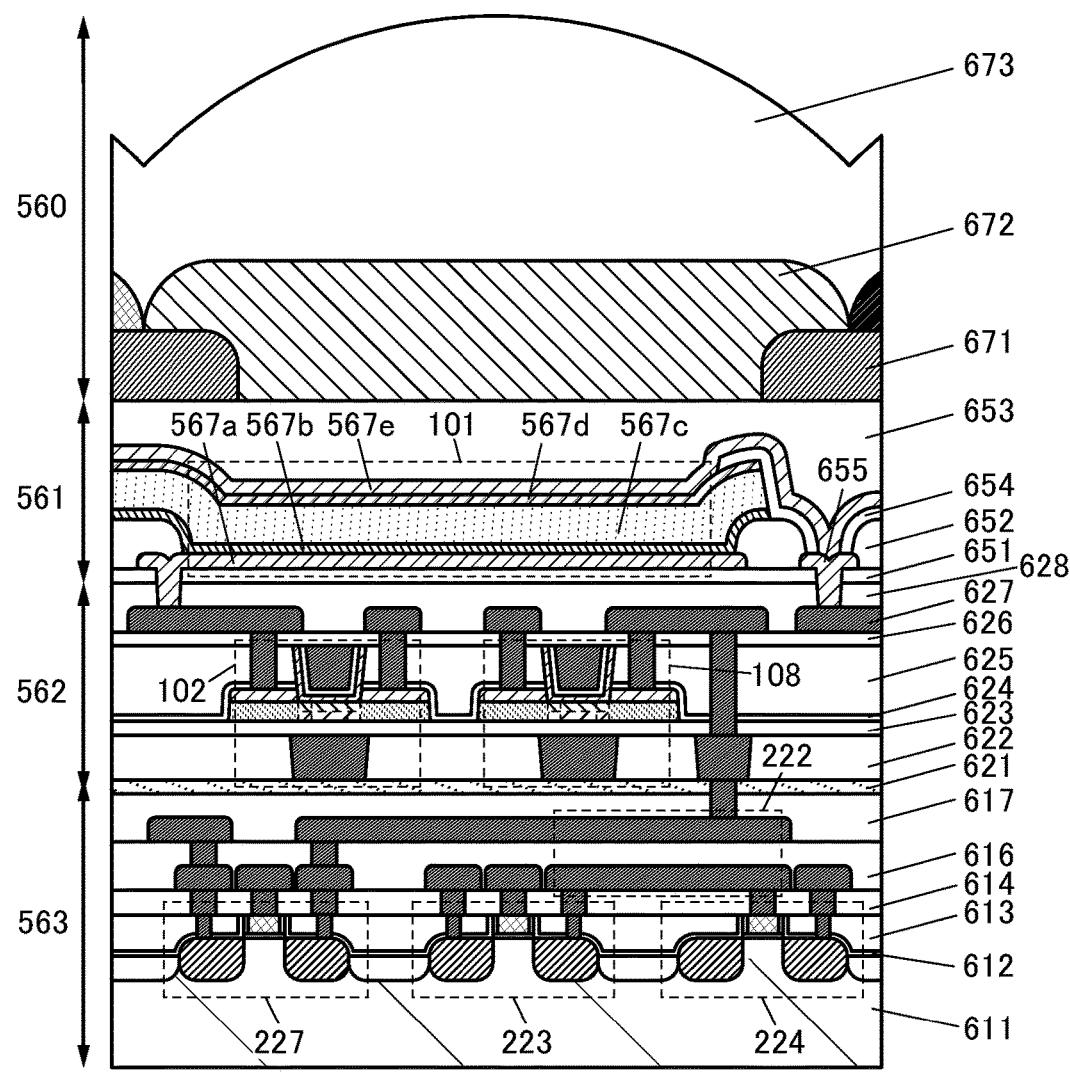
FIG. 24 is a cross-sectional view illustrating a pixel.

FIG. 24 is an example of a cross-sectional view of a stack including the layers 560, 561, 562, and 563 and not including a bonding surface. Si transistors are provided in the layer 563. OS transistors are provided in the layer 562. Note that the structures of the layer 563, the layer 561, and the layer 560 are not described here because they are the same as the structures illustrated in FIG. 20.

<Layer 562>

The layer 562 is formed over the layer 563. The layer 562 includes OS transistors. Here, the transistor 102 and the transistor 108 are illustrated. In the cross-sectional view illustrated in FIG. 24, electrical connection between the transistors is not illustrated.

Insulating layers 621, 622, 623, 624, 625, 626, and 628 are provided in the layer 562. Moreover, a conductive layer 627 is provided. The conductive layer 627 can be electrically connected to the wiring 114 (see FIG. 6).

The insulating layer 621 functions as a blocking layer. The insulating layers 622, 623, 625, 626, and 628 function as interlayer insulating films and planarization films. The insulating layer 624 has a function of a protective film.

As the blocking layer, a film that has a function of preventing hydrogen diffusion is preferably used. In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

The other of the source and the drain of the transistor 108 is electrically connected to the gate of the transistor 105 through a plug. Furthermore, the conductive layer 627 is electrically connected to the wiring 114 (see FIG. 3A).

The one of the source and the drain of the transistor 102 is electrically connected to the cathode of the photoelectric conversion device 101 included in the layer 561. The conductive layer 627 is electrically connected to the anode of the photoelectric conversion device 101 included in the layer 561.

Figure 25A:
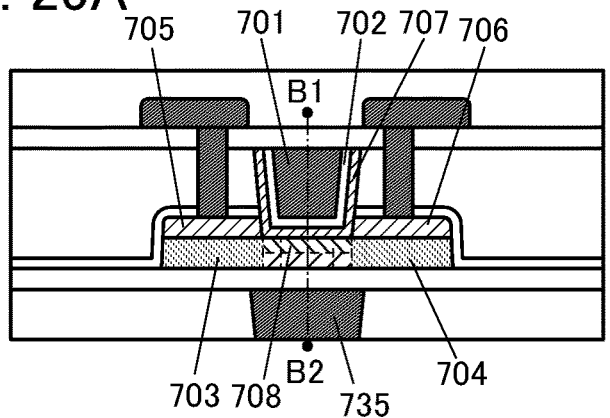
FIG. 25A to FIG. 25D are diagrams each illustrating an OS transistor.

The details of an OS transistor are illustrated in FIG. 25A. The OS transistor illustrated in FIG. 25A has a self-aligned structure in which a source electrode 705 and a drain electrode 706 are formed through provision of an insulating layer over stacked layers of an oxide semiconductor layer and a conductive layer and provision of opening portions reaching the oxide semiconductor layer.

The OS transistor can include a gate electrode 701 and a gate insulating film 702 in addition to a channel formation region 708, a source region 703, and a drain region 704, which are formed in the oxide semiconductor layer. At least the gate insulating film 702 and the gate electrode 701 are provided in the opening portion. The opening portion may further be provided with an oxide semiconductor layer 707.

Figure 25B:
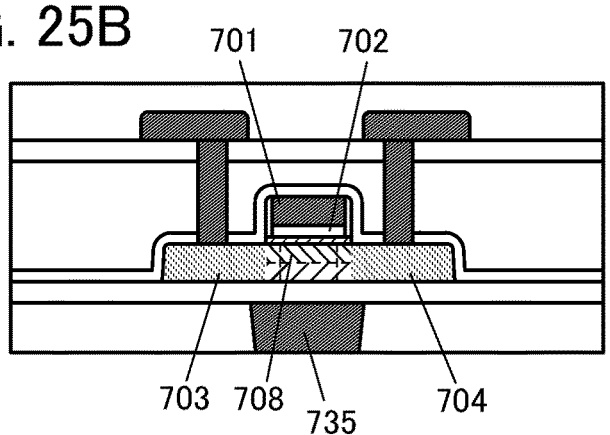

As illustrated in FIG. 25B, the OS transistor may have a self-aligned structure in which the source region 703 and the drain region 704 are formed in the semiconductor layer with the gate electrode 701 as a mask.

Figure 25C:
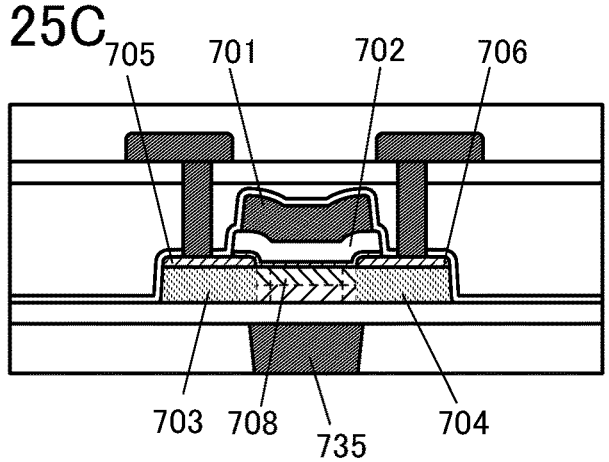

As illustrated in FIG. 25C, the OS transistor may be a non-self-aligned top-gate transistor including a region where the source electrode 705 or the drain electrode 706 overlaps with the gate electrode 701.

Figure 25D:
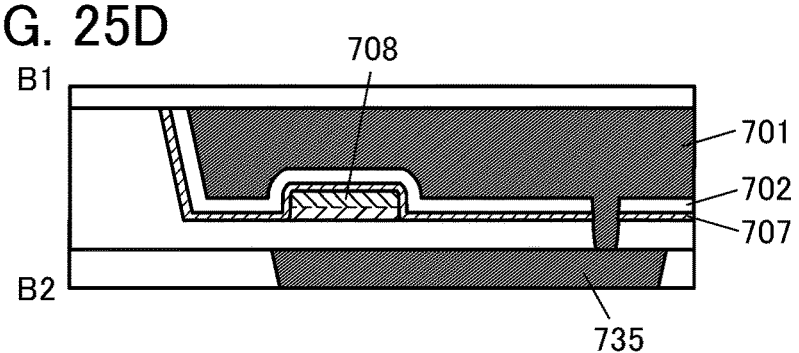

Although the OS transistor has a structure with a back gate 735, it may have a structure without a back gate. As illustrated in a cross-sectional view of the transistor in the channel width direction in FIG. 25D, the back gate 735 may be electrically connected to a front gate of the transistor, which is provided to face the back gate. Note that FIG. 25D illustrates an example of a B1-B2 cross section of the transistor in FIG. 25A, and the same applies to a transistor having any of the other structures. A structure where a fixed potential different from the potential supplied to the front gate is supplied to the back gate 735 may be employed.

Modification Example of Stacked-Layer Structure 2

Figure 26:
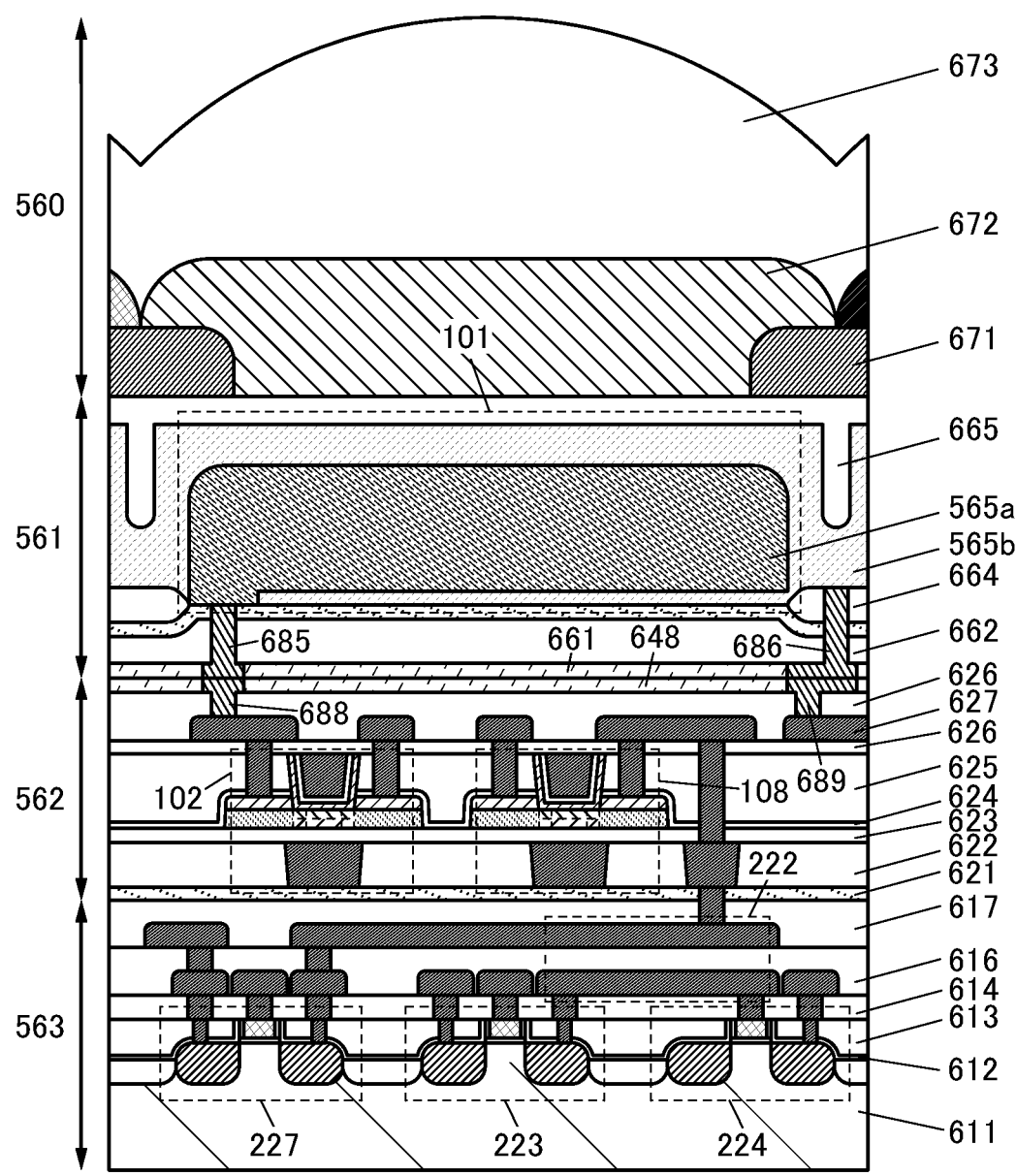
FIG. 26 is a cross-sectional view illustrating a pixel.

FIG. 26 is a modification example of the stacked-layer structure illustrated in FIG. 25 and differs from FIG. 25 in the structure of the photoelectric conversion device 101 included in the layer 561 and part of the structure of the layer 562; a bonding surface is included between the layer 561 and the layer 562.

The photoelectric conversion device 101 included in the layer 561 is a pn junction photodiode and has a structure similar to that illustrated in FIG. 22.

In the layer 562, an insulating layer 648 is formed over the insulating layer 628. In addition, a conductive layer 688 electrically connected to the one of the source and the drain of the transistor 102 and a conductive layer 689 electrically connected to the conductive layer 627 are formed.

The insulating layer 648 and the conductive layers 688 and 689 function as bonding layers. The conductive layers 688 and 689 each include a region embedded in the insulating layer 648. Furthermore, the surfaces of the insulating layer 648 and the conductive layers 683 and 684 are planarized to be level with each other.

Here, the conductive layers 688 and 689 are the same bonding layers as the above-described conductive layers 619 and 639. The insulating layer 648 is the same bonding layer as the above-described insulating layers 618 and 631.

Thus, when the conductive layer 688 and the conductive layer 685 are bonded to each other, the layer 565a (corresponding to the n-type region and the cathode) of the photoelectric conversion device can be electrically connected to the one of the source and the drain of the transistor 102. In addition, when the conductive layer 689 and the conductive layer 686 are bonded to each other, the layer 565b (corresponding to the p-type region and the anode) of the photoelectric conversion device can be electrically connected to the wiring 114 (see FIG. 6). When the insulating layer 648 and the insulating layer 661 are bonded to each other, electrical bonding and mechanical bonding of the layer 561 and the layer 562 can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. An OS transistor can be formed to be stacked over a semiconductor substrate on which a device is formed, and thus a bonding step can be skipped.

Note that the structure illustrated in FIG. 23 in which the transistor 102 is provided in the layer 561 may be applied to this structure.

Figure 27:
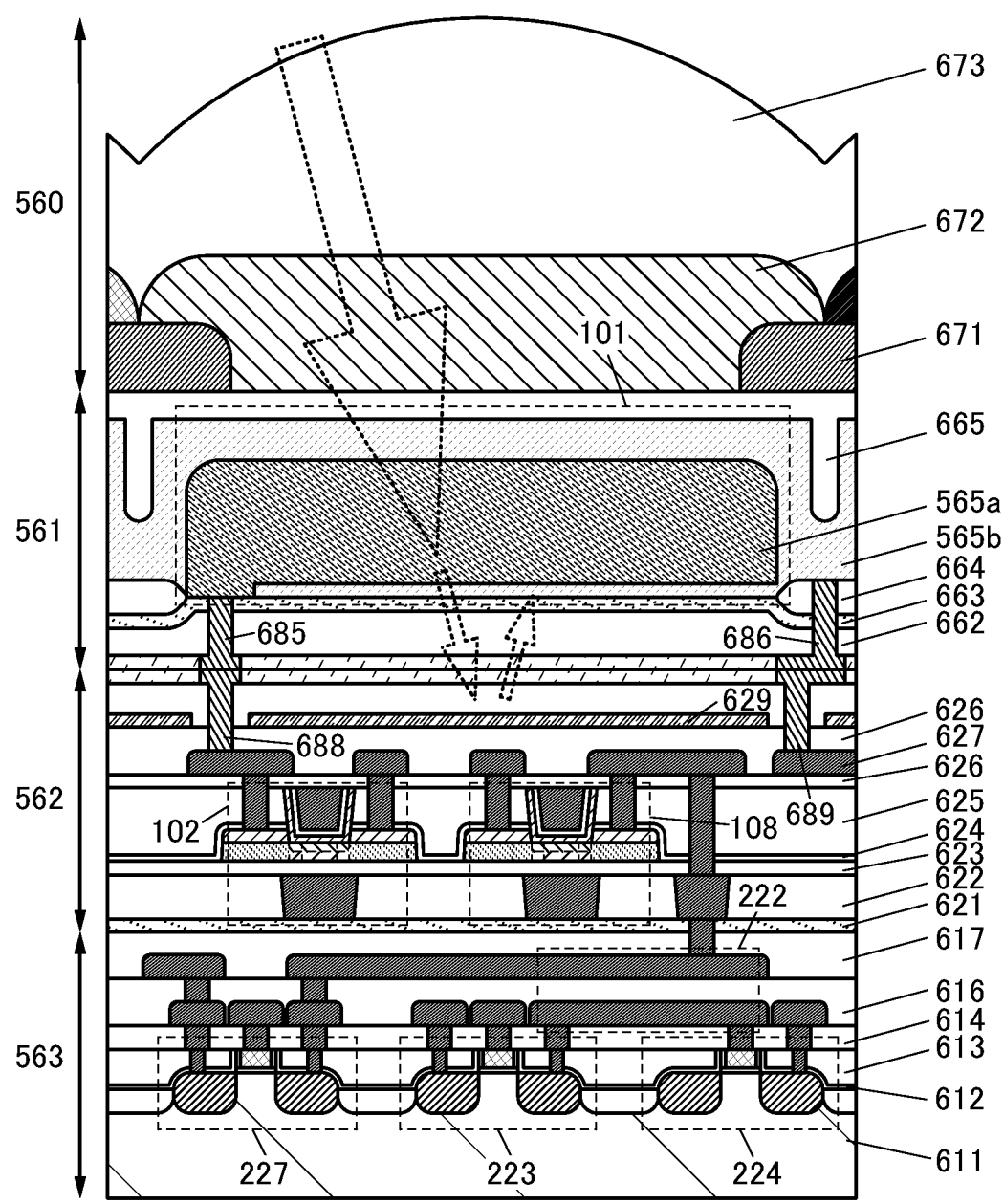
FIG. 27 is a cross-sectional view illustrating a pixel.

As illustrated in FIG. 27, a reflective layer 629 may be provided between the photoelectric conversion device 101 and the OS transistor. Almost all of light (indicated by arrows) incident on the photoelectric conversion device 101 is absorbed by the semiconductor layer of the photoelectric conversion device. However, part of light with a long wavelength passes through the photoelectric conversion device 101 and reaches a device in a lower layer in some cases.

Light emission to the OS transistor is a factor of noise such as an increase in off-state current. The noise can be reduced by providing the reflective layer 629. The reflective layer 629 can function as an electromagnetic shield when having a potential fixed to a GND potential or the like, in which case the noise can be further reduced.

In addition, light reflected by the reflective layer 629 returns to the semiconductor layer of the photoelectric conversion device 101 and contributes to photoelectric conversion. This can increase the sensitivity of the photoelectric conversion device 101. The reflective layer 629 can be formed using a metal material or the like similar to any of the aforementioned conductors that can be used as a wiring, an electrode, and a plug.

Note that the surface of the reflective layer 629 preferably has a structure that allows light incident on the photoelectric conversion device 101 to be efficiently reflected. As such a structure, an optimal structure can be selected by a practitioner as appropriate; for example, the surface of the reflective layer 629 is made uneven or polished into a mirror surface.

The memory cell 150 can be provided in, for example, the layer 562. The circuit 203 having a pooling function can be provided in, for example, the layer 563.

Figure 28:
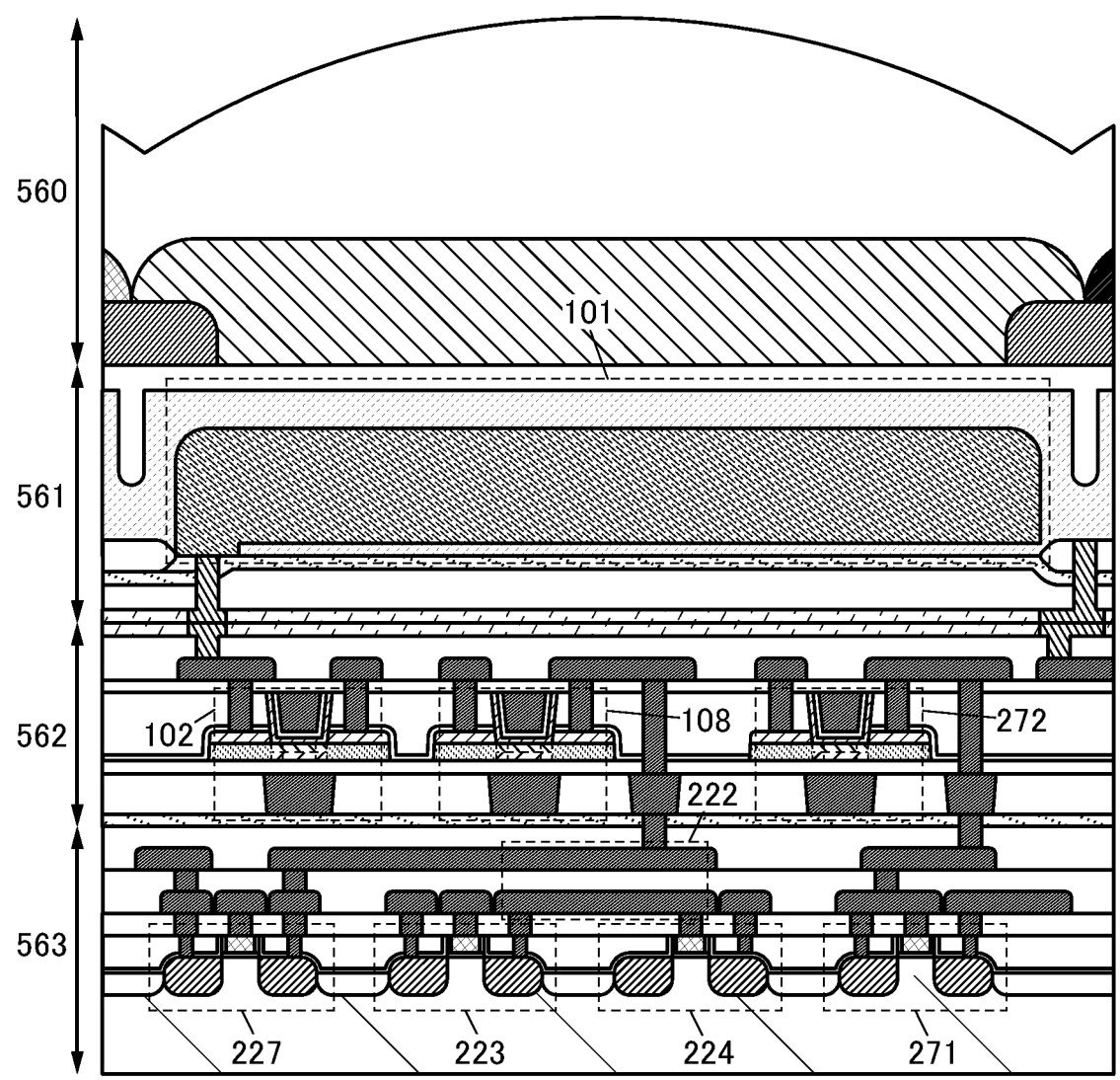
FIG. 28 is a cross-sectional view illustrating a pixel.

FIG. 28 illustrates the structure in which the transistors 102, 108, and the like, which are components of the pixel circuit, and the transistor 272 and the like, which are components of the memory cell 150, are provided over the same surface in the layer 562. The layer 563 includes a transistor 271, which is a component of the circuit 203 (corresponds to the input transistor of the current mirror circuit CM). The transistor 272 is electrically connected to the transistor 271 through a plug or the like.

Figure 29:
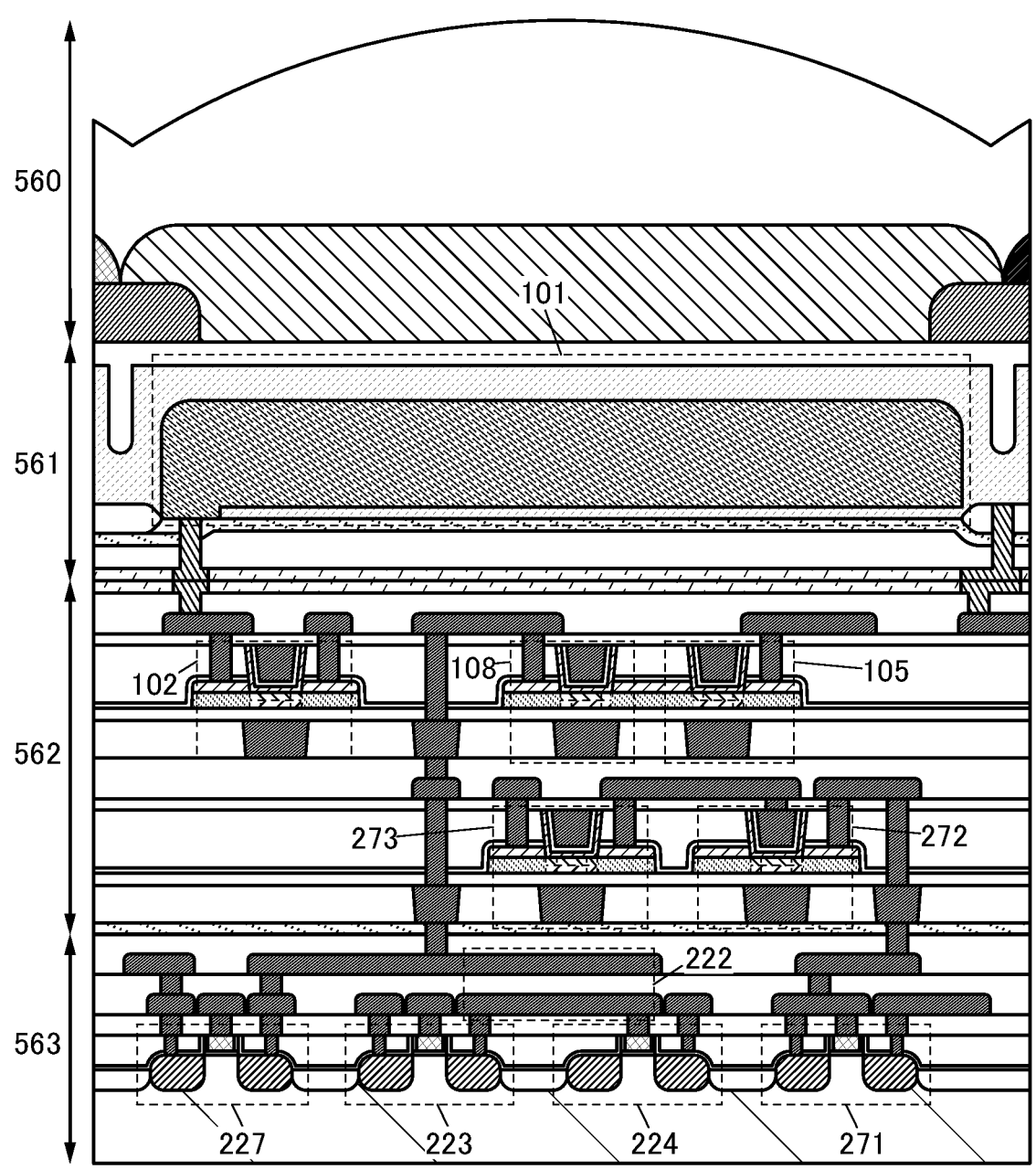
FIG. 29 is a cross-sectional view illustrating a pixel.

FIG. 29 illustrates the structure in which the transistors 102, 105, 108, and the like, which are components of the pixel circuit, and the transistors 272, 273, and the like, which are components of the memory cell 150, are stacked so as to have an overlapping region in the layer 562. This structure can reduce the circuit area, achieving a small imaging device with a high function. Furthermore, the structure can shorten the length of wirings electrically connecting the stacked components, enabling a high-speed operation with low power consumption.

Note that FIG. 28 and FIG. 29 each illustrate an example where the memory cell 150 is formed using an OS transistor. In the case where the memory cell 150 is formed using a Si transistor, the transistors included in the memory cell 150 can be provided in the layer 563a illustrated in FIG. 20, FIG. 22, and FIG. 23.

Note that the structure illustrated in FIG. 23 in which the transistor 102 is provided in the layer 561 may be applied to the structures illustrated in FIG. 28 and FIG. 29. The structure of the photoelectric conversion device 101 illustrated in FIG. 24 may also be applied.

<Package, Module>

FIG. 31A1 is an external perspective view of the top surface side of a package in which an image sensor chip is placed. The package includes a package substrate 410 to which an image sensor chip 450 (see FIG. 31A3) is fixed, a cover glass 420, an adhesive 430 for bonding them, and the like.

FIG. 31A2 is an external perspective view of the bottom surface side of the package. A BGA (Ball grid array) in which solder balls are used as bumps 440 on the bottom surface of the package is employed. Note that, other than the BGA, an LGA (Land grid array), a PGA (Pin grid array), or the like may be employed.

FIG. 31A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 31B1 is an external perspective view of the top surface side of a camera module in which an image sensor chip is placed in a package with a built-in lens. The camera module includes a package substrate 411 to which an image sensor chip 451 (see FIG. 31B3) is fixed, a lens cover 421, a lens 435, and the like. Furthermore, an IC chip 490 (see FIG. 31B3) having functions of a driver circuit, a signal conversion circuit, and the like of an imaging device is provided between the package substrate 411 and the image sensor chip 451; thus, the structure as an SiP (System in package) is included.

FIG. 31B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 31B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above-described form can be easily mounted on a printed substrate or the like, and the image sensor chip can be incorporated in a variety of semiconductor devices and electronic devices.

This embodiment can be combined with the other embodiments as appropriate.

Embodiment 3

As electronic devices that can use the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 32A to FIG. 32F illustrate specific examples of these electronic devices.

Figure 32A:
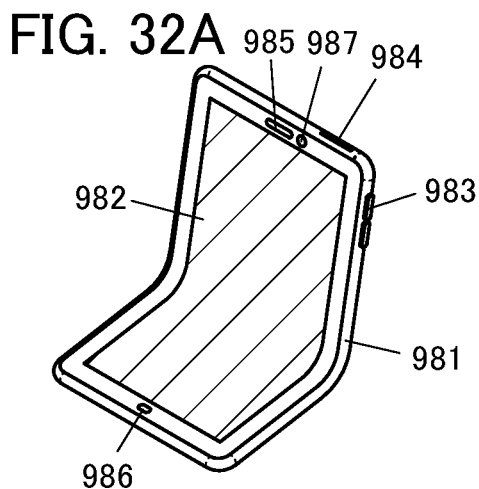
FIG. 32A to FIG. 32F are diagrams each illustrating an electronic device.

FIG. 32A is an example of a mobile phone, which includes a housing 981, a display portion 982, an operation button 983, an external connection port 984, a speaker 985, a microphone 986, a camera 987, and the like. The display portion 982 of the mobile phone is provided with a touch sensor. A variety of operations such as making a call and inputting a character can be performed by touch on the display portion 982 with a finger, a stylus, or the like. The imaging device of one embodiment of the present invention and the operation method thereof can be used in the mobile phone.

Figure 32B:
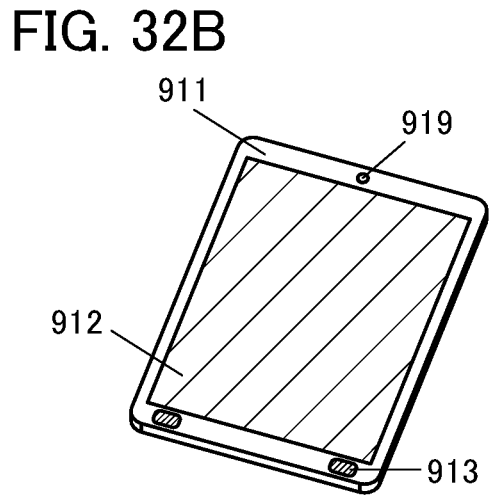

FIG. 32B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used in the portable data terminal.

Figure 32C:
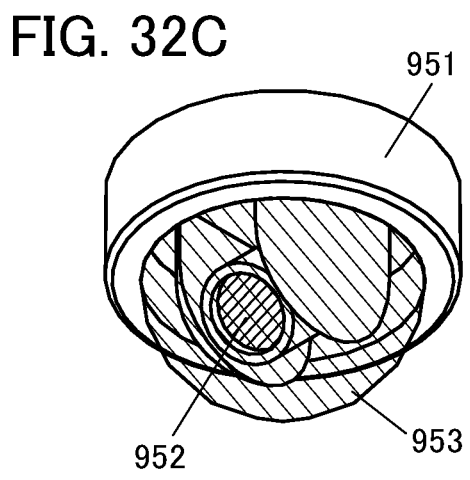

FIG. 32C is a surveillance camera, which includes a support base 951, a camera unit 952, a protection cover 953, and the like. By setting the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 32D:
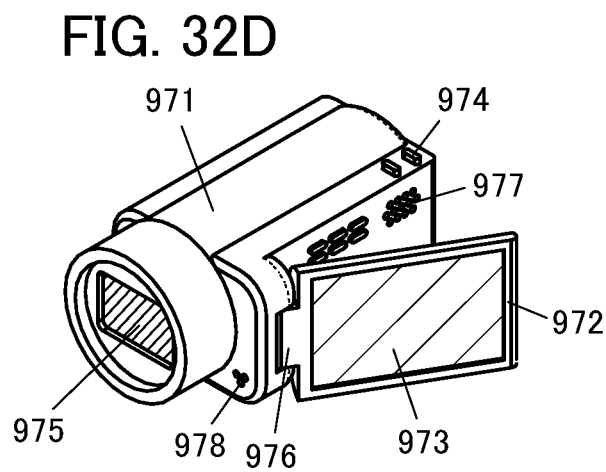

FIG. 32D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera.

Figure 32E:
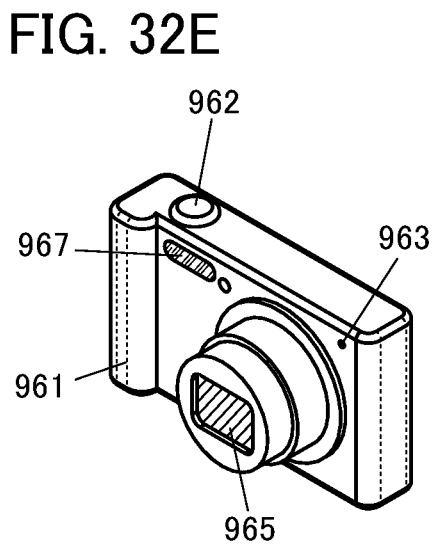

FIG. 32E is a digital camera, which includes a housing 961, a shutter button 962, a microphone 963, a light-emitting portion 967, a lens 965, and the like. The imaging device of one embodiment of the present invention and the operation method thereof can be used in the digital camera.

Figure 32F:
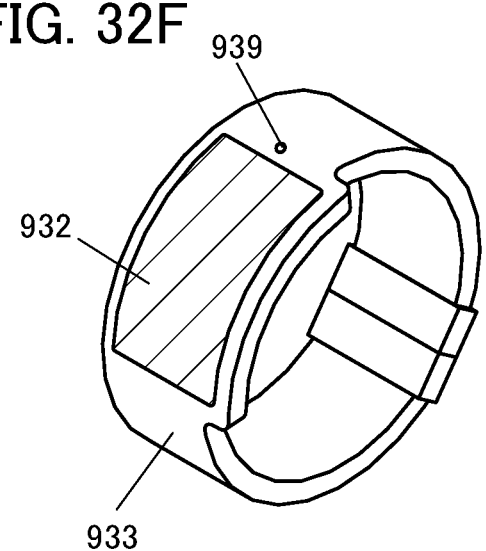

FIG. 32F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used in the information terminal.

Figure 33:
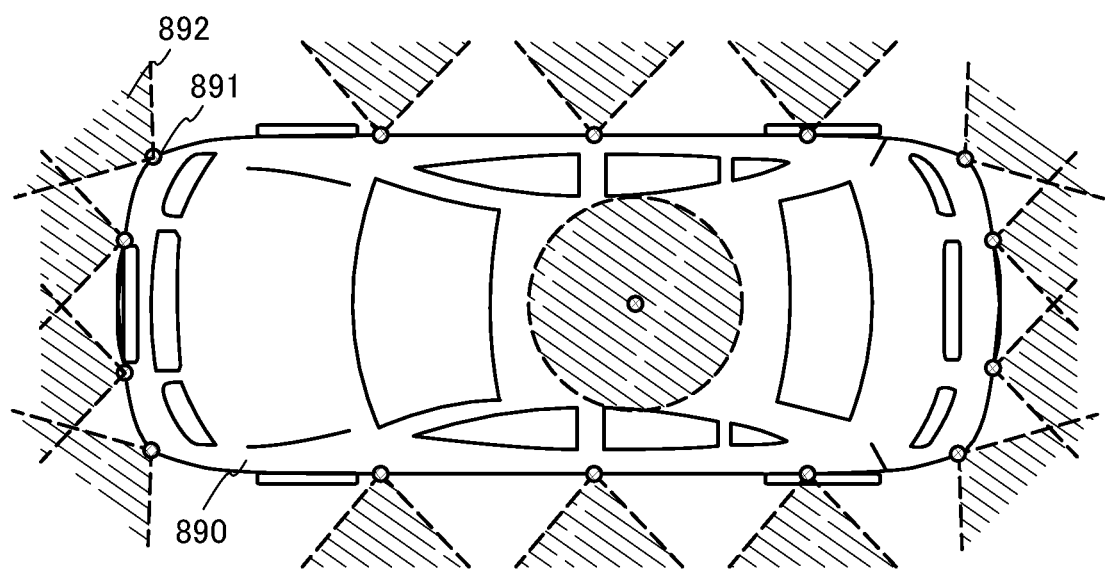
FIG. 33 is a diagram illustrating an automobile.

FIG. 33 illustrates an external view of an automobile as an example of a moving object. An automobile 890 includes a plurality of cameras 891 and the like, and can obtain information on the front, rear, left, and right sides and the upper side of the automobile 890. The imaging device of one embodiment of the present invention and the operation method thereof can be used in the cameras 891. The automobile 890 is also provided with various sensors such as an infrared radar, a millimeter wave radar, and a laser radar (not illustrated) and the like. The automobile 890 judges traffic conditions therearound such as the presence of a guardrail or a pedestrian by analyzing images in a plurality of image capturing directions 892 taken by the cameras 891, and thus can perform autonomous driving. The cameras 891 can be used in a system for navigation, risk prediction, or the like.

When arithmetic processing with a neural network or the like is performed on the obtained image data in the imaging device of one embodiment of the present invention, for example, processing such as an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and reduction of glare and reflection can be performed.

Note that an automobile is described above as an example of a moving object and may be any of an automobile having an internal-combustion engine, an electric vehicle, a hydrogen vehicle, and the like. Furthermore, the moving object is not limited to an automobile. Examples of moving objects include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

REFERENCE NUMERALS a1: terminal, a2: terminal, a3: terminal, b1: terminal, b2: terminal, b3: terminal, c1: terminal, c2: terminal, c3: terminal, CM: current mirror circuit, CMa: current mirror circuit, CMb: current mirror circuit, CM1: current mirror circuit, CM2: current mirror circuit, CM3: current mirror circuit, CM4: current mirror circuit, G1: signal line, G2: signal line, Tr1: transistor, Tr2: transistor, 100: pixel, 101: photoelectric conversion device, 102: transistor, 103: transistor, 104: capacitor, 105: transistor, 106: transistor, 108: transistor, 109: capacitor, 111: wiring, 112: wiring, 112_1: wiring, 112_2: wiring, 112_3: wiring, 113: wiring, 114: wiring, 115: wiring, 116: wiring, 117: wiring, 122: wiring, 122_1: wiring, 122_2: wiring, 122_3: wiring, 140: wiring, 141: wiring, 142: wiring, 150: memory cell, 150a: memory cell, 150b: memory cell, 151: memory circuit, 155: selection circuit, 161: transistor, 162: transistor, 163: capacitor, 200: pixel block, 201: circuit, 202: circuit, 203: circuit, 204: circuit, 212: wiring, 213: wiring, 215: wiring, 216: wiring, 217: wiring, 218: wiring, 219: wiring, 222: capacitor, 223: transistor, 224: transistor, 225: transistor, 226: transistor, 227: transistor, 230: circuit, 230a: circuit, 230b: circuit, 240: circuit, 250: circuit, 271: transistor, 272: transistor, 273: transistor, 274: capacitor, 300: pixel array, 301: circuit, 302: circuit, 303: circuit, 304: circuit, 305: circuit, 311: wiring, 320: memory cell, 325: reference memory cell, 330: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 545: semiconductor layer, 546: insulating layer, 560: layer, 561: layer, 562: layer, 562a: layer, 563: layer, 563a: layer, 563b: layer, 563c: layer, 565a: layer, 565b: layer, 566a: layer, 566b: layer, 566c: layer, 566d: layer, 567a: layer, 567b: layer, 567c: layer, 567d: layer, 567e: layer, 611: silicon substrate, 612: insulating layer, 613: insulating layer, 614: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 629: reflective layer, 631: insulating layer, 632: silicon substrate, 633: insulating layer, 634: insulating layer, 635: insulating layer, 636: conductive layer, 637: insulating layer, 638: insulating layer, 639: conductive layer, 648: insulating layer, 651: insulating layer, 652: insulating layer, 653: insulating layer, 654: insulating layer, 655: conductive layer, 661: insulating layer, 662: insulating layer, 664: insulating layer, 665: insulating layer, 671: light-blocking layer, 672: optical conversion layer, 672B: color filter, 672G: color filter, 6721R: infrared filter, 672R: color filter, 672UV: ultraviolet filter, 673: microlens array, 683: conductive layer, 684: conductive layer, 685: conductive layer, 686: conductive layer, 688: conductive layer, 689: conductive layer, 691: conductive layer, 692: conductive layer, 701: gate electrode, 702: gate insulating film, 703: source region, 704: drain region, 705: source electrode, 706: drain electrode, 707: oxide semiconductor layer, 708: channel formation region, 735: back gate, 890: automobile, 891: camera, 892: image capturing direction, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising:
a plurality of pixel blocks each comprising a plurality of pixels and a memory cell; and
a first circuit configured to read out a maximum value of the analog data stored in the memory cell included in each of the plurality of pixel blocks,
wherein analog data calculated from data generated by the plurality of pixels is configured to be stored in the memory cell,
wherein the memory cell comprises a sixth transistor, a seventh transistor and a second capacitor, and
wherein one of a source and a drain of the sixth transistor, one electrode of the second capacitor, and a gate of the seventh transistor are electrically connected to each other.

2. The imaging device according to claim 1, wherein the memory cell includes a region overlapping with at least one of the plurality of pixels and the first circuit.

3. The imaging device according to claim 1,
wherein each of the plurality of pixels comprises a photoelectric conversion device, a first transistor, a second transistor, a third transistor, a fourth transistor, a fifth transistor and a first capacitor,
wherein one electrode of the photoelectric conversion device is electrically connected to one of a source and a drain of the first transistor,
wherein the other of the source and the drain of the first transistor is electrically connected to one of a source and a drain of the second transistor, one electrode of the first capacitor, and a gate of the third transistor,
wherein one of a source and a drain of the third transistor is electrically connected to one of a source and a drain of the fourth transistor, and
wherein the other electrode of the first capacitor is electrically connected to one of a source and a drain of the fifth transistor.

4. The imaging device according to claim 1,
wherein each of the sixth transistor and the seventh transistor comprises a metal oxide in a channel formation region, and
wherein the metal oxide includes In, Zn, and one or more of Al, Ti, Ga, Ge, Sn, Y, Zr, La, Ce, Nd and Hf.

5. An electronic device comprising:
the imaging device according to claim 1; and
a display device.

6. An imaging device comprising:
a plurality of pixel blocks each comprising a plurality of pixels and a memory cell;
a first circuit;
a second circuit; and
a third circuit,
wherein each of the plurality of pixels is configured to:
retain first data corresponding to a reset operation;
retain second data corresponding to a photoelectric conversion operation;
generate third data by adding a weight coefficient and the first data; and
generate fourth data by adding the weight coefficient and the second data,
wherein the first circuit is configured to:
generate fifth data corresponding a difference between a sum of the first data retained in the plurality of pixels and a sum of the third data generated in the plurality of pixels; and
generate sixth data corresponding a difference between a sum of the second data retained in the plurality of pixels and a sum of the fourth data generated in the plurality of pixels,
wherein the second circuit is configured to generate seventh data corresponding a difference between the fifth data and the sixth data,
wherein the memory cell is configured to store the seventh data, and
wherein the third circuit is configured to read out a maximum value of the seventh data stored in the memory cell included in each of the plurality of pixel blocks.

7. The imaging device according to claim 6,
wherein each of the plurality of pixels comprises a photoelectric conversion device, a first transistor, a second transistor, a third transistor, a fourth transistor, a fifth transistor and a first capacitor,
wherein one electrode of the photoelectric conversion device is electrically connected to one of a source and a drain of the first transistor,
wherein the other of the source and the drain of the first transistor is electrically connected to one of a source and a drain of the second transistor, one electrode of the first capacitor, and a gate of the third transistor,
wherein one of a source and a drain of the third transistor is electrically connected to one of a source and a drain of the fourth transistor, and
wherein the other electrode of the first capacitor is electrically connected to one of a source and a drain of the fifth transistor.

8. The imaging device according to claim 6,
wherein the memory cell comprises a sixth transistor, a seventh transistor and a second capacitor, and wherein one of a source and a drain of the sixth transistor, one electrode of the second capacitor, and a gate of the seventh transistor are electrically connected to each other.

9. The imaging device according to claim 8,
wherein each of the sixth transistor and the seventh transistor comprises a metal oxide in a channel formation region, and
wherein the metal oxide includes In, Zn, and one or more of Al, Ti, Ga, Ge, Sn, Y, Zr, La, Ce, Nd and Hf.

10. The imaging device according to claim 6, wherein each of the first circuit and the second circuit is a correlated double sampling circuit.

11. The imaging device according to claim 6, wherein the third circuit comprises a plurality of current mirror circuits.

12. The imaging device according to claim 6, wherein each of the first circuit, the second circuit and the third circuit comprises a transistor including silicon in a channel formation region.

13. The imaging device according to claim 6, wherein the plurality of pixels include a region overlapping with at least one of the first circuit, the second circuit and the third circuit.

14. The imaging device according to claim 6, wherein the memory cell includes a region overlapping with at least one of the first circuit, the second circuit, the third circuit and the plurality of pixels.

15. An electronic device comprising:
the imaging device according to claim 6; and
a display device.

* * * * *